US011335806B2

(12) United States Patent
Yeong et al.

(10) Patent No.: US 11,335,806 B2
(45) Date of Patent: May 17, 2022

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Sai-Hooi Yeong, Zhubei (TW); Chi-On Chui, Hsinchu (TW); Chien-Ning Yao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 3 days.

(21) Appl. No.: 16/990,295

(22) Filed: Aug. 11, 2020

(65) Prior Publication Data

US 2022/0052201 A1    Feb. 17, 2022

(51) Int. Cl.
*H01L 29/78*    (2006.01)
*H01L 21/28*    (2006.01)
*H01L 29/66*    (2006.01)
*H01L 21/8234*    (2006.01)
*H01L 29/06*    (2006.01)
*H01L 29/417*    (2006.01)

(52) U.S. Cl.
CPC ............ *H01L 29/78391* (2014.09); *H01L 21/823431* (2013.01); *H01L 29/0665* (2013.01); *H01L 29/40111* (2019.08); *H01L 29/41791* (2013.01); *H01L 29/6684* (2013.01); *H01L 29/66795* (2013.01); *H01L 29/7851* (2013.01)

(58) Field of Classification Search
CPC ....... H01L 29/78391; H01L 21/823431; H01L 29/0665; H01L 29/40111; H01L 29/41791; H01L 29/66795; H01L 29/6684; H01L 29/7851
USPC .......................................... 257/288
See application file for complete search history.

(56) References Cited

U.S. PATENT DOCUMENTS

| | | | |
|---|---|---|---|
| 9,087,689 B1* | 7/2015 | Tran | H01L 27/1211 |
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,121,882 B1* | 11/2018 | Ho | H01L 29/165 |
| 2014/0106523 A1* | 4/2014 | Koldiaev | H01L 27/088 438/212 |

(Continued)

*Primary Examiner* — Sheikh Maruf
(74) *Attorney, Agent, or Firm* — Birch, Stewart, Kolasch & Birch, LLP

(57) ABSTRACT

A semiconductor device structure is provided. The semiconductor device structure includes a substrate, a first fin structure over the substrate, and a FeFET device over a first region of the substrate. The FeFET includes a first gate stack across the first fin structure. The semiconductor device structure also includes first gate spacer layers alongside the first gate stack, and a ferroelectric layer over the first gate stack. At least a portion of the ferroelectric layer is located between upper portions of the first gate spacer layers and is adjacent to the first gate stack.

20 Claims, 52 Drawing Sheets

(56) References Cited

U.S. PATENT DOCUMENTS

| | | |
|---|---|---|
| 2015/0115215 A1 | 4/2015 | Tsan et al. |
| 2016/0308021 A1 | 10/2016 | Lee |
| 2016/0336312 A1 | 11/2016 | Yan et al. |
| 2019/0164809 A1* | 5/2019 | Meyer ............... H01L 21/28568 |
| 2019/0164818 A1* | 5/2019 | Yeoh ............... H01L 21/823821 |
| 2019/0164841 A1* | 5/2019 | St. Amour ........ H01L 21/28568 |
| 2019/0164961 A1* | 5/2019 | Ho ...................... H01L 29/7846 |
| 2019/0165145 A1* | 5/2019 | Ghani ................. H01L 27/0886 |
| 2019/0311950 A1* | 10/2019 | Mehandru ......... H01L 21/76897 |
| 2020/0075770 A1* | 3/2020 | Kobrinsky ........ H01L 29/78651 |
| 2020/0091348 A1* | 3/2020 | Guha ............... H01L 29/66772 |
| 2020/0219997 A1* | 7/2020 | Mehandru ............. H01L 29/775 |
| 2020/0321446 A1* | 10/2020 | Kim ..................... H01L 29/516 |

* cited by examiner

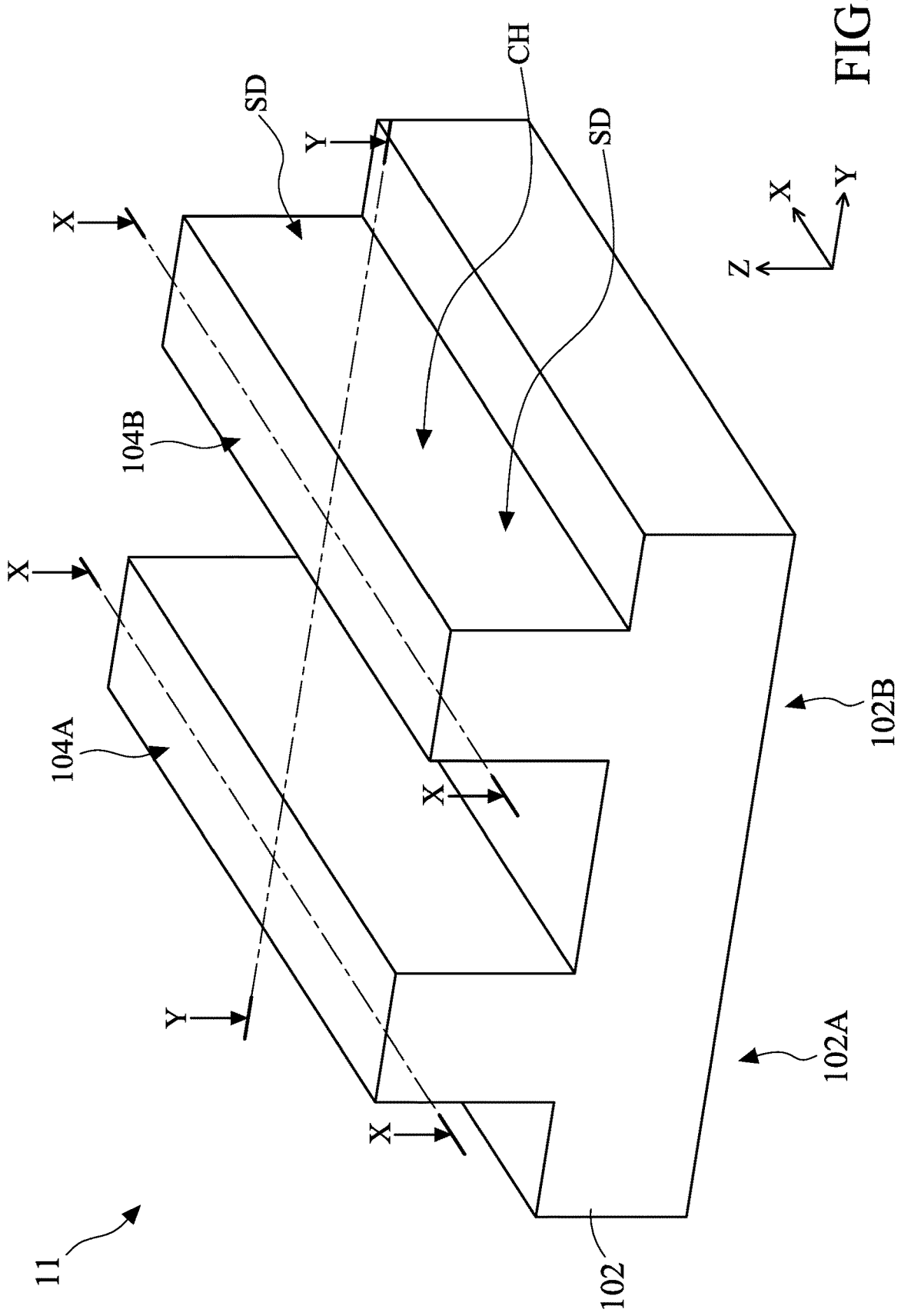

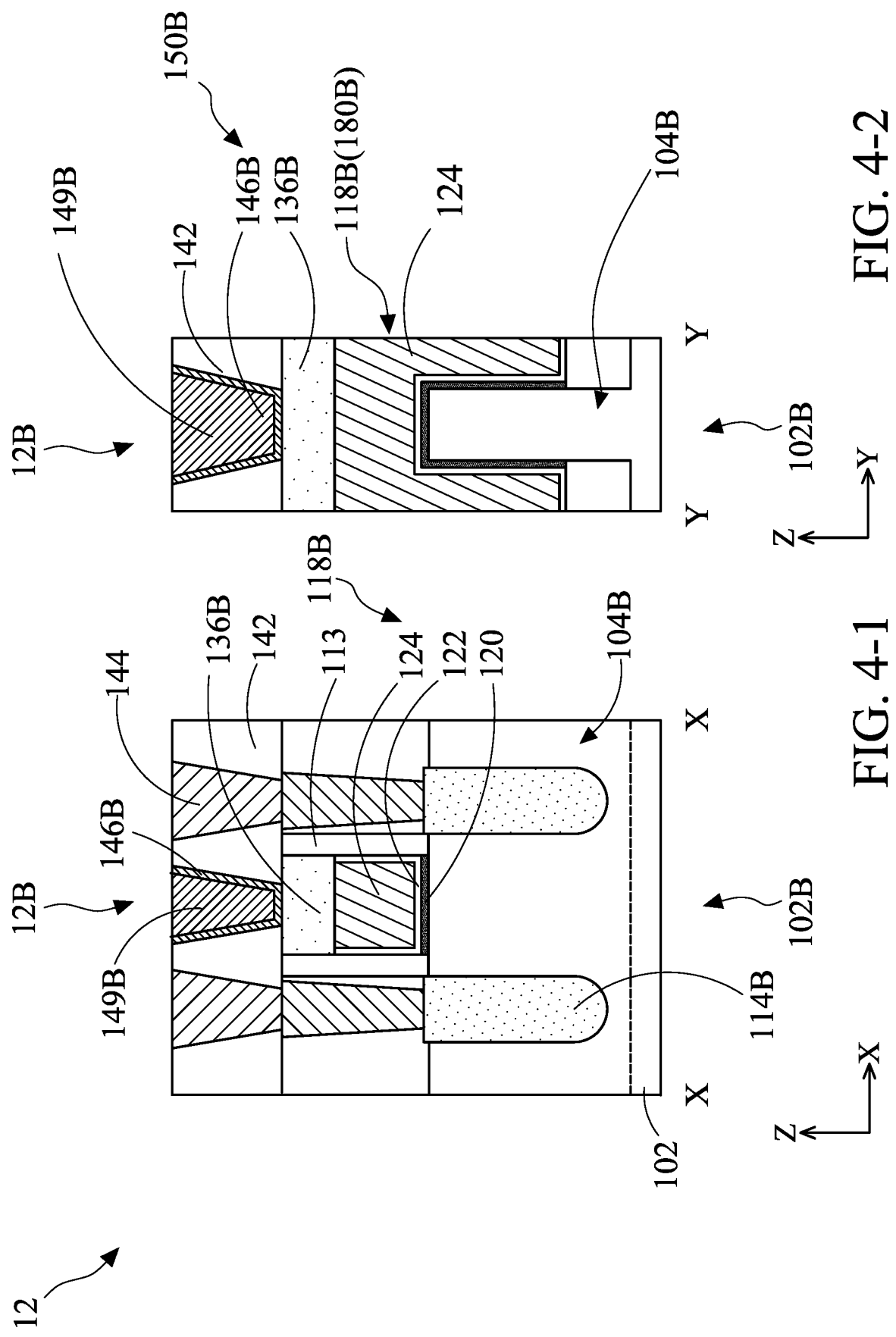

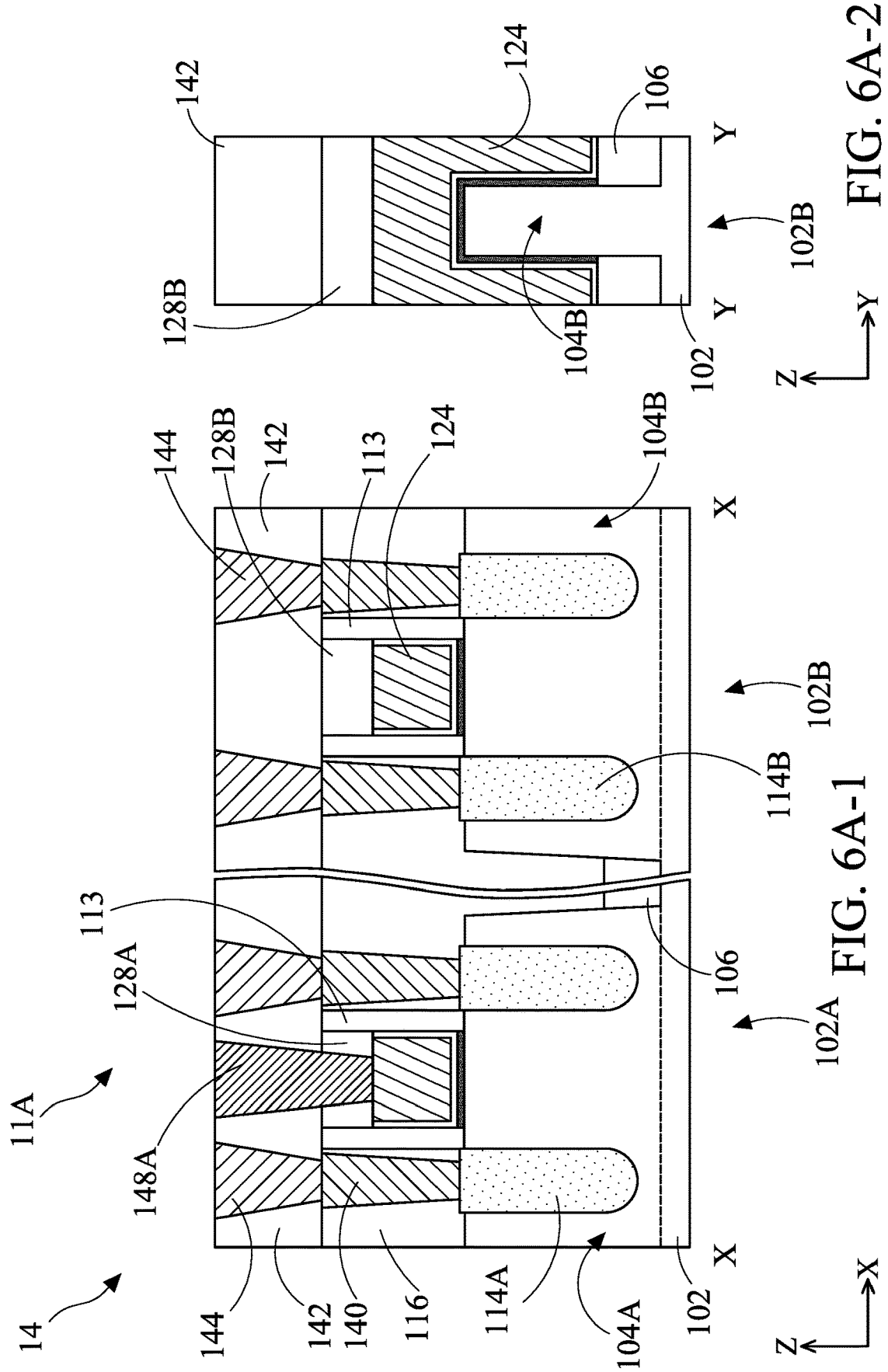

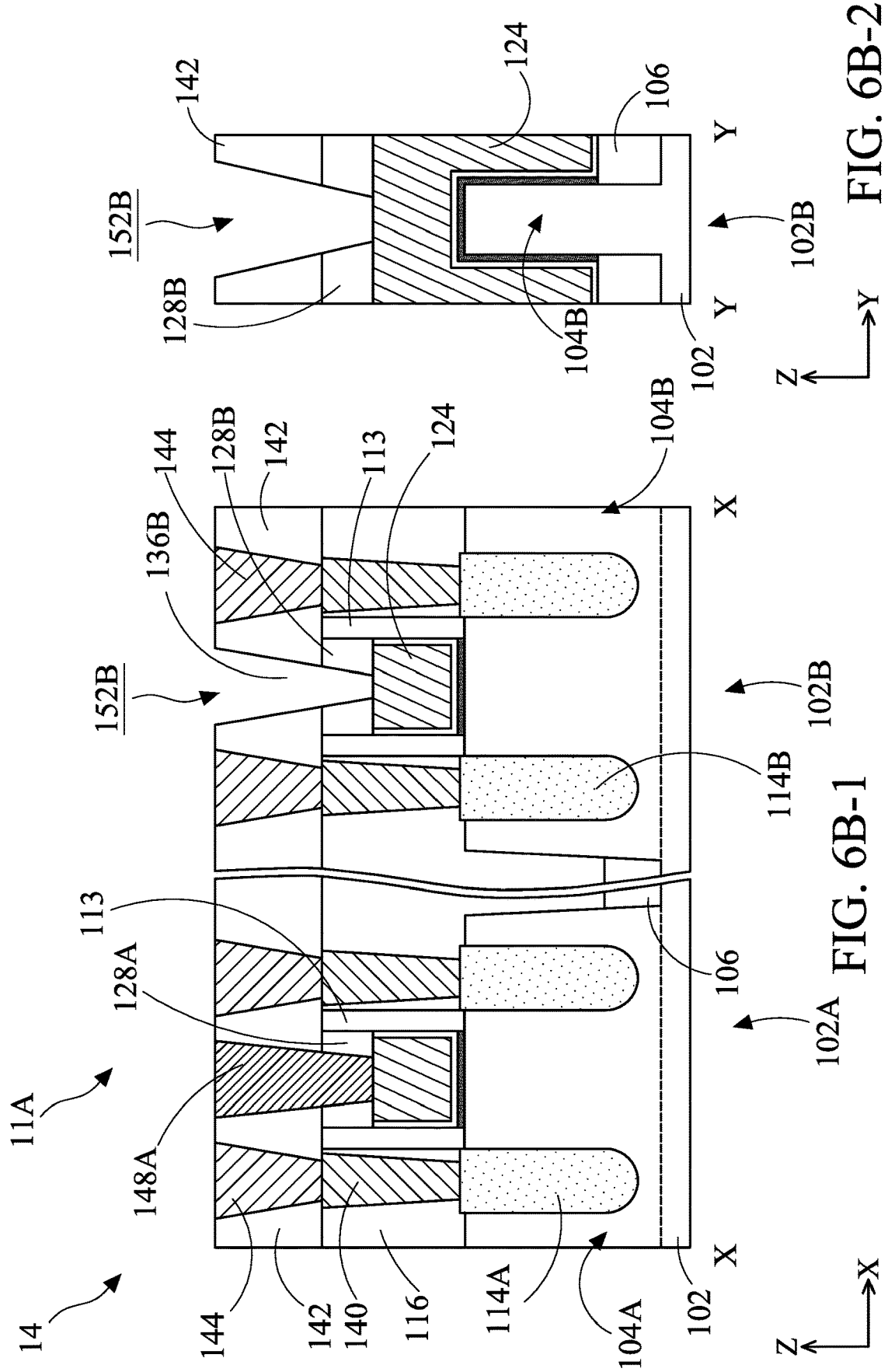

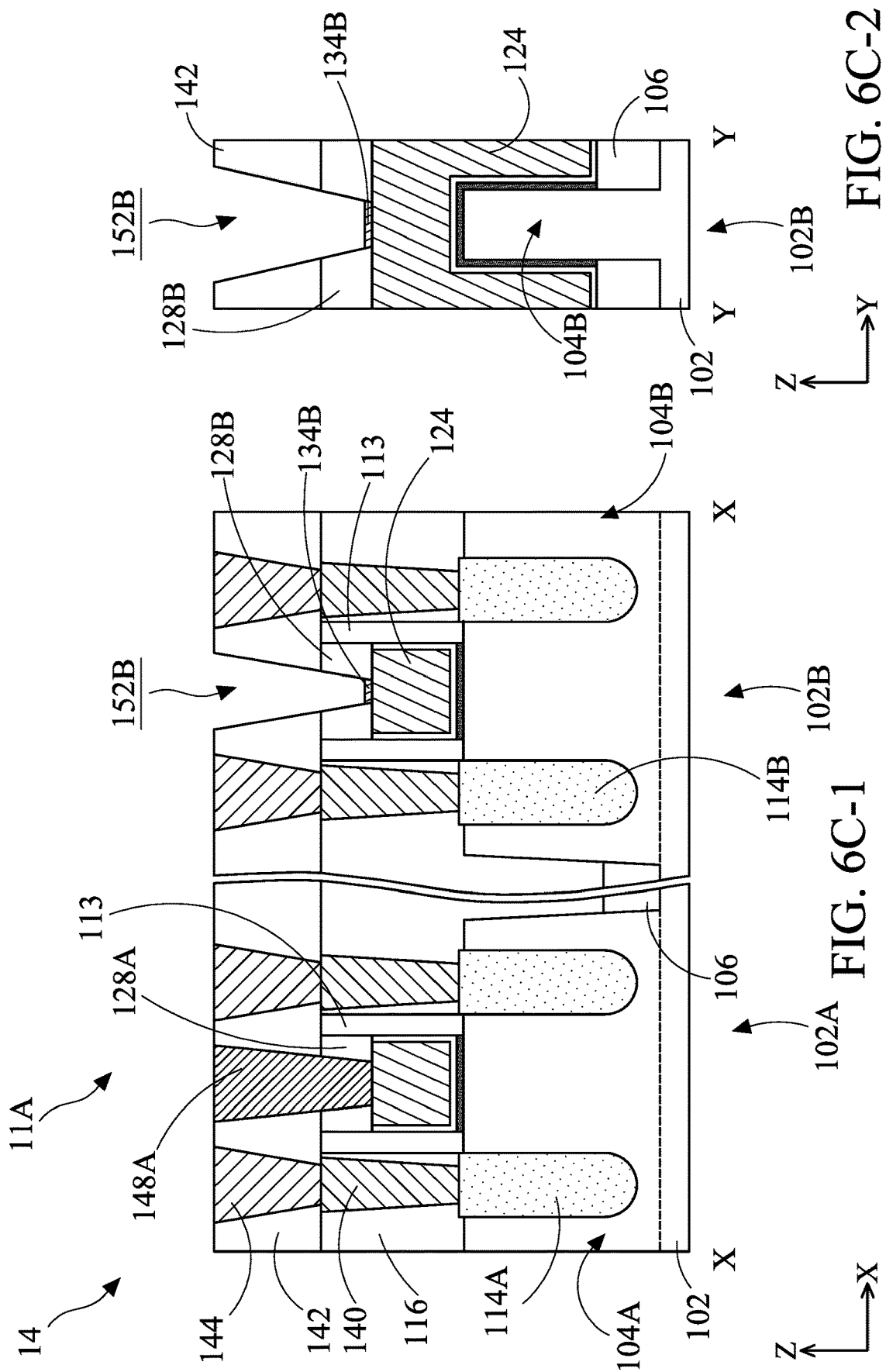

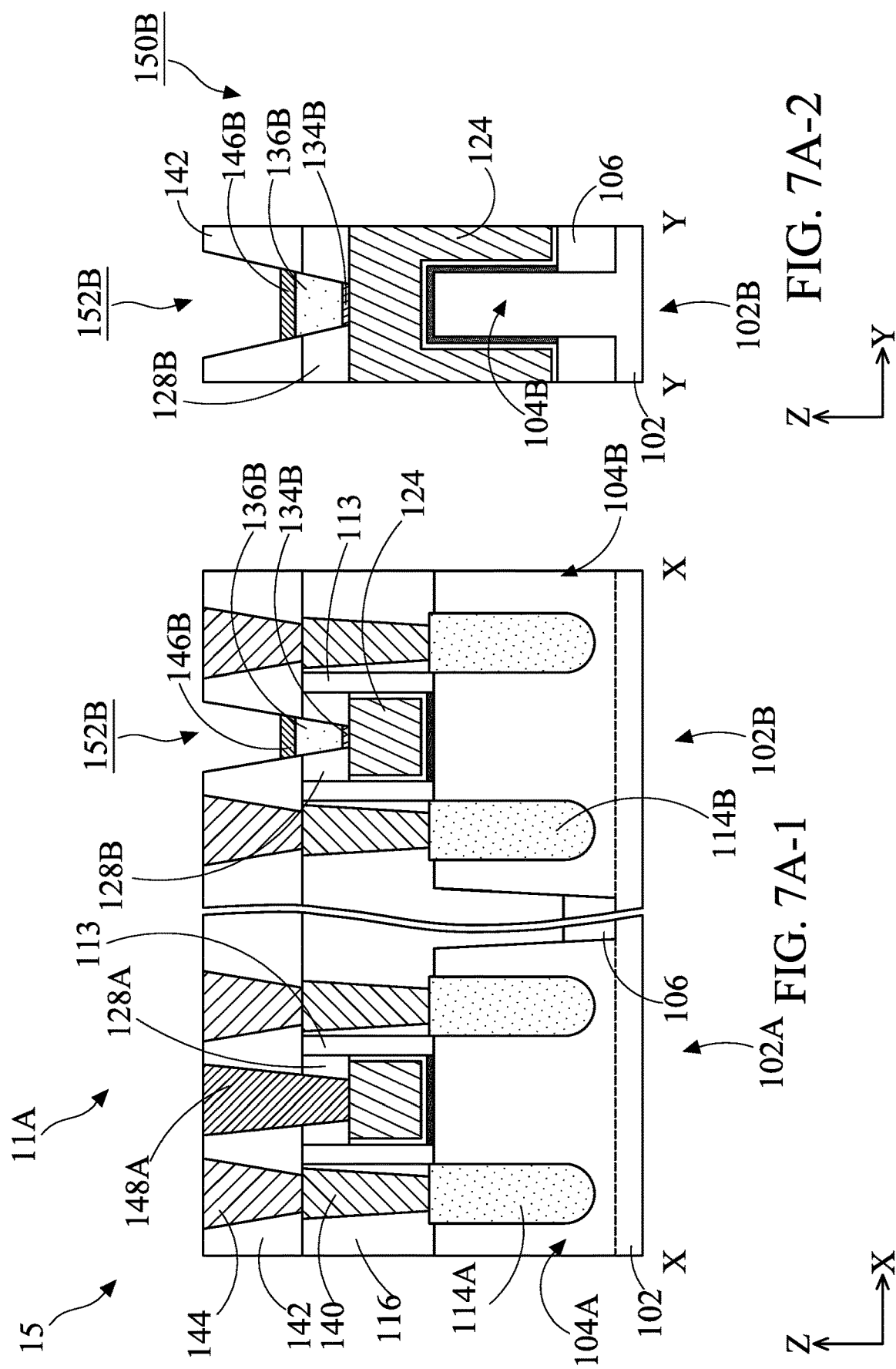

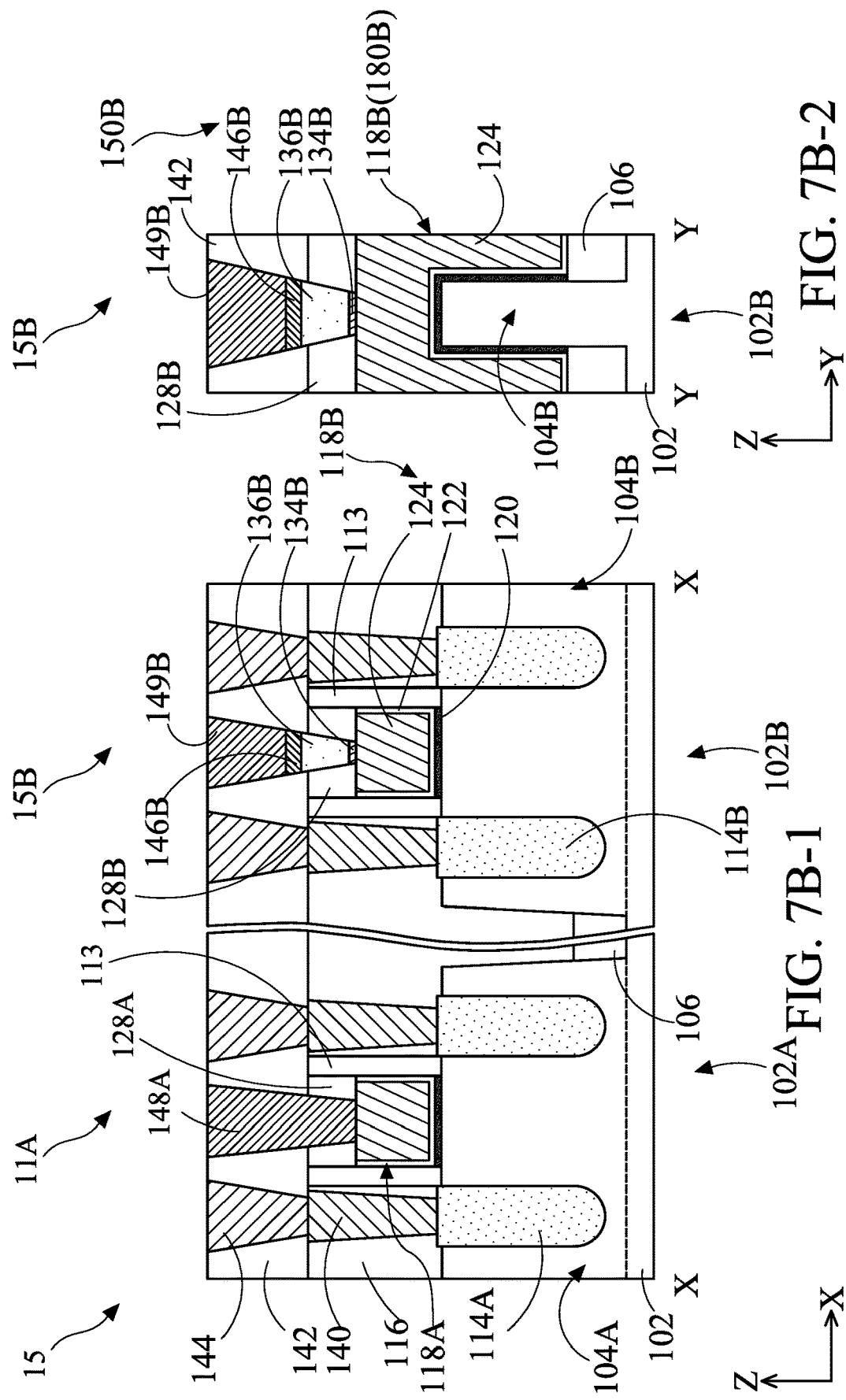

SEMICONDUCTOR DEVICE STRUCTURE AND METHOD FOR FORMING THE SAME

BACKGROUND

Many modern-day electronic devices contain an electronic memory configured to store data. This electronic memory may be a volatile memory or a non-volatile memory. Volatile memory stores data while it is powered, while non-volatile memory is able to store data when power is removed. Ferroelectric random-access memory (FRAM) devices are a promising candidate for next-generation non-volatile memory technology. This is because FRAM devices have many advantages, including a fast write time, high endurance, low power consumption, and low susceptibility to damage from radiation. In addition, decoupled ferroelectric material allows increasing fields to pass through the ferroelectric material so that the FRAM devices may become potential applications in an advanced node. However, it can be difficult to integrate the fabrication of a FRAM device into a complementary metal-oxide-semiconductor (CMOS) process. While the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1 through 2L-2 are cross-sectional views illustrating the formation of a semiconductor device structure with FinFET design at various intermediate stages, in accordance with some embodiments of the disclosure.

FIGS. 4-1 and 4-2 are cross-sectional views of a semiconductor device structure with FinFET design, in accordance with some embodiments of the disclosure.

FIGS. 6A-1 through 6D-2 are cross-sectional views illustrating the formation of a semiconductor device structure with FinFET design at various intermediate stages, in accordance with some embodiments of the disclosure.

FIGS. 7A-1 through 7B-2 are cross-sectional views illustrating the formation of a semiconductor device structure with FinFET design at various intermediate stages, in accordance with some embodiments of the disclosure.

FIGS. 9A-1 through 9D-2 are cross-sectional views illustrating the formation of a semiconductor device structure with GAA design at various intermediate stages, in accordance with some embodiments of the disclosure.

FIGS. 10-1 and 10-2 are cross-sectional views of a semiconductor device structure with GAA design, in accordance with some embodiments of the disclosure.

FIGS. 12-1 and 12-2 are cross-sectional views of a semiconductor device structure with GAA design, in accordance with some embodiments of the disclosure.

FIGS. 13-1 and 13-2 are cross-sectional views of a semiconductor device structure with GAA design, in accordance with some embodiments of the disclosure.

FIGS. 14A-1 through 14B-2 are cross-sectional views illustrating the formation of a semiconductor device structure at various intermediate stages with GAA design, in accordance with some embodiments of the disclosure.

DETAILED DESCRIPTION

Figures 1, 2A:
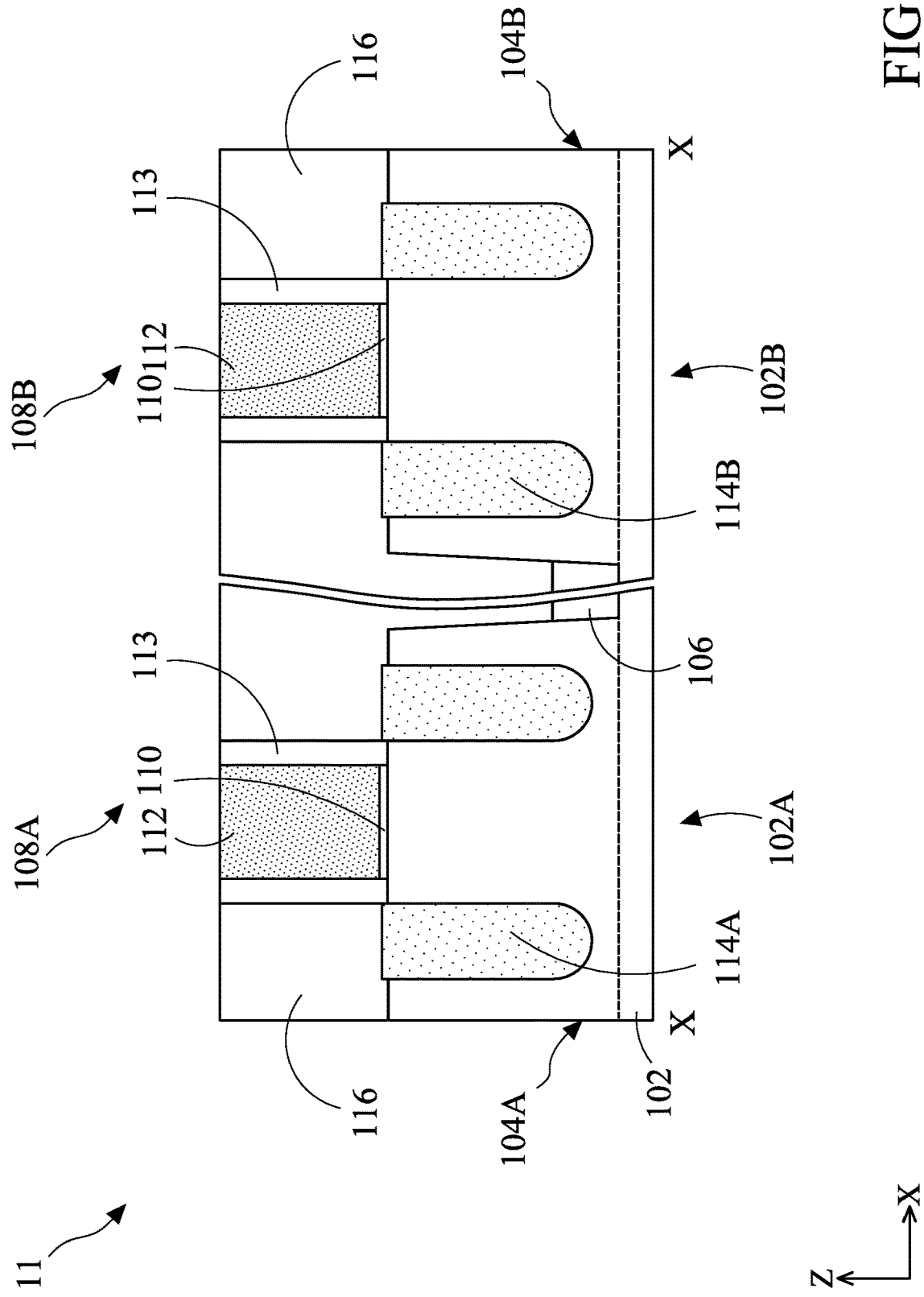

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

The present disclosure, in some embodiments, relates to a semiconductor device structure having a ferroelectric random access memory (FRAM) device with fin field effect transistor (FinFET) design or gate-all-around (GAA) design. The FeFET may be integrated into complementary metal-oxide-semiconductor (CMOS) manufacturing processes. In specific, a capacitor of the FeFET may be fabricated in CMOS middle-end of line (MEOL) processes. MEOL generally encompasses processes related to fabricating contact plugs and/or vias to conductive features (e.g., gate stacks and/or the source/drain features) of the device (e.g., transistors). Embodiments of a semiconductor device structure including a FeFET device and a method for forming the same are provided. The FeFET may have capacitor above transistor (CAT) design in which a capacitor of the FeFET device is formed directly above and in electrical connected to a gate stack of a transistor. The method for forming the FeFET device includes recessing the gate stack to form a recess and forming a ferroelectric layer in the recess. Therefore, the endurance and the retention of the FeFET device may be enhanced, the power consumption the FeFET device may be lowered, and a fabrication process for forming the FeFET device may be achieved.

FIG. 1 is a perspective view of a semiconductor device structure 11 with FinFET design, in accordance with some embodiments of the disclosure. a semiconductor device structure 11 is provided, as shown in FIG. 1, in accordance with some embodiments. The semiconductor device structure 11 includes a substrate 102, in accordance with some embodiments. For a better understanding of the semiconductor device structure, FIG. 1 illustrates an X-Y-Z coordinate reference that is used in later figures. The X-axis and Y-axis are generally orientated along the lateral directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The substrate 102 may include various device regions, e.g., a logic region, a volatile memory region (e.g., static random access memory (SRAM) region), a non-volatile memory region (e.g., an FRAM region), an analog region, a peripheral region (e.g., input/output region), another suitable region, or a combination thereof. In some embodiments, the substrate 102 includes a first region 102A where logic devices and/or SRAM devices are to be formed and a second region 102A where ferroelectric field effect transistor (FeFET) devices are to be formed, as shown in FIG. 1, in accordance with some embodiments.

A first fin structure 104A is formed over the first region 102A of the substrate 102 and a second fin structure 104B is formed over the second region 102B of the substrate 102, in accordance with some embodiments. For example, the first fin structure 104A may be used to form logic devices and/or SRAM devices, and the second fin structure 104B may be used to form FeFET devices.

The fin structures 104A and 104B extend in the X direction, in accordance with some embodiments. That is, the fin structures 104A and 104B each have a longitudinal axis parallel to X direction, in accordance with some embodiments. X direction may also be referred to as the channel-extending direction. Each of the fin structures 104A and 104B includes a channel region CH and source/drain regions SD, where the channel region CH is defined between the source/drain regions SD, in accordance with some embodiments. FIG. 1 shows one channel region CH and two source/drain regions SD for illustrative purpose and is not intended to be limiting. The number of the channel region CH and the source/drain region SD may be dependent on design demand and/or performance consideration of the semiconductor device structure 11. Final gate stacks (not shown) will be formed with a longitudinal axis parallel to Y direction and extending across the channel regions CH of the fin structures 104A and 104B. Y direction may also be referred to as a gate-extending direction.

In some embodiments, the formation of the fin structures 104A and 104B includes patterning the substrate 102. In some embodiments, the patterning process includes forming a patterned mask layer (not shown) over the substrate 102, and etching the substrate 102 uncovered by the patterned mask layer, thereby forming trenches and the fin structures 104A and 104B protruding between from the trenches. The patterned mask layer may be a patterned photoresist layer and/or a patterned hard mask. The etching process may be an anisotropic etching process, e.g., dry etching. The fin structures 104A and 104B are active regions of the semiconductor device structure 11, which are to be formed into channel regions and source/drain regions of transistors, e.g., FinFETs, in accordance with some embodiments.

FIG. 1 further illustrates a reference cross-section that is used in later figures. Cross-sections X-X are in planes along the longitudinal axes of the fin structure 104A and 104B, in accordance with some embodiments. Cross-section Y-Y is in a plane across the channel region CH of the fin structures 104A and 104B and is along the longitudinal axis of a gate stack, in accordance with some embodiments.

FIGS. 2A-1 through 2L-2 are cross-sectional views illustrating the formation of a semiconductor device structure 11 with FinFET design at various intermediate stages, in accordance with some embodiments of the disclosure. FIGS. 2A-1, 2B-1, 2C-1, 2D-1, 2E-1, 2F-1, 2G-1, 2H-1, 2I-1, 2J-1, 2K-1 and 2L-1 are cross-sectional views corresponding to cross-section X-X of FIG. 1 and FIGS. 2A-2, 2B-2, 2C-2, 2D-2, 2E-2, 2F-2, 2G-2, 2H-2, 2I-2, 2J-2, 2K-2 and 2L-2 are cross-sectional views corresponding to cross-section Y-Y of FIG. 1.

Figures 2, 2A:
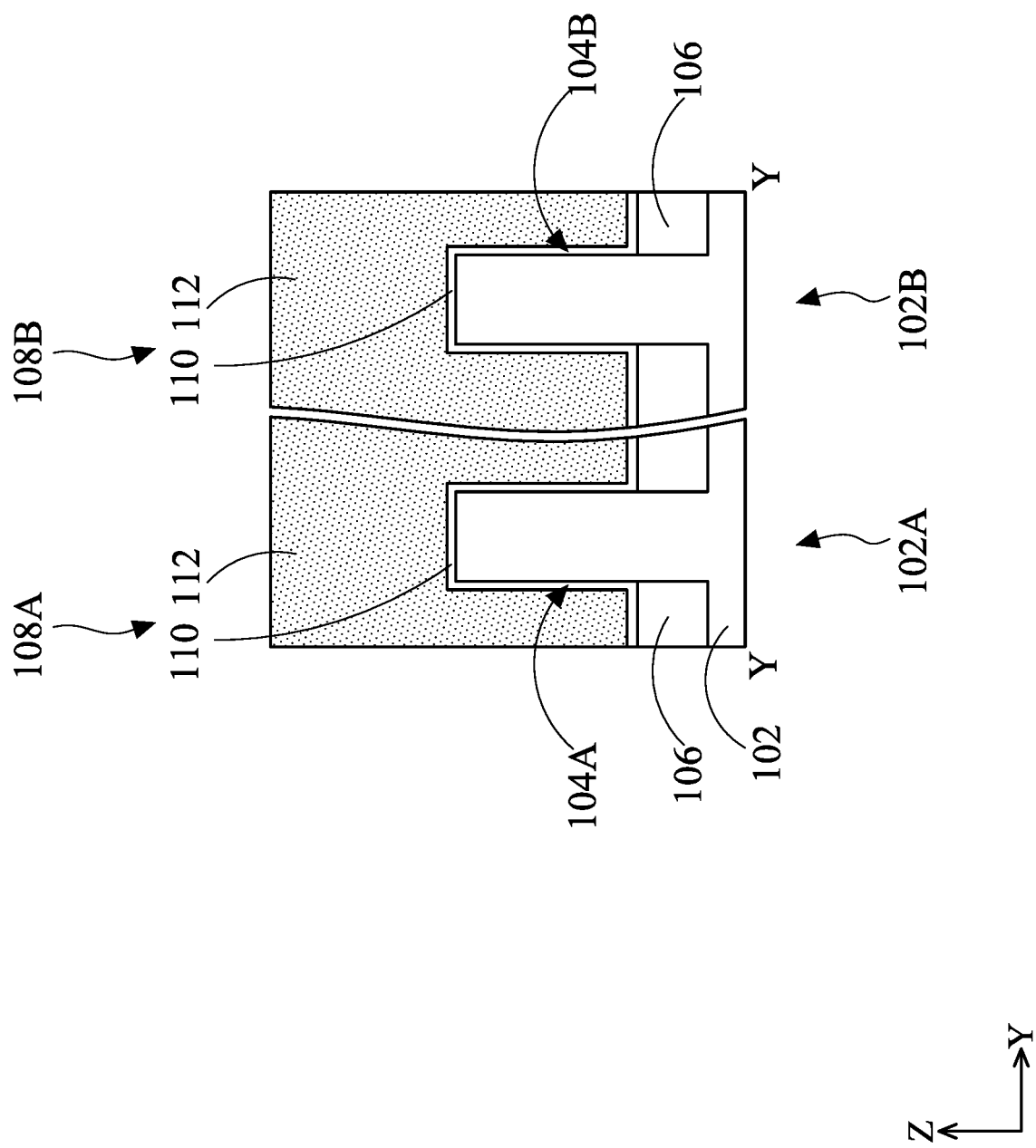

FIGS. 2A-1 and 2A-2 are cross-sectional views of a semiconductor device structure 11 after the formation of an isolation feature 106, dummy gate structures 108A and 108B, gate spacer layers 113, source/drain features 114A and 114B, and a lower interlayer dielectric (ILD) layer 116, in accordance with some embodiments. An isolation feature 106 is formed over the substrate 102 and surrounds lower portions of the fin structures 104A and 104B, as shown in FIGS. 2A-1 and 2A-2, in accordance with some embodiments. The isolation features 106 is configured to electrically isolate the active regions, e.g., fin structures 104A and 104B and is also referred to as shallow trench isolation (STI) feature, in accordance with some embodiments.

In some embodiments, the isolation feature 106 is made of an insulating material such as silicon oxide, silicon nitride, silicon oxynitride (SiON), another suitable insulating material, multilayers thereof, and/or a combination thereof. In some embodiments, the formation of the isolation feature 106 includes depositing one or more insulating materials for the isolation feature 106 over the semiconductor device structure 11 to fill the trenches, planarizing the insulating material to remove portions of the insulating material above the upper surfaces of the fin structures 104A and 104B, and recessing the insulating material using an etching process, thereby exposing upper portions of the fin structures 104A and 104B and forming the isolation feature 106. In some embodiments, the deposition process includes CVD (such as LPCVD, plasma enhanced CVD (PECVD), high density plasma CVD (HDP-CVD), high aspect ratio process (HARP), flowable CVD (FCVD)), atomic layer deposition (ALD), another suitable technique, and/or a combination. The planarization may be chemical mechanical polish (CMP). A recessing depth may be controlled (e.g., by controlling an etching time) so as to provide the desired height of the exposed upper portions of the fin structures 104A and 104B.

A first dummy gate structure 108A is formed across the first fin structure 104A and a second dummy gate structure 108B is formed across the second fin structure 104B, as shown in FIGS. 2A-1 and 2A-2, in accordance with some embodiments. In some embodiments, the dummy gate structures 108A and 108B extend in Y direction. That is, the dummy gate structures 108A and 108B have longitudinal axes parallel to Y direction, in accordance with some embodiments. The dummy gate structures 108A and 108B wrap the channel regions of the fin structures 108A 104A and 104B, in accordance with some embodiments.

The dummy gate structures 108A and 108B each includes a dummy gate dielectric layer 110 and a dummy gate electrode layer 112 formed over the dummy gate dielectric layer 110, in accordance with some embodiments. In some embodiments, the dummy gate dielectric layers 110 are made of one or more dielectric materials, such as silicon oxide (SiO), silicon nitride (SiN), silicon oxynitride (SiON), and/or a combination thereof. In some embodiments, the dielectric material is formed using ALD, CVD, thermal oxidation, another suitable technique, and/or a combination thereof. In some embodiments, the dummy gate electrode layers 112 are made of a conductive material, such as polysilicon, poly-silicon germanium, and/or a combination thereof. In some embodiments, the conductive material is formed using CVD, another suitable technique, and/or a combination thereof. In some embodiments, the formation of the dummy gate structures 108A and 108B includes conformally depositing a dielectric material for the dummy gate dielectric layer 110 over the semiconductor device structure 11, depositing a conductive material for the dummy gate electrode layer 112 over the dielectric material, planarizing the conductive material, and patterning the conductive material and dielectric material into the dummy gate structures 108A and 108B.

Gate spacer layers 113 are formed along and cover opposite sidewalls of the dummy gate structures 108A and 108B, as shown in FIGS. 2A-1 and 2A-2, in accordance with some embodiments. The gate spacer layers 113 are configured to offset the subsequently formed source/drain features and separate the source/drain features from the gate structure, in accordance with some embodiments.

In some embodiments, the gate spacer layers 113 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layers 113 includes conformally depositing a dielectric material for the gate spacer layers 113 over the semiconductor device structure 11 followed by an anisotropic etching process such as dry etching. The etching process is performed to remove horizontal portions of the dielectric material for the gate spacer layers 113, while leaving vertical portions of the dielectric material on sidewalls of the dummy gate structure 108A and 108B to act as the gate spacer layers 113.

First source/drain features 114A are formed over the first fin structure 104A and second source/drain features 114B are formed over the second fin structure 104B, as shown in FIGS. 2A-1 and 2A-2, in accordance with some embodiments. The source/drain features 114A and 114B are formed on opposite sides of the dummy gate structure 108A and 108B, in accordance with some embodiments.

The formation of the source/drain features 114A and 114B includes recessing the fin structures 104A and 104B to form source/drain recesses (not shown) at the source/drain regions, in accordance with some embodiments. A recessing depth may be dependent on the desired height of the source/drain features 114A and 114B for performance consideration. Afterward, one or more semiconductor material for the source/drain features 114A and 114B are grown on the fin structures 104A and 104B from the source/drain recesses using epitaxial growth processes, in accordance with some embodiments. The epitaxial growth process may be molecular beam epitaxy (MBE), metal organic chemical vapor deposition (MOCVD), or vapor phase epitaxy (VPE), another suitable technique, or a combination thereof.

In some embodiments, the source/drain features 114A and 114B are made of any suitable semiconductor material, such as Ge, Si, GaAs, AlGaAs, SiGe, GaAsP, SiP, SiC, SiCP, or a combination thereof. In some embodiments, the source/drain features 114A and 114B are doped in-situ during the epitaxial growth process. For example, the source/drain features 114A and 114B may be the epitaxially grown SiGe doped with boron (B). For example, the source/drain features 114A and 114B may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. The growths of the first source/drain features 114A and the second source/drain features 114B may be performed separately.

A lower interlayer dielectric layer 116 is formed over the semiconductor device structure 11, as shown in FIGS. 2A-1 and 2A-2, in accordance with some embodiments. The lower interlayer dielectric layer 116 is formed to cover the source/drain features 114A and 114B, in accordance with some embodiments.

In some embodiments, the lower interlayer dielectric layer 116 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, a dielectric material for the lower interlayer dielectric layer 116 is deposited using such as CVD (such as HDP-CVD, PECVD, or HARP), another suitable technique, and/or a combination thereof. In some embodiments, the lower interlayer dielectric layer 116 is a multilayer structure. For example, the lower interlayer dielectric layer 116 may include a thin silicon nitride-based etching stop layer and a silicon oxide-based bulk layer formed over the etching stop layer. Afterward, the dielectric material for the lower interlayer dielectric layer 116 above the upper surfaces of the dummy gate electrode layers 112 is removed using such as CMP until the dummy gate electrode layers 112 are exposed. In some embodiments, the upper surface of the lower interlayer dielectric layer 116 is substantially coplanar with the upper surfaces of the dummy gate electrode layers 112.

Figures 1, 2B:
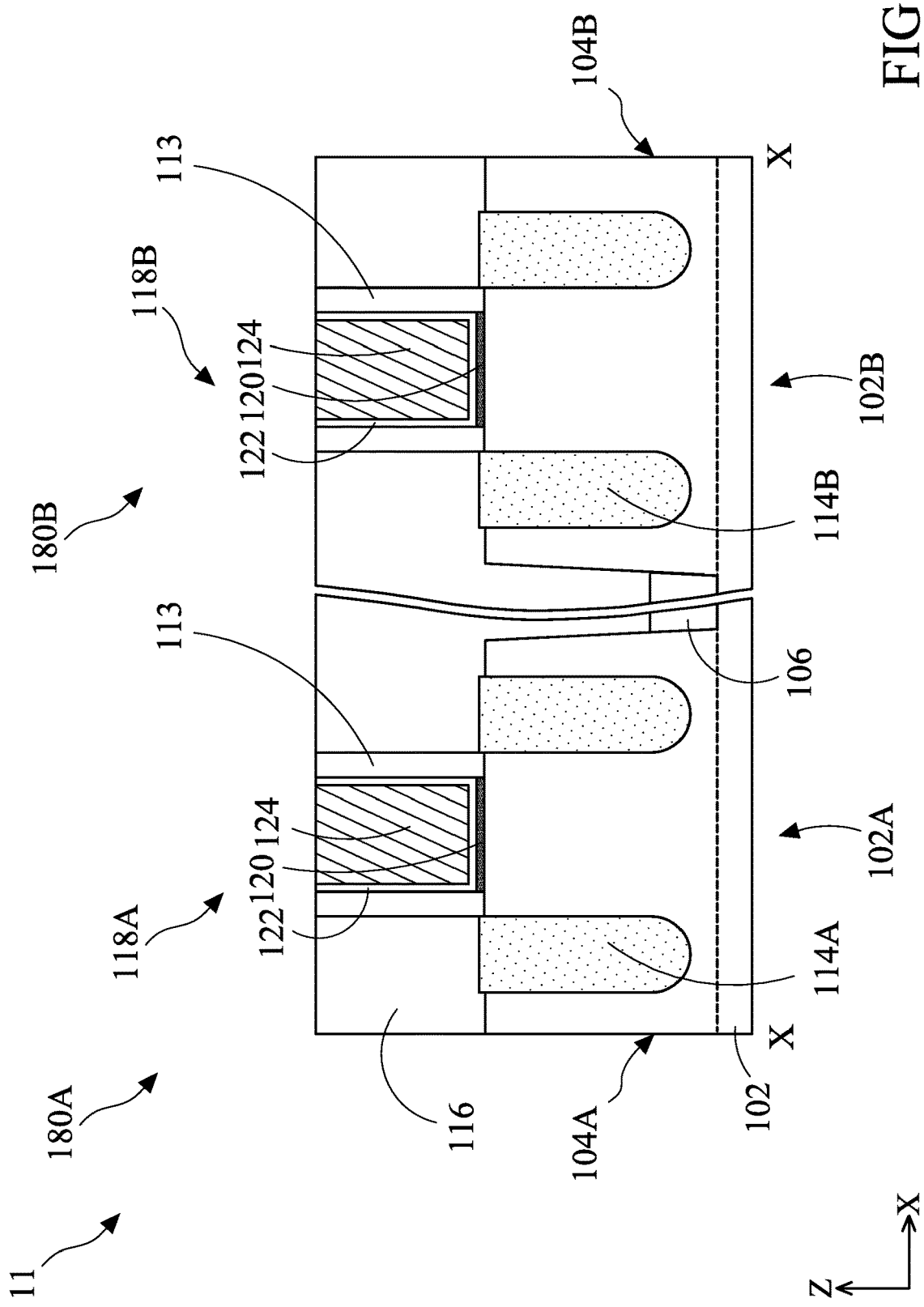
FIG. 1 is a perspective view of a semiconductor device structure with FinFET design, in accordance with some embodiments of the disclosure.
Figures 2, 2B:
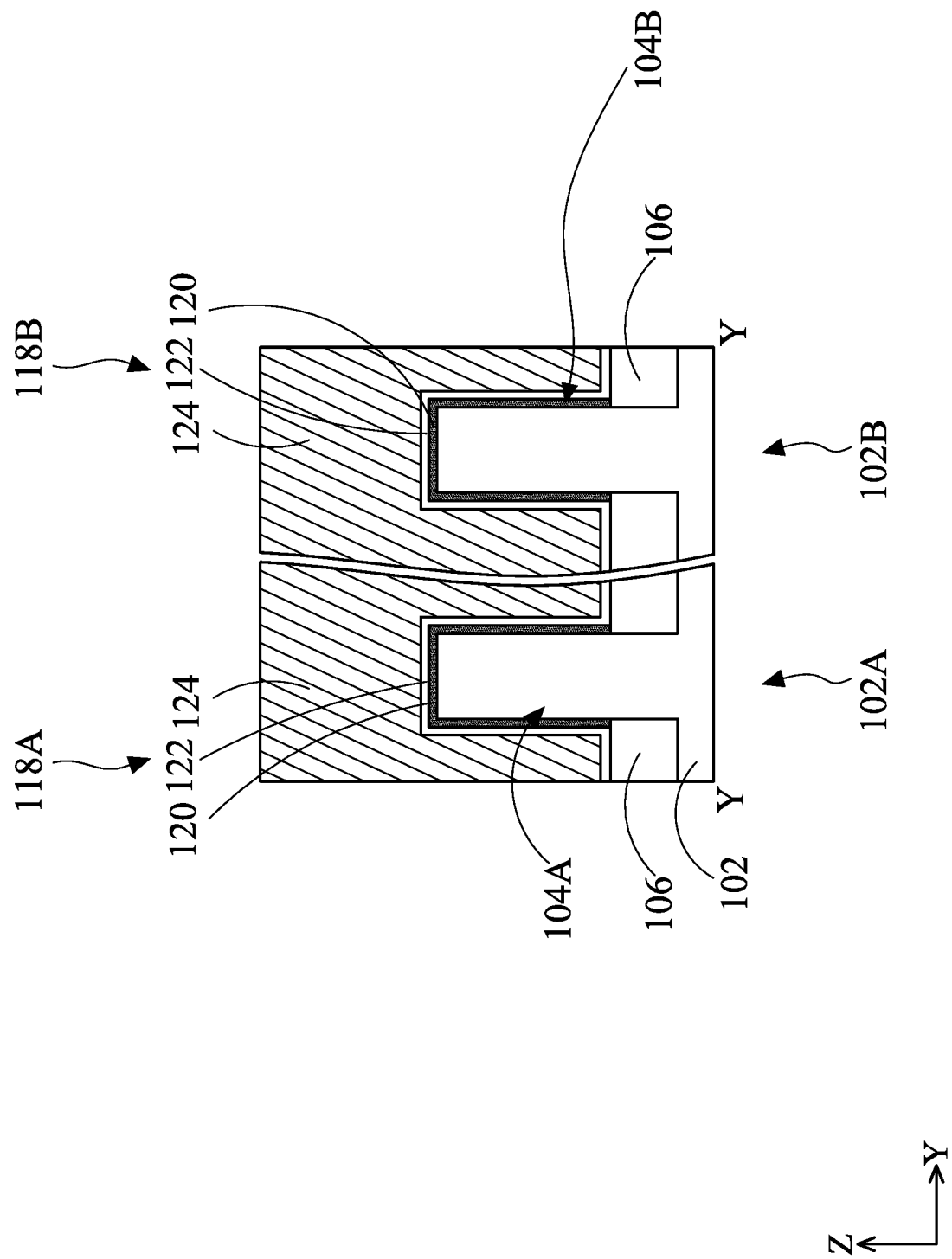

FIGS. 2B-1 and 2B-2 are cross-sectional views of a semiconductor device structure 11 after the formation of final gate stacks 118A and 118B, in accordance with some embodiments. The dummy gate structures 108A and 108B are removed using an etching process to form gate trenches (not shown), in accordance with some embodiments. The gate trenches expose the channel regions of the fin structures 104A and 104B, in accordance with some embodiments. In some embodiments, the etching process includes one or more etching processes. For example, when the dummy gate electrode layers 112 are made of polysilicon, a wet etchant such as a tetramethylammonium hydroxide (TMAH) solution may be used to selectively remove the dummy gate electrode layer 116. For example, the dummy gate dielectric layers 110 may be thereafter removed using a plasma dry etching, a dry chemical etching, and/or a wet etching.

A first final gate stack 118A is formed to fill the gate trench and wrap around the channel region of the first fin structure 104A and a second final gate stack 118B is formed to fill the gate trench and wrap around the channel region of the second fin structure 104B, as shown in FIGS. 2B-1 and 2B-2, in accordance with some embodiments. The first final gate stack 118A extends across the channel region of the first fin structure 104A and the second final gate stack 118B extends across the channel region of the second fin structure 104B, in accordance with some embodiments. In some embodiments, the final gate stacks 118A and 118B extend in Y direction. That is, the final gate stacks 118A and 118B have longitudinal axes parallel to Y direction, in accordance with some embodiments.

The final gate stacks 118A and 118B each include an interfacial layer 120, a high-k gate dielectric layer 122 and a metal gate electrode layer 124, in accordance with some embodiments. The interfacial layers 120 are formed on the surfaces of the fin structures 104A and 104B exposed from the gate trenches, in accordance with some embodiments. In some embodiments, the interfacial layers 120 are made of a chemically formed silicon oxide. In some embodiments, the interfacial layers 120 are formed using one or more cleaning processes such as including ozone ($O_3$).

The high-k gate dielectric layers 122 are formed conformally along the interfacial layer 120, in accordance with some embodiments. The high-k gate dielectric layers 122 are also conformally formed along the inner sidewalls of the gate spacer layers 113 facing the channel region, as shown in FIG. 2B-1, in accordance with some embodiments. The high-k gate dielectric layers 122 are also conformally formed along the upper surface of the isolation feature 106, as shown in FIG. 2B-2, in accordance with some embodiments In some embodiments, the high-k gate dielectric layers 122 are made of a dielectric material with high dielectric constant (k value), for example, greater than 3.9. In some embodiments, the high-K dielectric material includes hafnium oxide ($HfO_2$), $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), a combination thereof, or another suitable material. The high-k gate dielectric layer 122 may be formed by ALD, PVD, CVD, and/or another suitable technique.

The metal gate electrode layers 124 are formed over the high-k gate dielectric layers 122 and fill the remainders of the gate trenches, in accordance with some embodiments. In some embodiments, the metal gate electrode layers 124 are made of more than one conductive material, such as a metal, metal alloy, conductive metal oxide and/or metal nitride, another suitable conductive material, and/or a combination thereof. The metal gate electrode layers 124 may be a multi-layer structure with various combinations of a diffusion barrier layer, a work function layer with a selected work function to enhance the device performance (e.g., threshold voltage), a capping layer to prevent oxidation of a work function layer, a glue layer to adhere the work function layer to a next layer, and a metal fill layer to reduce the total resistance of the final gate stack, and/or another suitable layer. The metal gate electrode layers 124 may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof. The metal gate electrode layer may be formed by ALD, PVD, CVD, e-beam evaporation, or another suitable process. Furthermore, the metal gate electrode layers 124 of the first final gate stack 118A and the second final gate stack 118B may be formed separately.

A planarization process such as CMP may be performed on the semiconductor device structure 11 to remove the materials of the high-k gate dielectric layers 122 and the metal gate electrode layers 124 formed above the upper surface of the lower interlayer dielectric layer 116, in accordance with some embodiments. After the planarization process, the upper surfaces of the metal gate electrode layers 124 and the upper surface of the lower interlayer dielectric layer 116 are substantially coplanar, in accordance with some embodiments.

The interfacial layers 120, the high-k gate dielectric layers 122 and the metal gate electrode layers 124 combine to form the final gate stacks 118A and 118B, in accordance with some embodiments. The first final gate stack 118A combines with the first source/drain features 114A to form a first transistor 180A (such as a FinFET) and the second final gate stack 118B combines with the second source/drain features 114B to form a second transistor 180B (such as a FinFET), as shown in FIG. 2B-1, in accordance with some embodiments. The final gate stacks 118A and 118B may engage the channel region of the transistors so that a current can flow between the source and the drain of the source/drain features 114A and/or between the source and the drain of the source/drain features 114B during operation.

Figures 1, 2C:
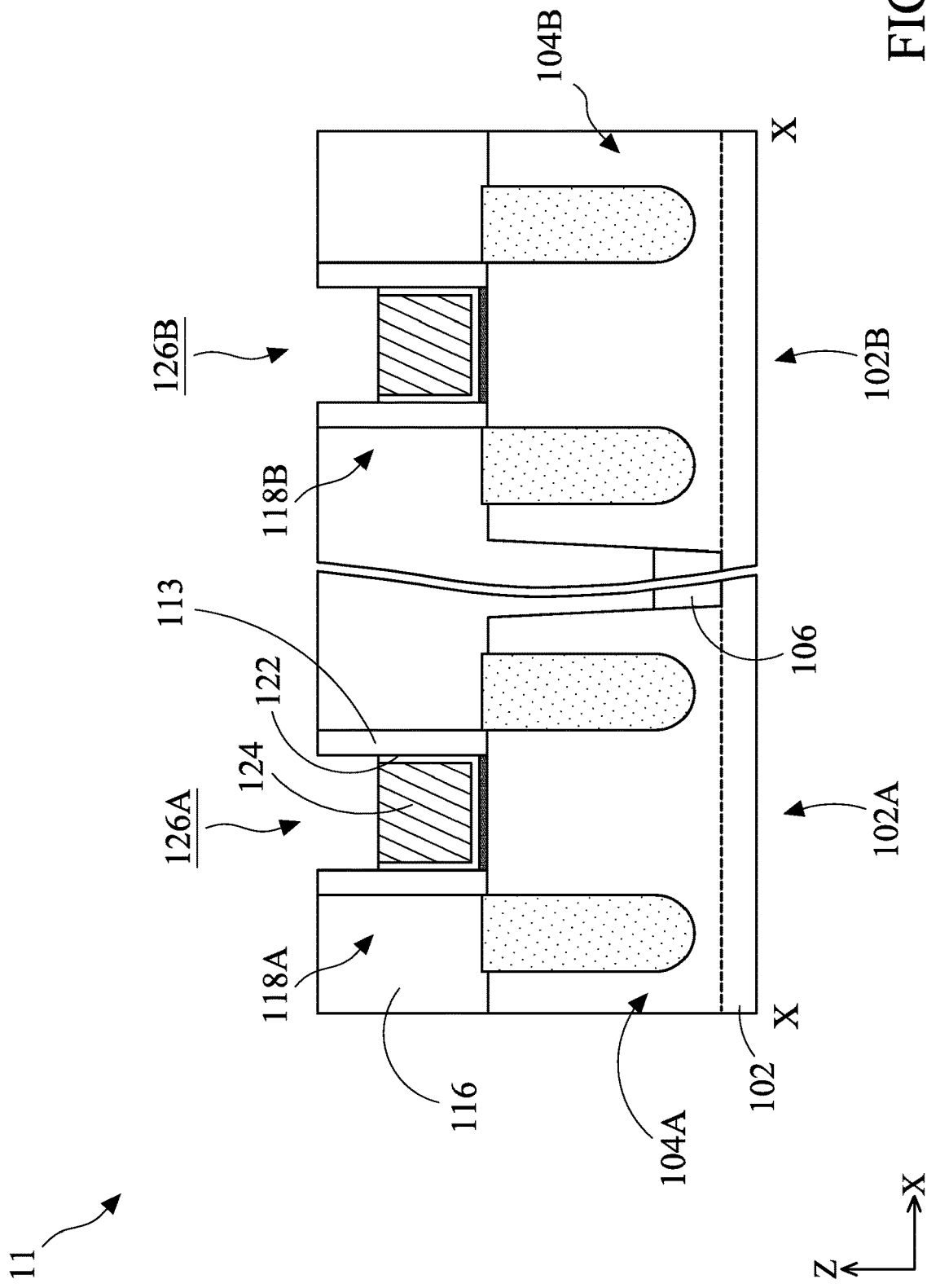
Figures 2, 2C:
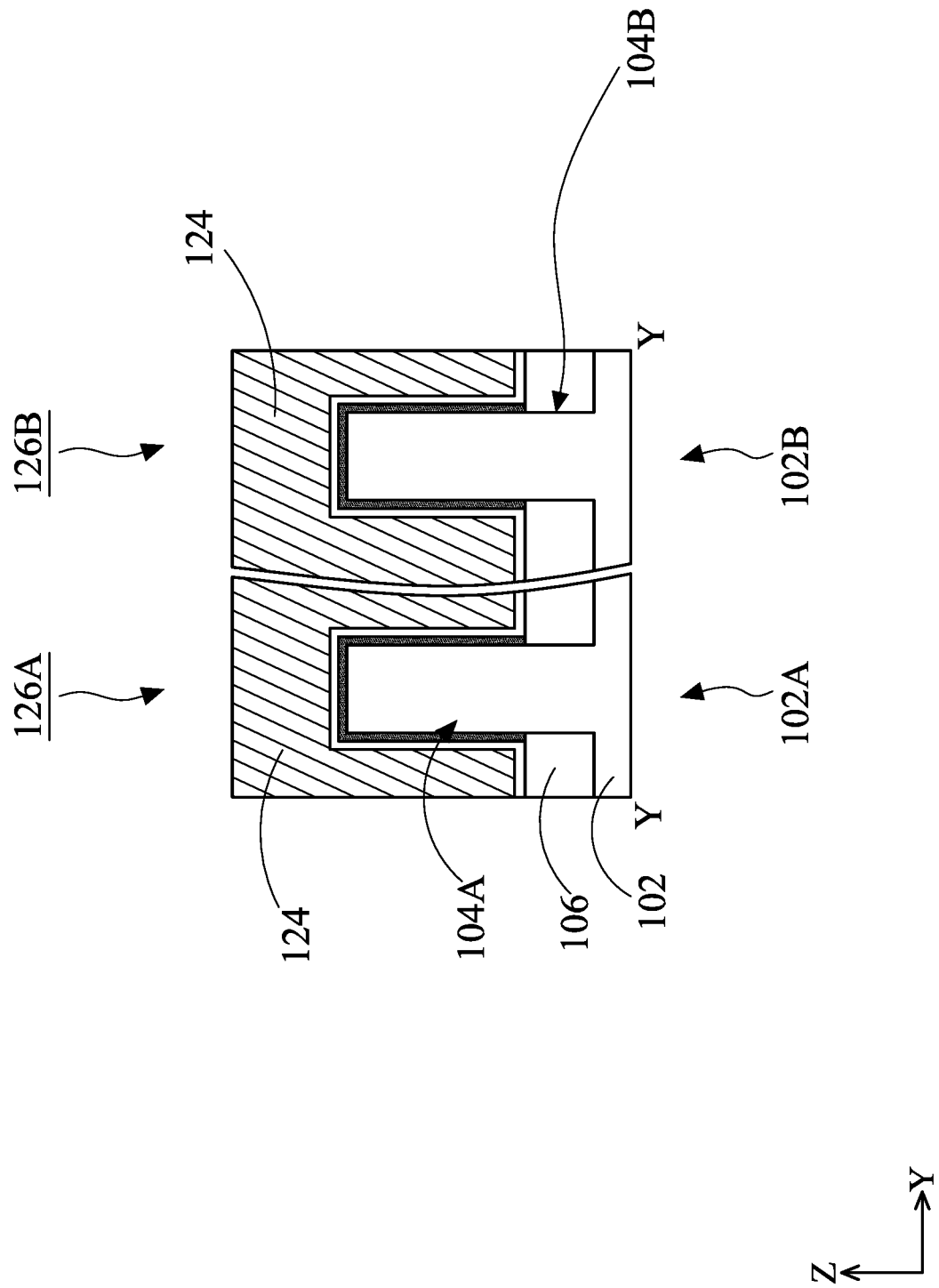

FIGS. 2C-1 and 2C-2 are cross-sectional views of a semiconductor device structure 11 after the formation of recesses 126A and 126B, in accordance with some embodiments. One or more etching process is performed on the semiconductor device structure 11 to recess the high-k gate dielectric layers 122 and the metal gate electrode layers 124, in accordance with some embodiments. A first recess 126A is formed between the gate spacer layers 113 over the first final gate stack 118A and a second recess 126B is formed between the gate spacer layers 113 over the second final gate stack 118B, as shown in FIGS. 2C-1 and 2C-2, in accordance with some embodiments. In some embodiments, the etching process is dry etching and/or wet etching. A recessing depth may be controlled (e.g., by controlling an etching time) so as to result in the desired height of the final gate stacks 118A and 118B.

Figures 1, 2D:
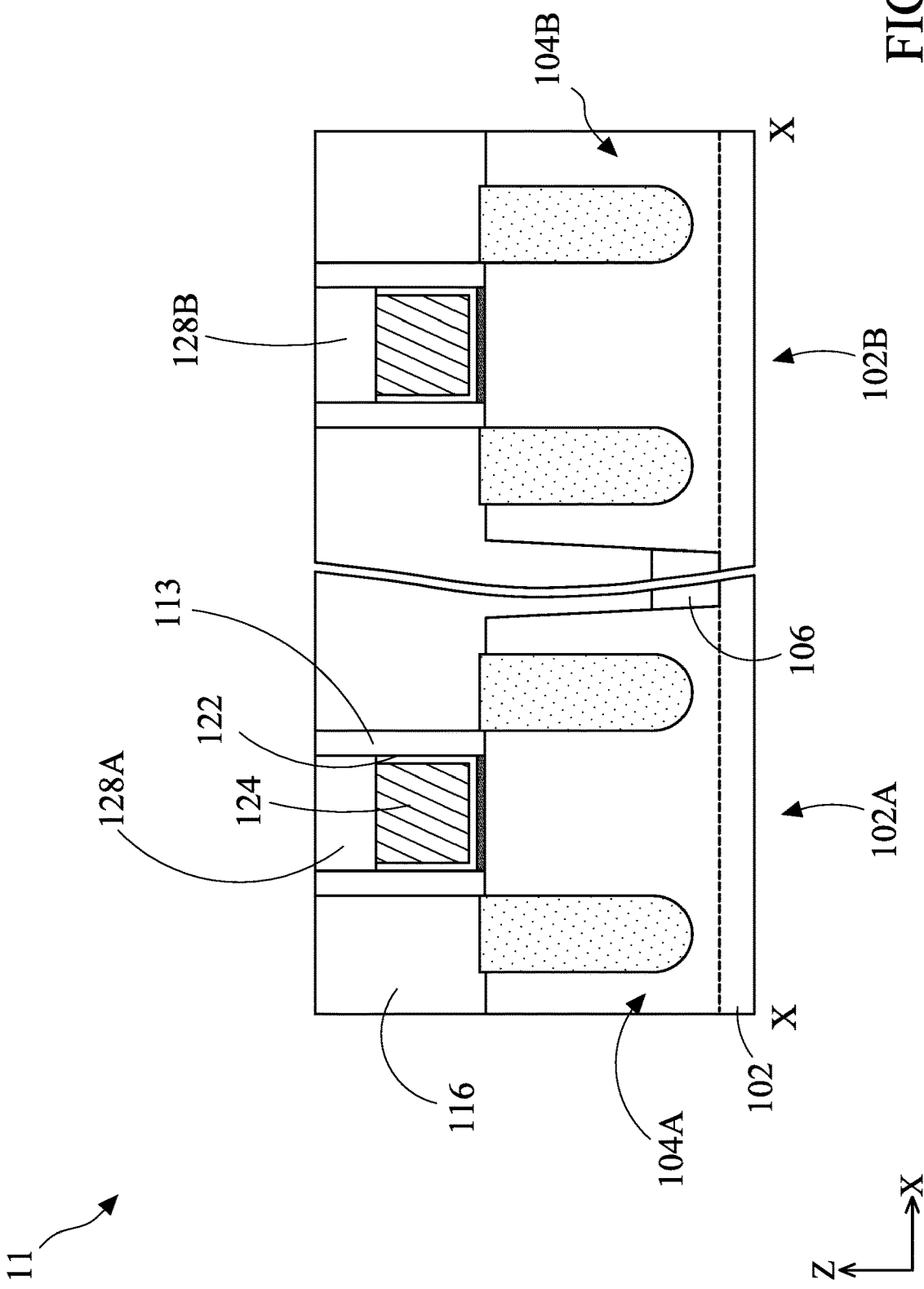
Figures 2, 2D:
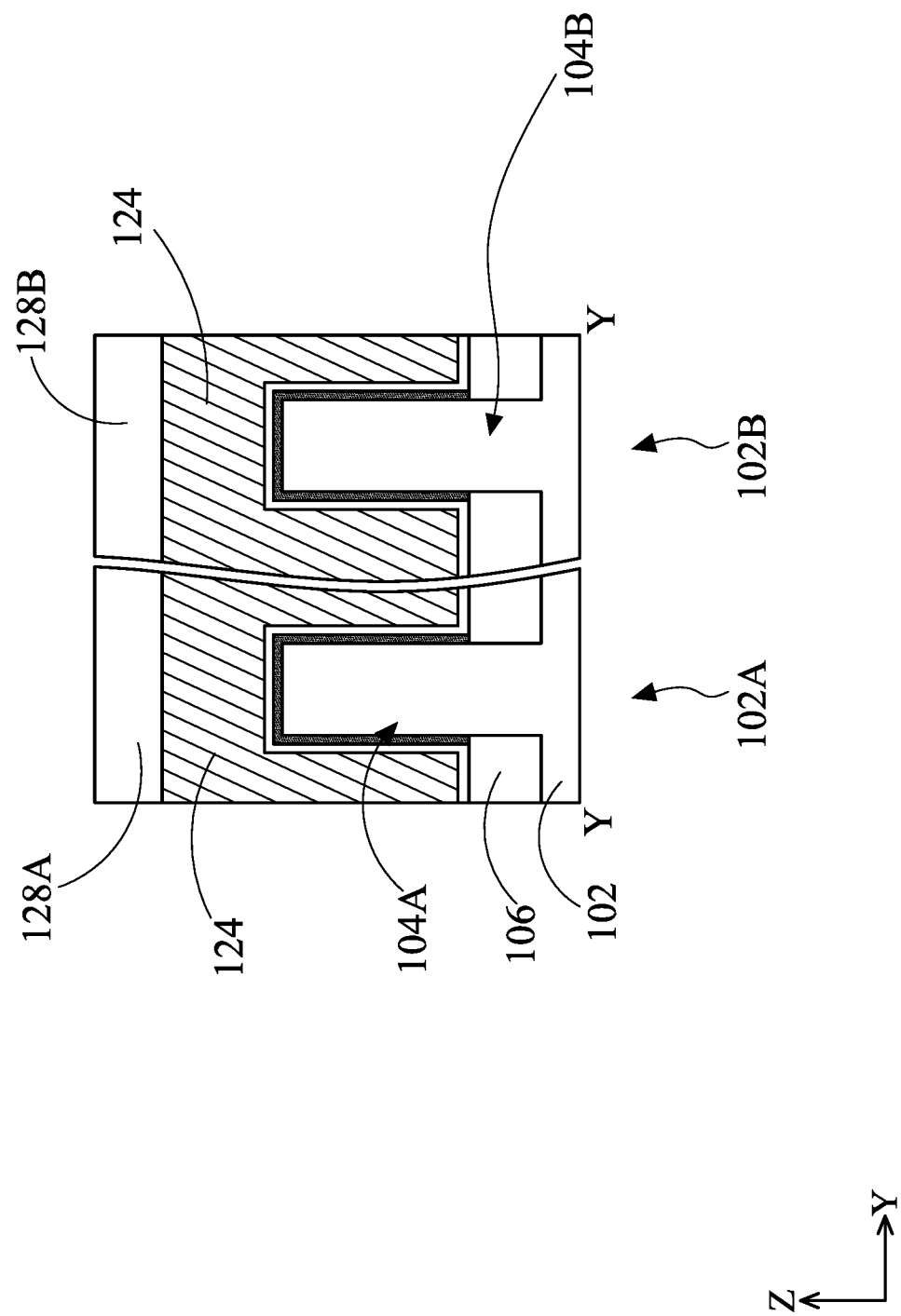

FIGS. 2D-1 and 2D-2 are cross-sectional views of a semiconductor device structure 11 after the formation of dielectric capping layers 128A and 128B, in accordance with some embodiments. A first dielectric capping layer 128A is formed to fill the first recess 126A and a second dielectric capping layer 128B is formed to fill the second recess 126B, as shown in FIGS. 2D-1 and 2D-2, in accordance with some embodiments.

In some embodiments, the dielectric capping layers 128A and 128B are made of an insulating material e.g., SiO, SiN, SiOC, SiON, SiOCN, SiCN, SiC, LaO, AlO, AlON, ZrO, HfO, ZnO, ZrN, ZrAlO, TiO, TaO, YO, and/or TaCN. In some embodiments, the formation of the dielectric capping layers 128A and 128B includes depositing an insulating material for the dielectric capping layers 128A and 128B over the semiconductor device structure 11, removing the insulating material over the upper surface of the lower interlayer dielectric layer 116 using such as CMP or etching-back process until the lower interlayer dielectric layer 116 is exposed. In some embodiments, the deposition process may be CVD (such as HDP-CVD, PECVD, or HARP), ALD, another suitable method, and/or a combination thereof. In some embodiments, the upper surfaces of the dielectric capping layers 128A and 128B, the upper surface of the lower interlayer dielectric layer 116 and the upper surfaces of the gate spacer layers 113 are substantially coplanar.

Figures 1, 2E:
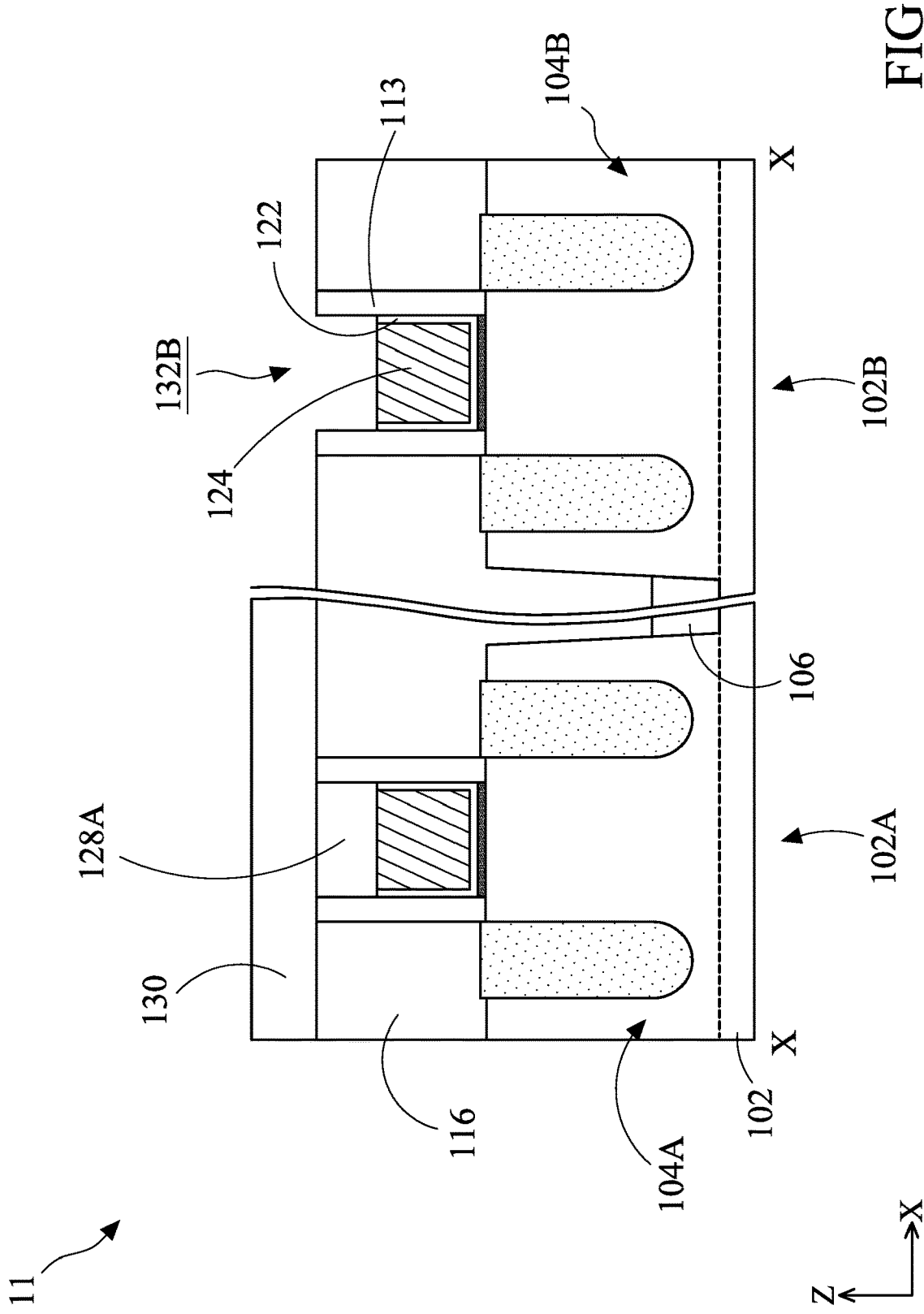
Figures 2, 2E:
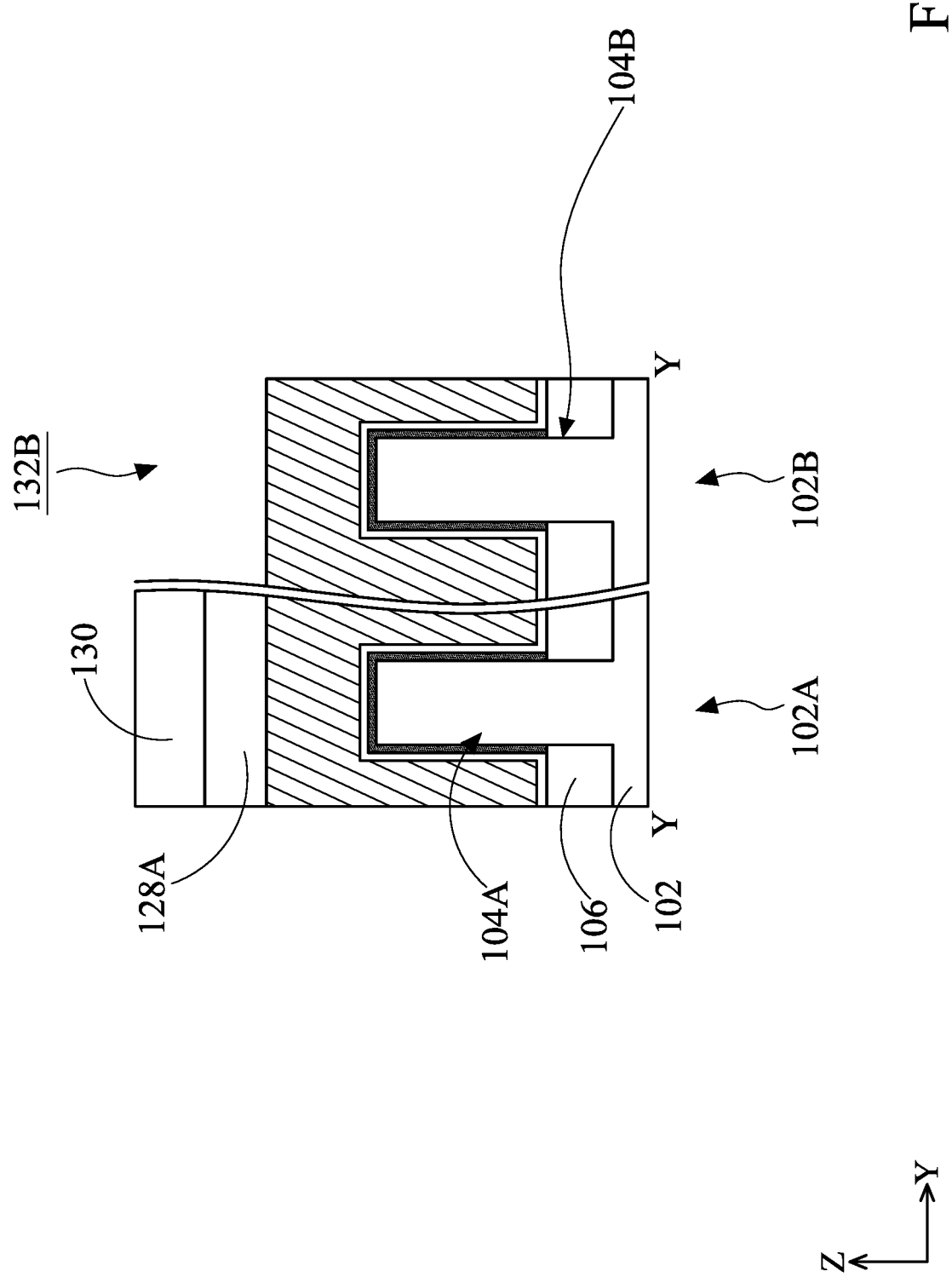

FIGS. 2E-1 and 2E-2 are cross-sectional views of a semiconductor device structure 11 after the removal of the second dielectric capping layer 128B, in accordance with some embodiments. A mask element 130 is formed to cover the first region 102A of the semiconductor device structure 11, as shown in FIGS. 2E-1 and 2E-2, in accordance with some embodiments. The mask element 130 may be a patterned photoresist layer or a patterned hard mask layer. An etching process is performed on the semiconductor device structure 11 to remove the second dielectric capping layer 128B, which is uncovered by the mask element 130, until the metal gate electrode layer 124 and the high-k gate dielectric layer 122 of the second final gate stack 118B are exposed, in accordance with some embodiments. The original second recess 126B is formed again and denoted as a second recess 132B, as shown in FIGS. 2E-1 and 2E-2. In some embodiments, the etching process is dry etching and/or wet etching. In some embodiments, the mask element 130 is removed using such as an ashing process after the etching process.

Figures 1, 2F:
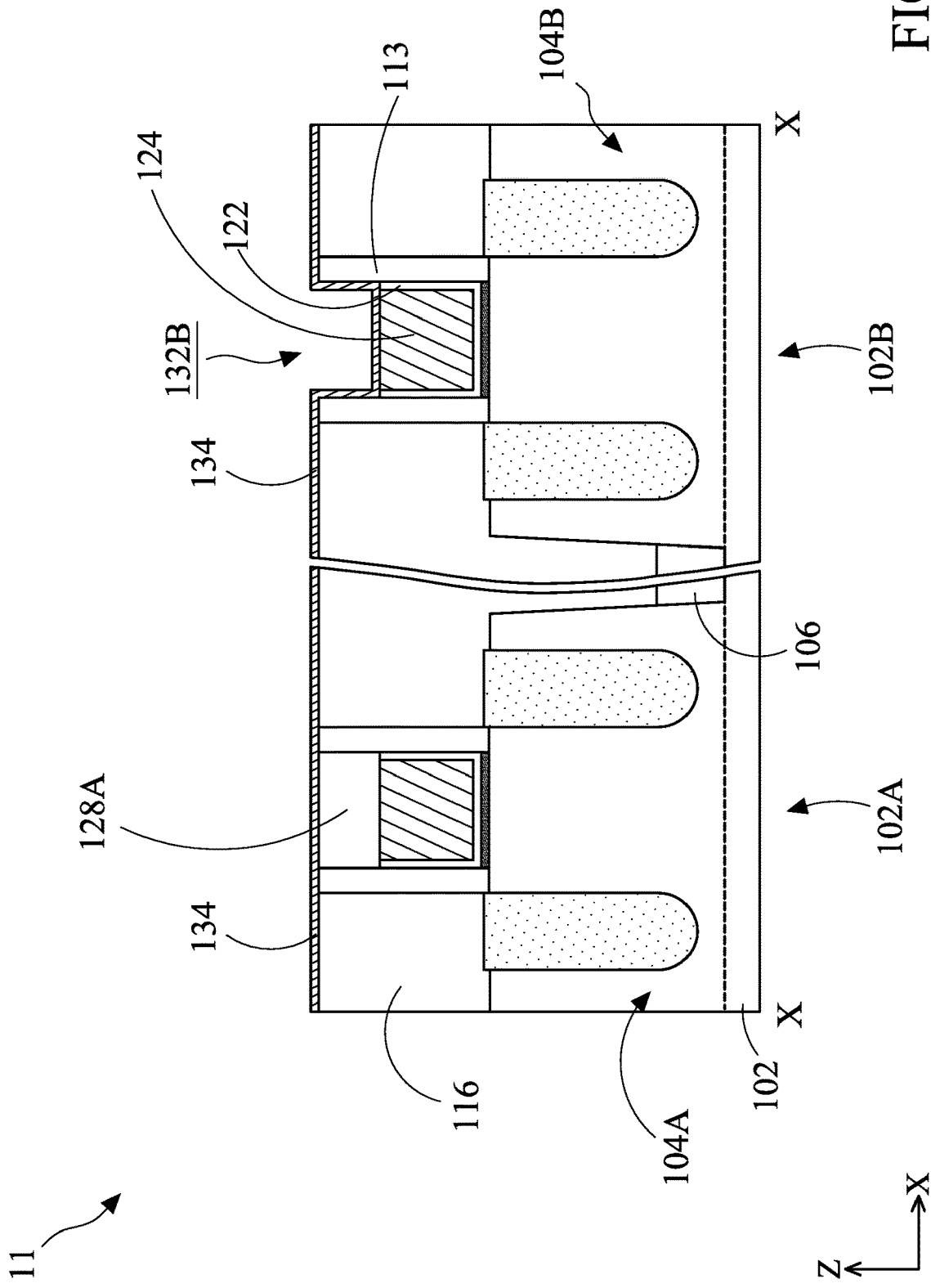
Figures 2, 2F:
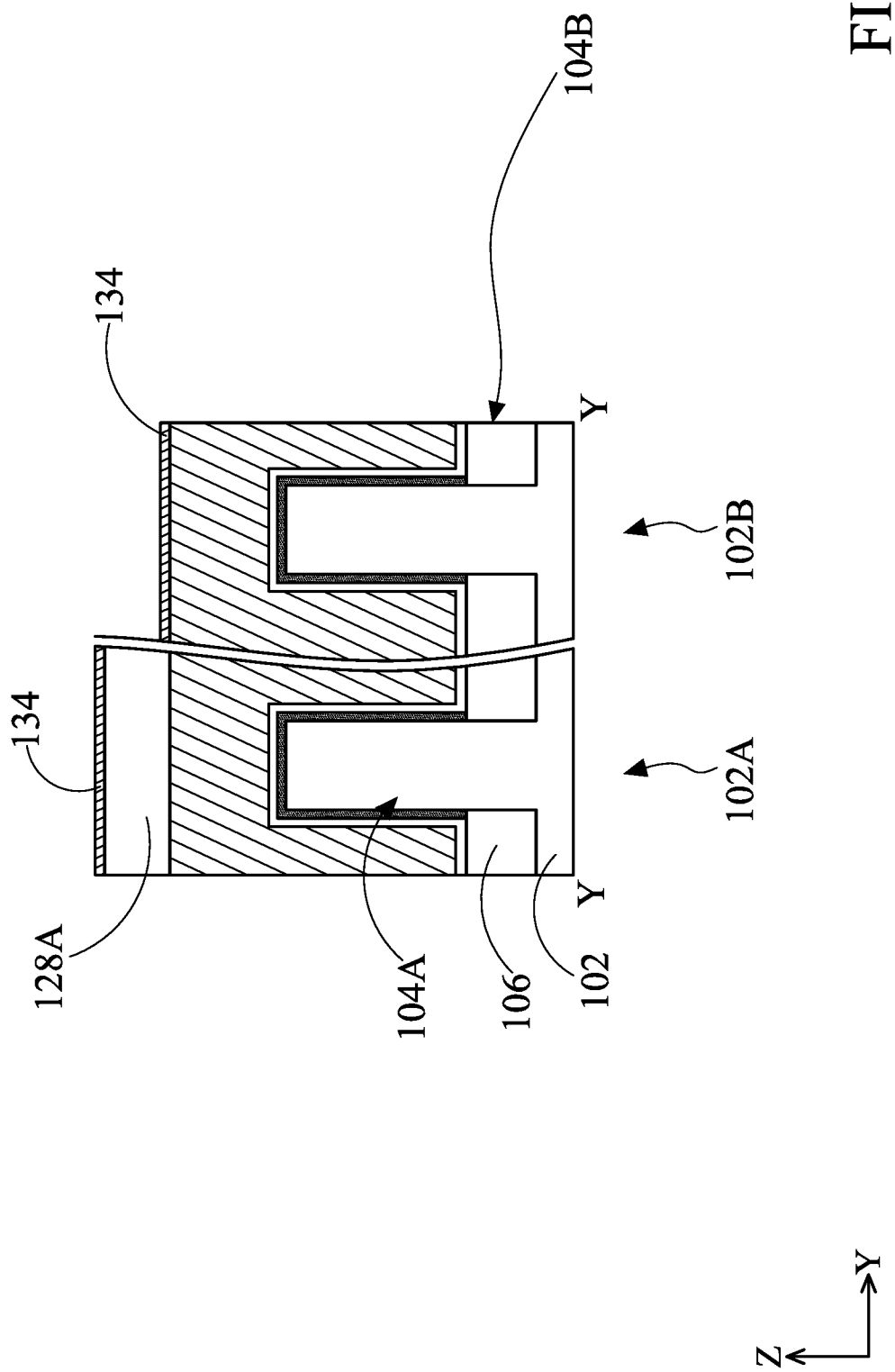

FIGS. 2F-1 and 2F-2 are cross-sectional views of a semiconductor device structure 11 after the formation of an electrode material 134, in accordance with some embodiments. A electrode material 134 is conformally formed along and covers the upper surface of the lower interlayer dielectric layer 116, the upper surfaces of the gate spacer layers 113, the upper surface of the first dielectric capping layer 128A, and the sidewalls and the bottom surface of the second recess 132B (i.e., the surface of the gate spacer layers 113, the metal gate electrode layer 124 and the high-k gate dielectric layer 122 exposed from the second recess 132B), as shown in FIGS. 2F-1 and 2F-2, in accordance with some embodiments. The electrode material 134 conforms to the profile of the second recess 132B and partially fills the second recess 132B, in accordance with some embodiments. In some embodiments, the electrode material 134 is made of TiN, TaN, W, Ru, another suitable electrode material, or a combination thereof. In some embodiments, the electrode material 134 is deposited using PVD, ALD, electroplating, or another suitable technique.

Figures 1, 2G:
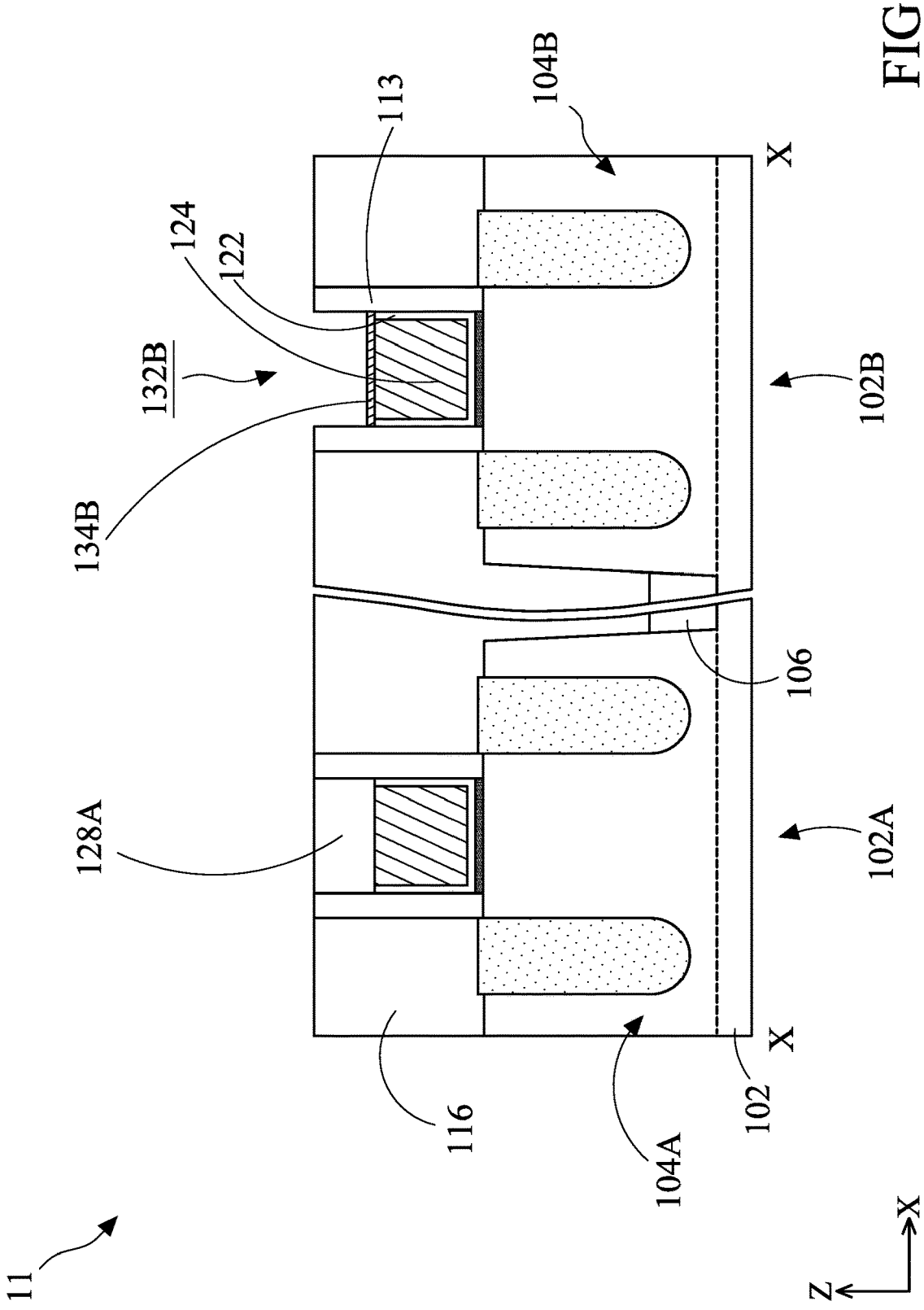
Figures 2, 2G:
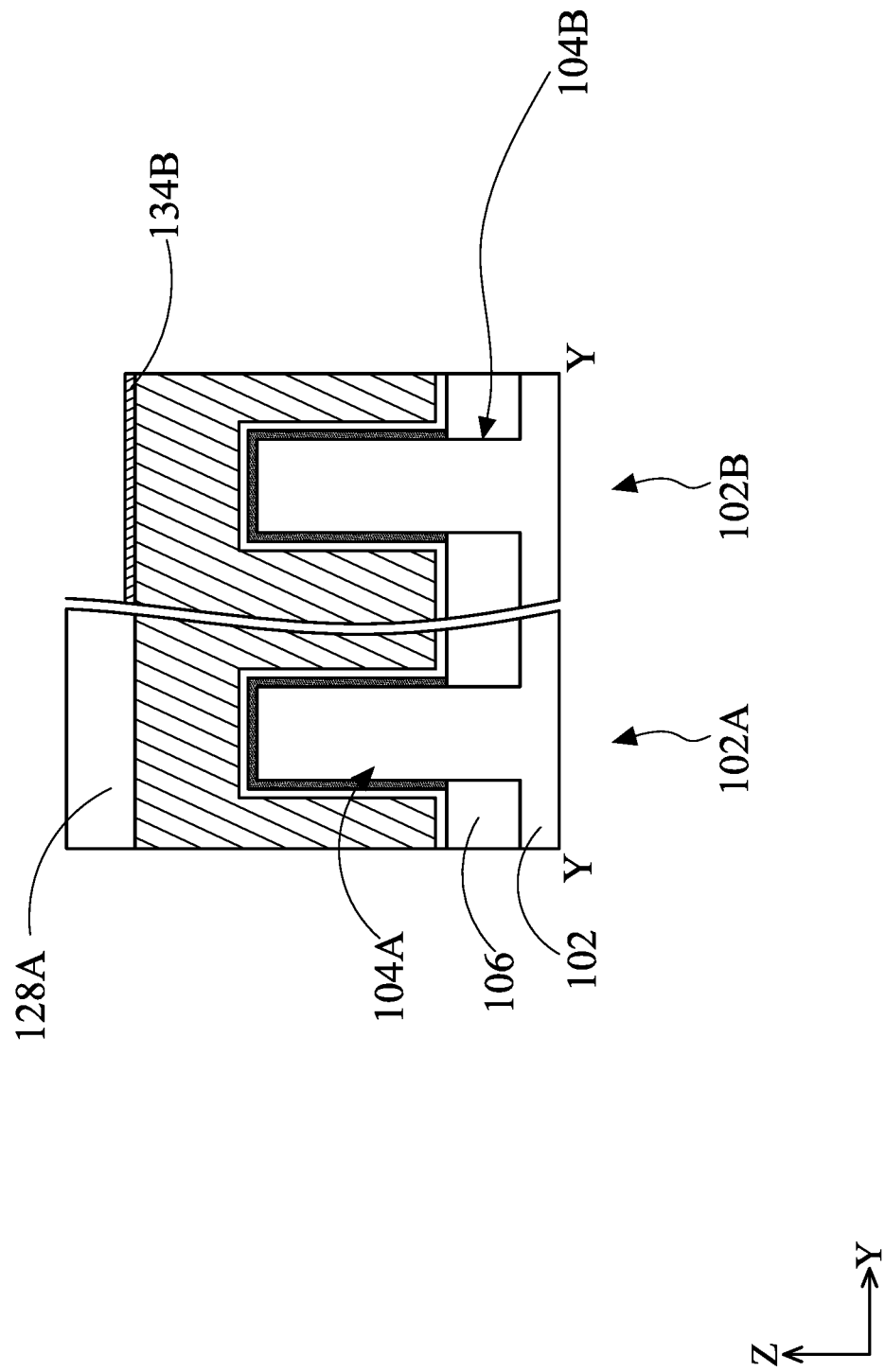

FIGS. 2G-1 and 2G-2 are cross-sectional views of a semiconductor device structure 11 after the formation of a bottom electrode layer 134B, in accordance with some embodiments. The portions of the electrode material 134 formed along the upper surface of the lower interlayer dielectric layer 116, the upper surfaces of the gate spacer layers 113, the upper surface of the first dielectric capping layer 128A are removed using such as CMP, in accordance with some embodiments. The portions of the electrode material 134 formed along the sidewalls of the second recess 132B are then removed using an etching back process, in accordance with some embodiments. A portion of the electrode material 134 remaining on the bottom surface of the second recess 132B forms a bottom electrode layer 134B for a capacitor above the transistor 180B, in accordance with some embodiments.

Figures 1, 2H:
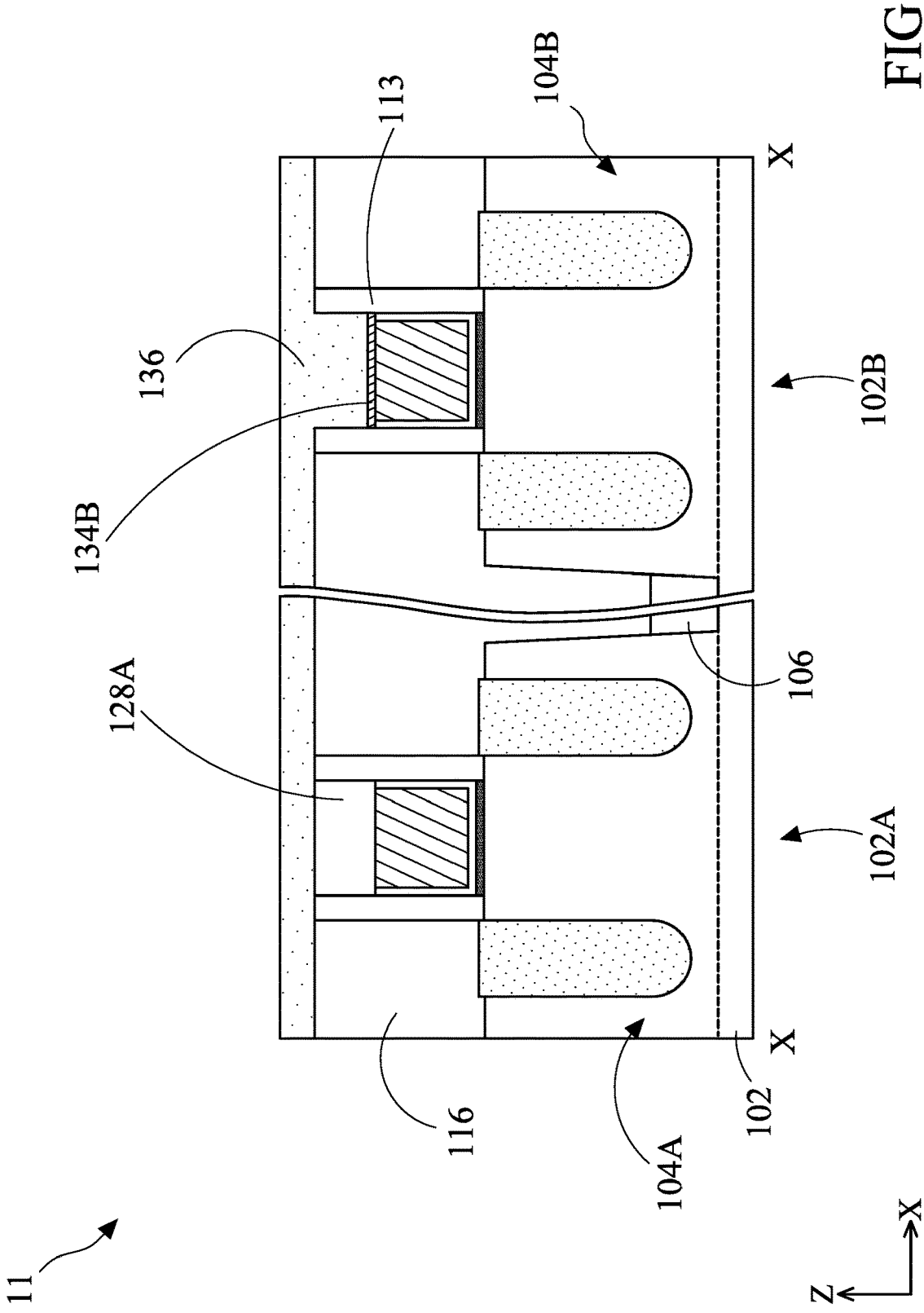
Figures 2, 2H:
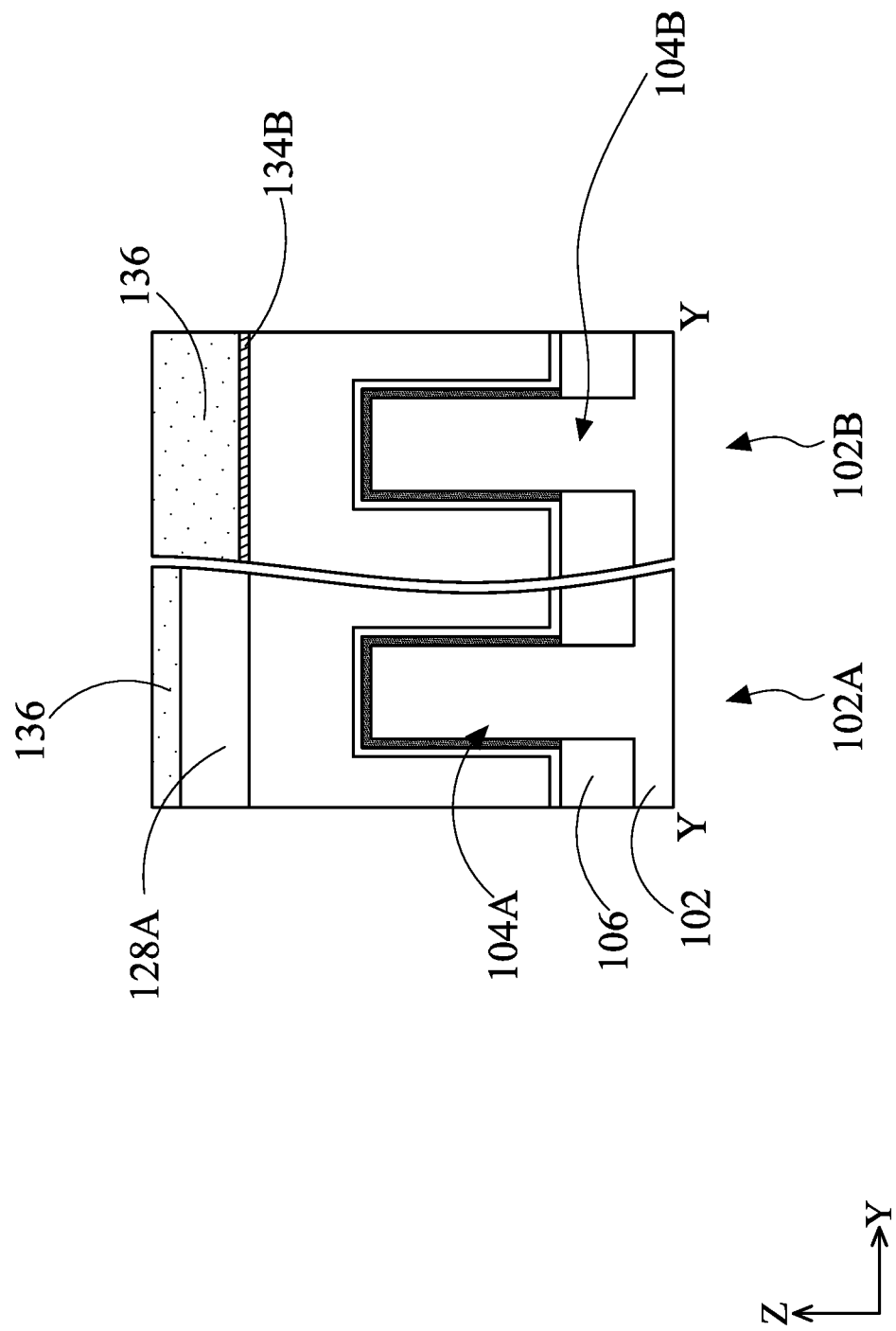

FIGS. 2H-1 and 2H-2 are cross-sectional views of a semiconductor device structure 11 after the formation of a ferroelectric material 136, in accordance with some embodiments. A ferroelectric material 136 is formed over the upper surfaces of the lower interlayer dielectric layer 116, the gate spacer layers 113, and the first dielectric capping layer 128A and fills the remainder of the second recess 132B, as shown in FIGS. 2H-1 and 2H-2, in accordance with some embodiments. In some embodiments, the ferroelectric material 136 is a non-linear dielectric material that can exhibit a hysteresis loop in accordance with an electric field caused by a dielectric polarization. A FeFET device comprising the ferroelectric material can be operable as a non-volatile memory device due to the dielectric polarization characteristics of the ferroelectric material. Namely, a ferroelectric material may be a material that exhibits electrically switchable polarization. In some embodiments, the ferroelectric material 136 is made of an Hf-based dielectric material, e.g., HfZrO, HfLaO, HfSiO, HfAlO, another suitable ferroelectric material, or a combination thereof. In some embodiments, the ferroelectric material 136 is deposited using CVD, ALD, PVD or another suitable technique.

Figures 1, 2I:
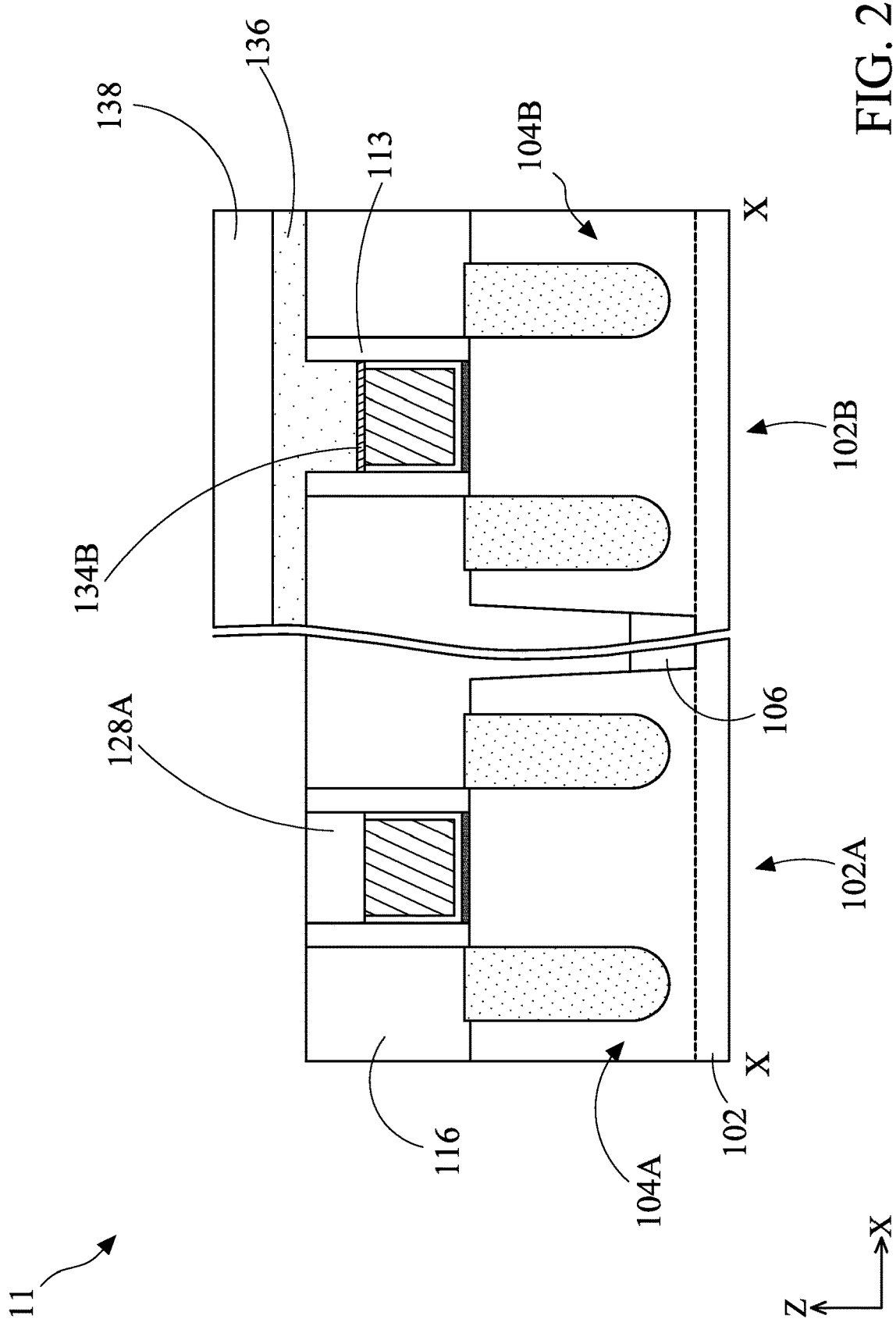
Figures 2, 2I:
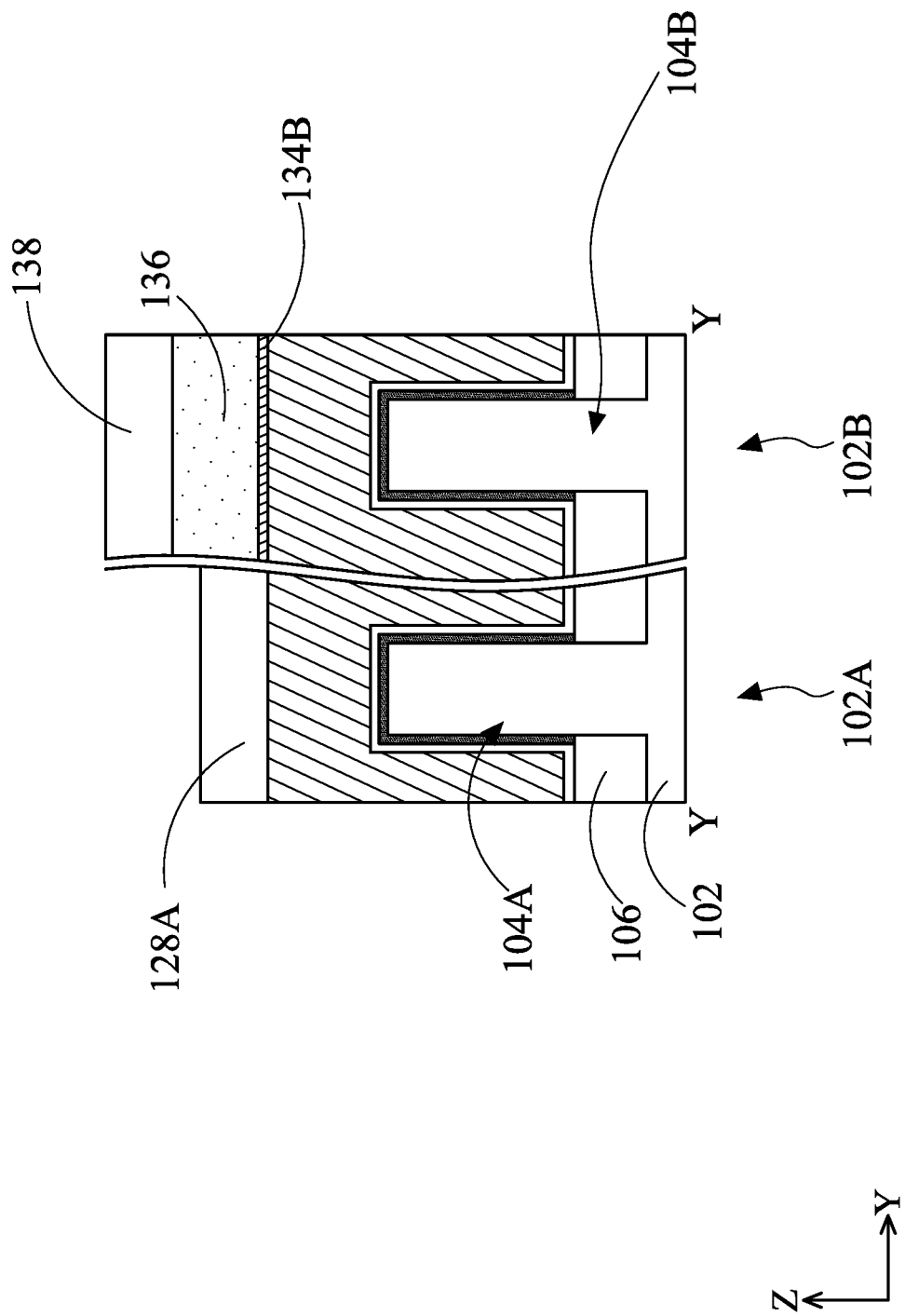

FIGS. 2I-1 and 2I-2 are cross-sectional views of a semiconductor device structure 11 after the removal of a portion of the ferroelectric material 136, in accordance with some embodiments. A mask element 138 is formed to cover the second region 102B of the semiconductor device structure 11, as shown in FIGS. 2I-1 and 2I-2, in accordance with some embodiments. The mask element 138 may be a patterned photoresist layer or a patterned hard mask layer. An etching process is performed on the semiconductor device structure 11 to remove a portion of the ferroelectric material 136 in the first region 102A, which is uncovered by the mask element 138, until the lower interlayer dielectric layer 116, the gate spacer layers 113 and the first dielectric capping layer 128A are exposed, in accordance with some embodiments. In some embodiments, the etching process is dry etching and/or wet etching. In some embodiments, the mask element 138 is removed using such as an ashing process after the etching process.

Figures 1, 2J:
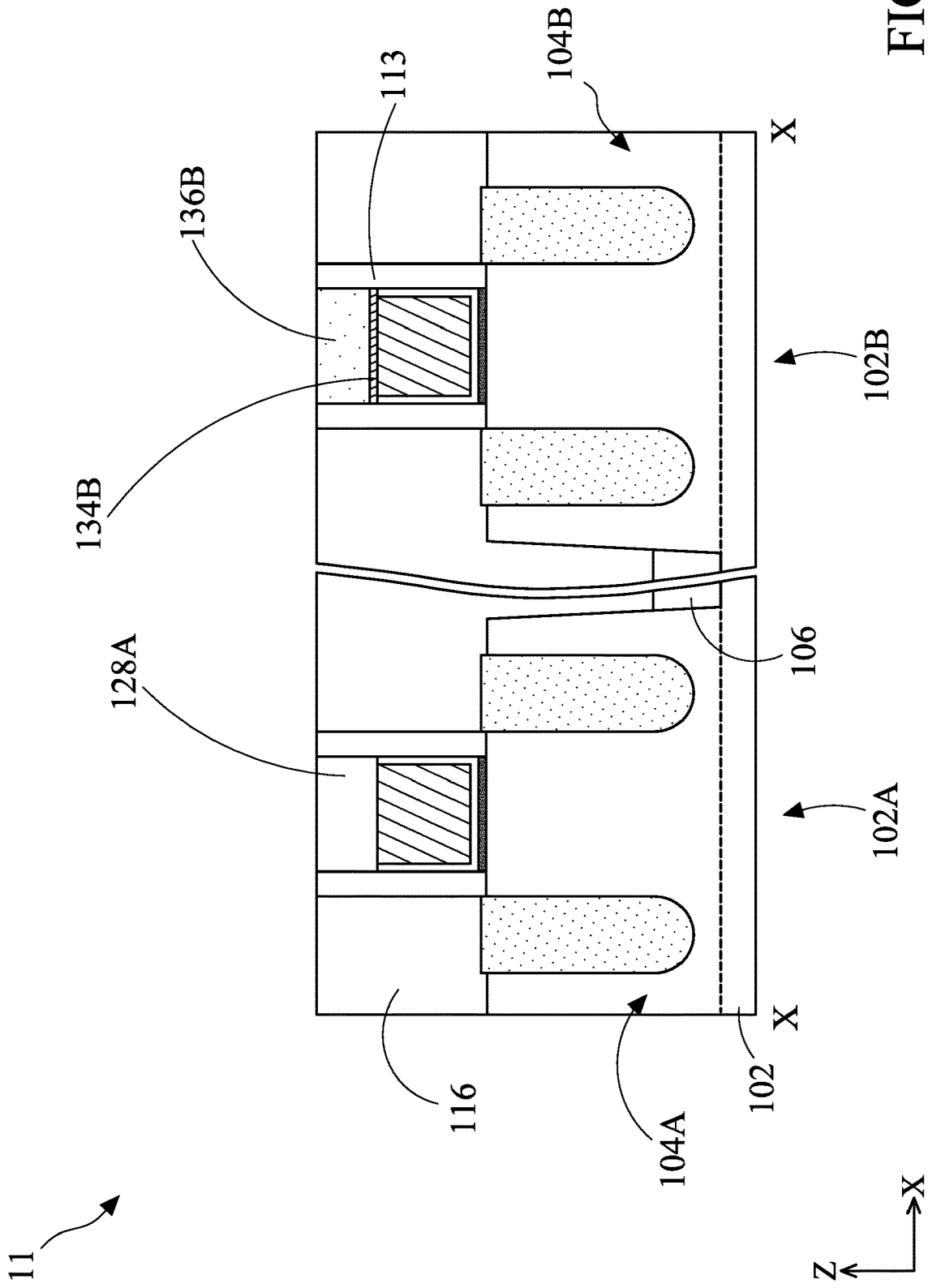
Figures 2, 2J:
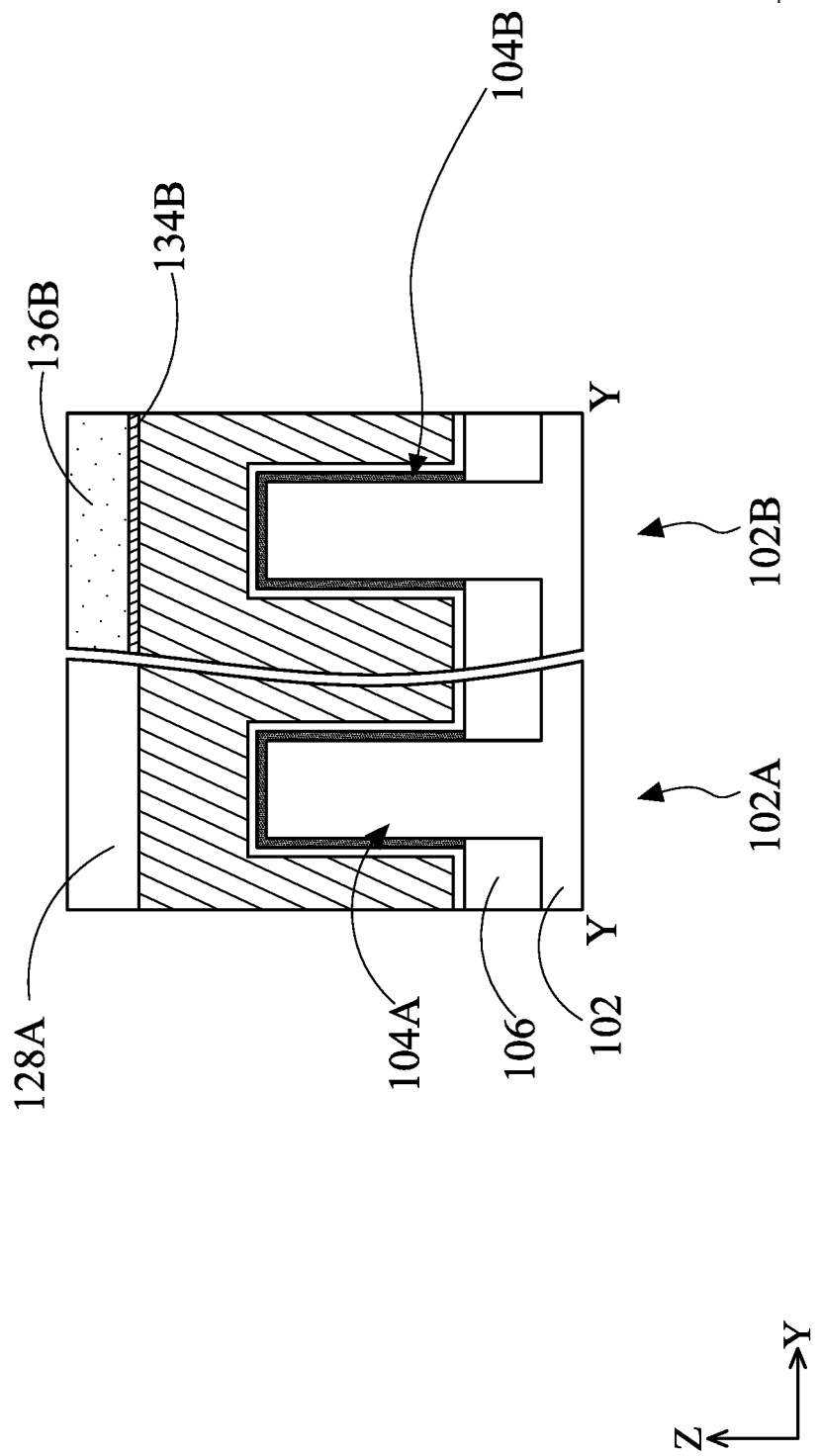

FIGS. 2J-1 and 2J-2 are cross-sectional views of a semiconductor device structure 11 after the formation of a ferroelectric layer 136B, in accordance with some embodiments. A portion of the ferroelectric material 136 above the upper surface of the lower interlayer dielectric layer 116 in the second region 102B is removed using such as CMP until the lower interlayer dielectric layer 116 and the gate spacer layers 113 are exposed, as shown in FIGS. 2J-1 and 2J-2, in accordance with some embodiments. A portion of the ferroelectric material 136 remaining in the second recess 132B forms a ferroelectric layer 136B for a capacitor above the transistor 180B, in accordance with some embodiments. In some embodiments, the ferroelectric layer 136B has a thickness in a range from about 5 nm to about 10 nm. An anneal process may be then performed to crystallize the ferroelectric layer 136B in the ferroelectric phase. For example, the anneal process may be performed with 600° C. to about 1200° C.

Afterward, a multilayer interconnect (MLI) structure is formed over the semiconductor device structure 11, in accordance with some embodiments. The multilayer interconnect structure electrically couples various devices (such as transistors, resistors, capacitors, and/or inductors) and/or the conductive features of the various devices (such as, electrode layer, source/drain region, and/or the gate), in accordance with some embodiments. In some embodiments, the multilayer interconnect structure includes a combination of dielectric layers and electrically conductive features, e.g., contact plugs, vias and/or metal lines.

Figures 1, 2K:
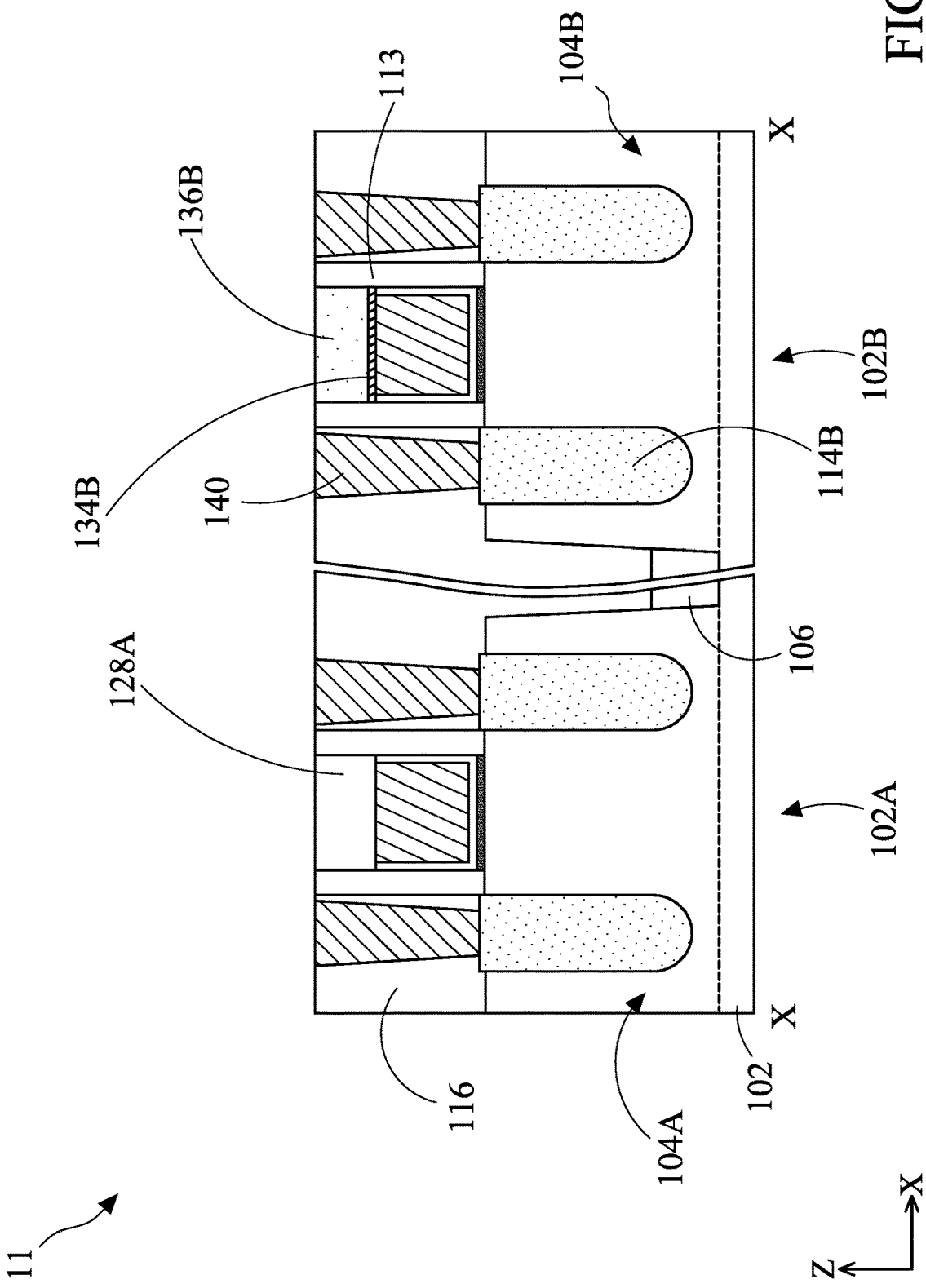
Figures 2, 2K:
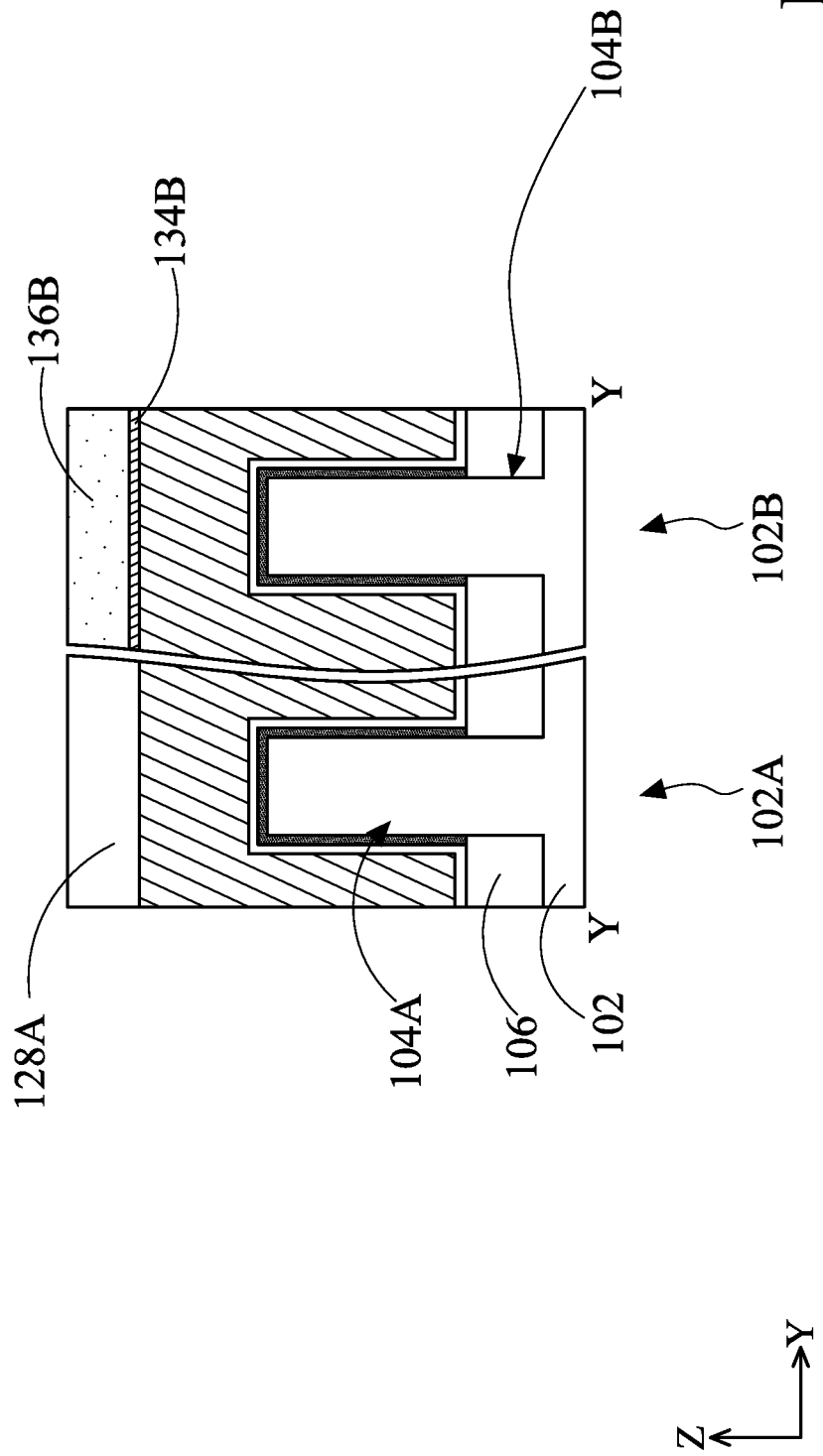

FIGS. 2K-1 and 2K-2 are cross-sectional views of a semiconductor device structure 11 after the formation of contact plugs 140, in accordance with some embodiments. Contact plugs 140 are formed through the lower interlayer dielectric layer 116 and land on the source/drain features 114A and 114B, as shown in FIGS. 2K-1 and 2K-2, in accordance with some embodiments. In some embodiments, the contact plugs 140 are made of one or more conductive materials, for example, cobalt (Co), nickel (Ni), tungsten (W), titanium (Ti), tantalum (Ta), copper (Cu), aluminum (Al), ruthenium (Ru), molybdenum (Mo), TiN, TaN, and/or a combination thereof.

In some embodiments, the formation of the contact plugs includes patterning the lower interlayer dielectric layer 116 to form contact openings (not shown) through the lower interlayer dielectric layer 116 and exposing the source/drain features 114A and 114B, depositing a conductive material for the contact plugs 140 to fill the contact openings, and removing the conductive material over the upper surface of the lower interlayer dielectric layer 116 using such as CMP. In some embodiments, the conductive material is deposited using PVD, ALD, CVD, e-beam evaporation, electroplating (ECP), electroless deposition (ELD), another suitable method, or a combination thereof. In some embodiments, the upper surface of the lower interlayer dielectric layer 116, the upper surfaces of the gate spacer layers 113, the upper surface of the first dielectric capping layer 128A, the upper surface of the ferroelectric layer 136B and the upper surfaces of the contact plugs 140 are substantially coplanar. In some embodiments, the contact plugs include a silicide layer, such as WSi, NiSi, TiSi or CoSi, formed on the surface of the source/drain features 114A and 114B exposed from the contact openings.

Figures 1, 2L:
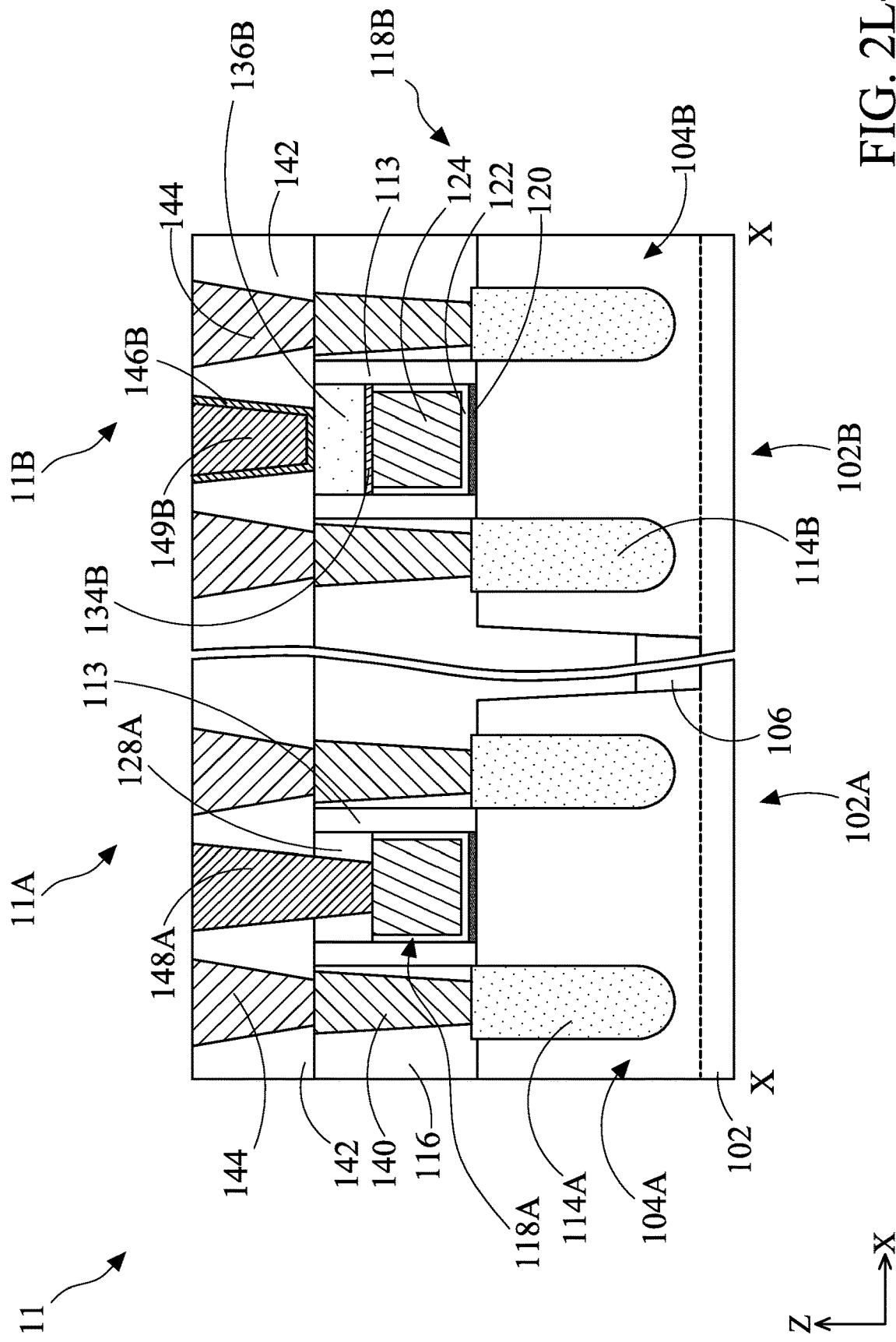
Figures 2, 2L:
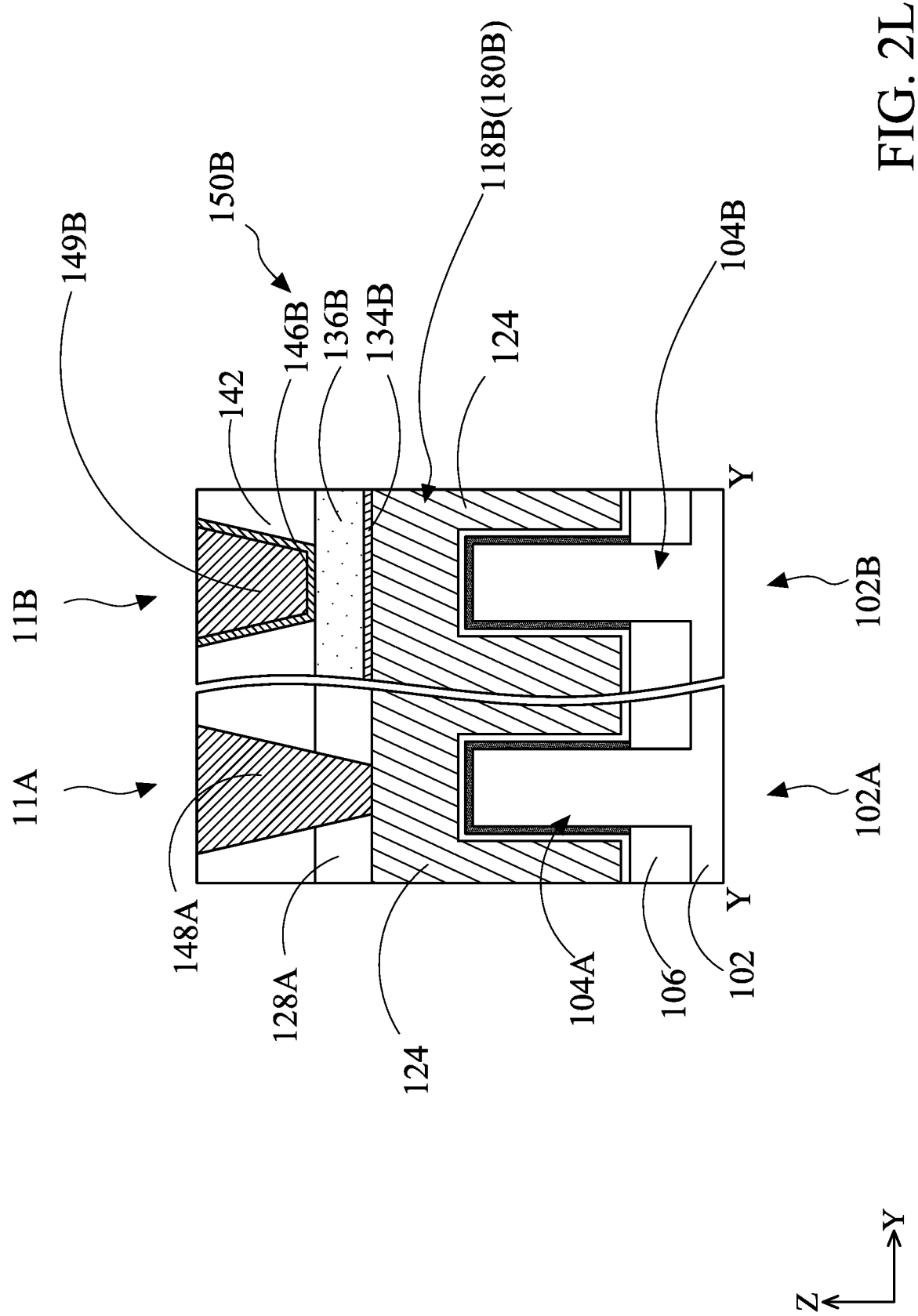

FIGS. 2L-1 and 2L-2 are cross-sectional views of a semiconductor device structure 11 after the formation of an upper interlayer dielectric layer 142, source/drain vias 144, an upper electrode layer 146B, a gate via 148A, and a capacitor via 149B, in accordance with some embodiments. An upper interlayer dielectric layer 142 is formed over the semiconductor device structure 11, as shown in FIGS. 2L-1 and 2L-2, in accordance with some embodiments. In some embodiments, the upper interlayer dielectric layer 142 is made of a dielectric material, such as USG, or doped silicon oxide such as BPSG, FSG, PSG, BSG, and/or another suitable dielectric material. In some embodiments, the upper interlayer dielectric layer 142 is formed using CVD (such as HDP-CVD, PECVD, or HARP), ALD, another suitable method, and/or a combination thereof. In some embodiments, the upper interlayer dielectric layer 142 is a multilayer structure. For example, the upper interlayer dielectric layer 142 may include a thin silicon nitride-based etching stop layer and a silicon oxide-based bulk layer formed over the etching stop layer.

Source/drain vias 144 are formed through the upper interlayer dielectric layer 142 and land on the contact plugs 140, as shown in FIGS. 2L-1 and 2L-2, in accordance with some embodiments. The source/drain vias 144 are electrically coupled to the source/drain features 114A and 114B, in accordance with some embodiments. A gate via 148A is formed through the upper interlayer dielectric layer 142 and the first dielectric capping layer 128A and land on the metal gate electrode layer 124 of the first final gate stack 118A, thereby forming a FinFET device 11A in the first region 102A of the substrate 102, as shown in FIGS. 2L-1 and 2L-2, in accordance with some embodiments. The gate via 148A is electrically coupled to the first final gate stack 118A, in accordance with some embodiments.

An upper electrode layer 146B and a capacitor via 149B nested within the upper electrode layer 146B are collectively formed through the upper interlayer dielectric layer 142 and land on the ferroelectric layer 136B, thereby forming a FeFET device 11B with FinFET design in the second region 102B of the substrate 102, as shown in FIGS. 2L-1 and 2L-2, in accordance with some embodiments. The upper electrode layer 146B has a U-shape profile defining a space where the capacitor via 149B is nested therein, in accordance with some embodiments. The upper electrode layer 146B, the ferroelectric layer 136B and the bottom electrode layer 134B combine to form a capacitor 150B above the transistor 180B, in accordance with some embodiments. The capacitor via 149B is electrically coupled to the capacitor 150B, in accordance with some embodiments. In some embodiments, the capacitor via 149B is short than the gate via 148A.

In some embodiments, the source/drain via 144, the gate via 148A and the capacitor via 149B are made of one or more conductive materials, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum, and/or a combination thereof. In some embodiments, the upper electrode layer 146B is made of metallic nitride such as TiN, TaN, WN, etc.

In some embodiments, a patterning process is performed on the semiconductor device structure 11 to form a via hole (not shown) for the upper electrode layer 146B and the capacitor via 149B through the upper interlayer dielectric layer 142 to the ferroelectric layer 136B. In some embodiments, an electrode material for the upper electrode layer 146B is conformally depositing along the upper surface of the upper interlayer dielectric layer 142 and the sidewalls and the bottom surface of the via hole, and a conductive material for the capacitor via 149B is deposited over the electrode material and fills the remainder of the via hole. The electrode material and the conductive material over the upper surface of the upper interlayer dielectric layer 142 are then removed by using such as CMP.

In some embodiments, a patterning process is performed on the semiconductor device structure 11 to form via holes (not shown) for the source/drain vias 144 through the upper interlayer dielectric layer 142 to the contact plugs 140 and a via hole (not shown) for the gate via 148A through the upper interlayer dielectric layer 142 and the first dielectric capping layer 128A to the metal gate electrode layer 124. A conductive material for the source/drain vias 144 and the gate via 148A is deposited over the upper interlayer dielectric layer 142 and fills the via holes. The conductive material over the upper surface of the upper interlayer dielectric layer 142 is then removed by using such as CMP. In addition, the dielectric capping layer 128A may be a different etching selectivity than adjacent dielectric layers (e.g., gate spacer layer 113), thereby improving the overlay window of the patterning process of forming the via hole for the gate via 148A.

The FinFET device 11A may be operable as a logic device, a periphery circuit device, or an SRAM device. The FeFET device 11B comprising the ferroelectric layer 136B may be operable as a FRAM device due to the dielectric polarization characteristics of the ferroelectric layer 136B. For example, during a write operation, one or more bias voltages can be applied to cause charge carriers (e.g., electrons and/or holes) to accumulate between the source/drain features 114B of the second transistor 180B. The charge carriers generate electric fields, which may extend through the ferroelectric layer 136B. The electric fields are configured to change positions of electric dipoles within the ferroelectric layer 136B depending on the bias voltages, in accordance with some embodiments. If the magnetic polarization of the ferroelectric layer 136B has a first polarization on a specific bias voltage, the FeFET device 11B will digitally store data as a first bit value (e.g., a logical "0"). Alternatively, if the magnetic polarization of the ferroelectric layer 136B has a second polarization on a different bias voltage from the former, the FeFET device 11B will digitally store data as a second bit value (e.g., a logical "1").

Other conductive features of the multilayer interconnect structure (such as vias and metal lines within an intermetal dielectric layer over the upper interlayer dielectric layer 142) may be formed over the semiconductor device structure 11 and electrically coupled to the conductive features of the FinFET device 11A and the FeFET device 11B. In some embodiments, the FinFET device 11A is operable to access and/or control the FeFET device 11B (e.g., to perform read/write/erase operations) through the multilayer interconnect structure.

The embodiments of the present disclosure provide a semiconductor device structure having a FeFET device with capacitor above transistor (CAT) design, where the capacitor 150B is formed directly above and electrically connected to the second final gate stack 118B. The FeFET device with CAT design may provide benefits, in some embodiments, one or more of: (1) an increase in the endurance and the retention of the FeFET due to Hf-based ferroelectric layer may be annealed to reduce the depolarization field, (2) a lower power consumption due to the capacitor is immediately above and coupled to the gate stack, and/or (3) a simple fabrication process in which a relatively small number of lithography processes is used to replace the dielectric capping layer into the ferroelectric layer of the capacitor.

Figure 3:
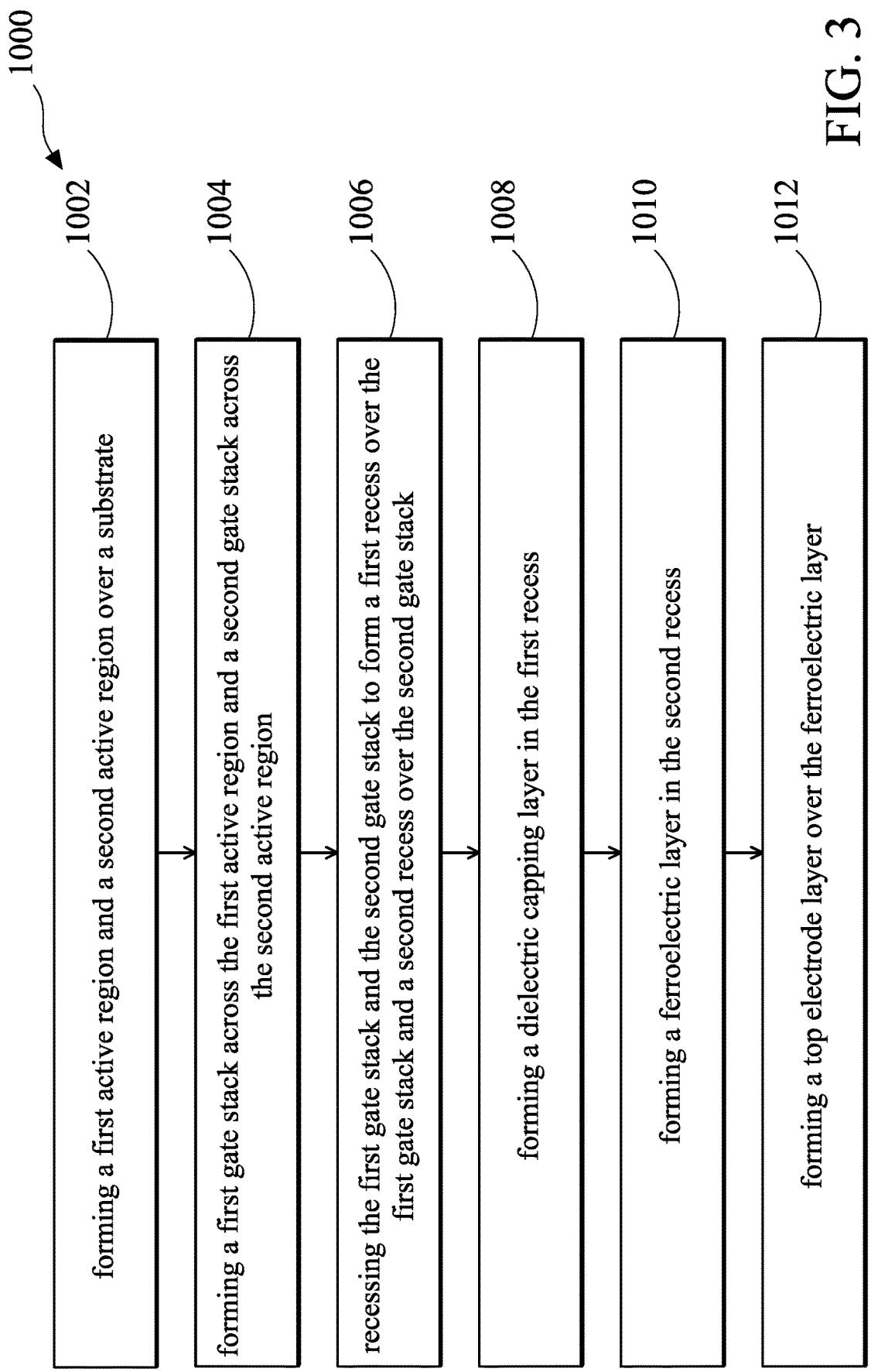
FIG. 3 is a flowchart of a method for forming a semiconductor device structure, in accordance with some embodiments of the disclosure.

FIG. 3 is a flowchart of a method 1000 for forming a semiconductor device structure, in accordance with some embodiments of the disclosure. The method 1000 is used to form the semiconductor device structure 11 as described above, in accordance with some embodiments. In operation 1002, a first fin structure 104A and a second fin structure 104B, which are used as active regions, are formed, as shown in FIG. 1, in accordance with some embodiments. In operation 1004, a first final gate stack 118A is formed across the first fin structure 104A and a second final gate stack 118B is formed across the second fin structure 104B, as shown in FIGS. 2B-1 and 2B-2, in accordance with some embodiments. The first final gate stack 118A and the second final gate stack 118B are recessed to form a first recess 126A over the first final gate stack 118A and a second recess 126B over the second final gate stack 118B, as shown in FIGS. 2C-1 and 2C-2, in accordance with some embodiments. A first dielectric capping layer 128A is formed in the first recess 126A, as shown in FIGS. 2D-1 and 2D-2, in accordance with some embodiments. A ferroelectric layer 136B is formed in the second recess 132B (i.e., original second recess 126B), as shown in FIGS. 2E-1 through 2J-2, in accordance with some embodiments. A top electrode layer 146B is formed over the ferroelectric layer 136B, as shown in FIGS. 2L-1 and 2L-2, in accordance with some embodiments.

FIGS. 4-1 and 4-2 are cross-sectional views of a semiconductor device structure 12 with FinFET design, in accordance with some embodiments. FIG. 4-1 is a cross-sectional view in the second region 102B corresponding to cross-section X-X of FIG. 1 and FIG. 4-2 is a cross-sectional view in the second region 102B corresponding to cross-section Y-Y of FIG. 1. The semiconductor device structure 12 of FIGS. 4-1 and 4-2 is similar to the semiconductor device structure 11 of FIGS. 2L-1 and 2L-2 except for the bottom electrode layer not formed between the ferroelectric layer 136B and the second final gate stack 118B, in accordance with some embodiments. The steps described above with respect to FIGS. 2F-1 through 2G-2 may be omitted, and the ferroelectric layer 136B is formed in direct contact with the second final gate stack 118B, thereby forming a FeFET device 12B in the second region 102B of the substrate 102, in accordance with some embodiments. The metal gate electrode layer 124 of the second final gate stack 118B is used as the bottom electrode layer of the capacitor 150B, in accordance with some embodiments.

Figure 5A:
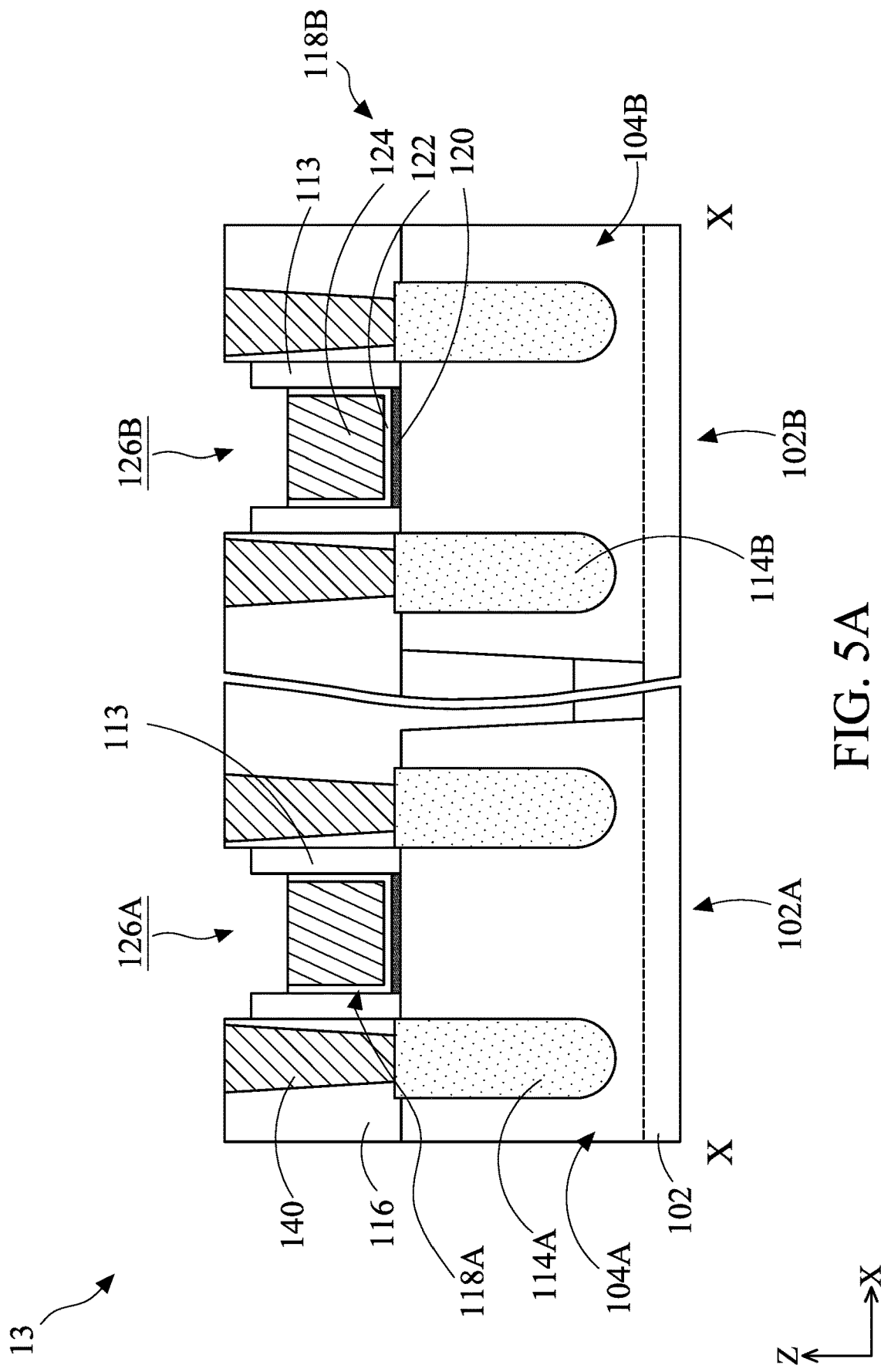
FIGS. 5A and 5B are cross-sectional views illustrating the formation of a semiconductor device structure with FinFET design at various intermediate stages, in accordance with some embodiments of the disclosure.
Figure 5B:
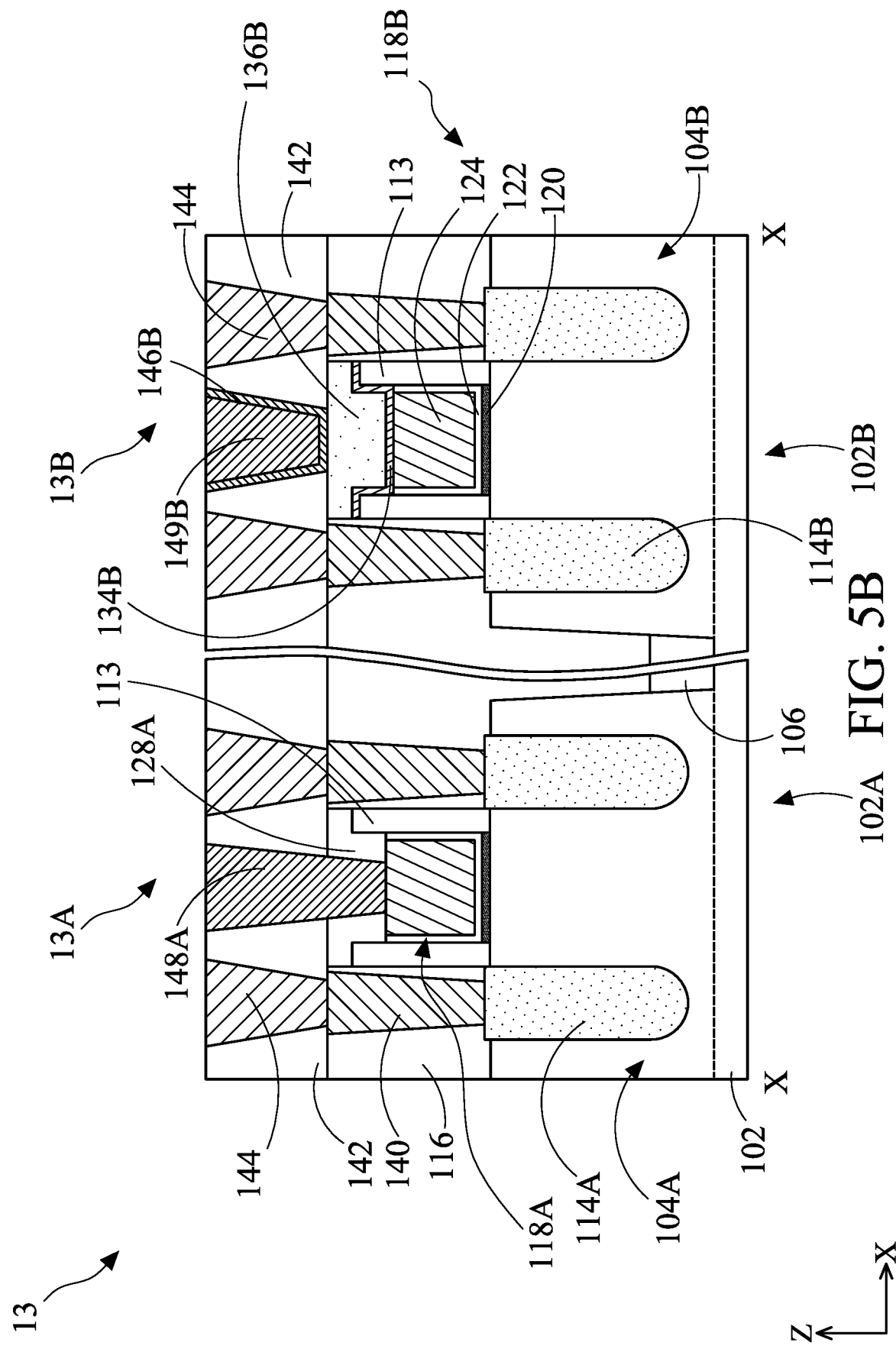

FIGS. 5A and 5B are cross-sectional views illustrating the formation of a semiconductor device structure 13 with FinFET design at various intermediate stages, in accordance with some embodiments. FIGS. 5A and 5B are cross-sectional views corresponding to cross-section X-X of FIG. 1. The semiconductor device structure 13 of FIG. 5B is similar to the semiconductor device structure 11 of FIG. 2L-1 except that the first dielectric capping layer 128A covers the upper surface of the gate spacer layers 113 and the ferroelectric layer 136B covers the upper surface of the gate spacer layers 113, in accordance with some embodiments.

Continuing from FIG. 2C-1, the gate spacer layers 113 are also recessed while the final gate stacks 118A and 118B are being recessed, in accordance with some embodiments, as shown in FIG. 5A. In some embodiments, the etching rate of the gate spacer layers 113 is lower than the etching rate of the metal electrode layers 124 and the etching rate of the high-k gate dielectric layer 122, and as a result, the recessed gate spacer layers 113 are higher than the recessed final gate stacks 118A and 118B. The first recesses 126A is formed over the gate spacer layers 113 and the first final gate stack 118A within the lower interlayer dielectric layer 116 and the second recess 126B is formed over the gate spacer layers 113 and the second final gate stack 118B and within the lower interlayer dielectric layer 116, in accordance with some embodiments.

The steps described above with respect to FIGS. 2D-1 through 2L-2 are performed on the semiconductor device structure 13 of FIG. 5A to form a FinFET device 13A and a FeFET device 13B, in accordance with some embodiments. As a result, the first dielectric capping layer 128A includes a lower portion between the gate spacer layers 113 and an upper portion over the upper surfaces of the gate spacer layers 113, and the upper portion of the first dielectric capping layer 128A is wider than the lower portion of the first dielectric capping layer 128A, in accordance with some embodiments. Similarly, the ferroelectric layer 136B includes a lower portion between the gate spacer layers 113 and an upper portion over the upper surfaces of the gate spacer layers 113, and the upper portion of the ferroelectric layer 136B is wider than the lower portion of the ferroelectric layer 136B, in accordance with some embodiments.

Figures 1, 2, 6D:
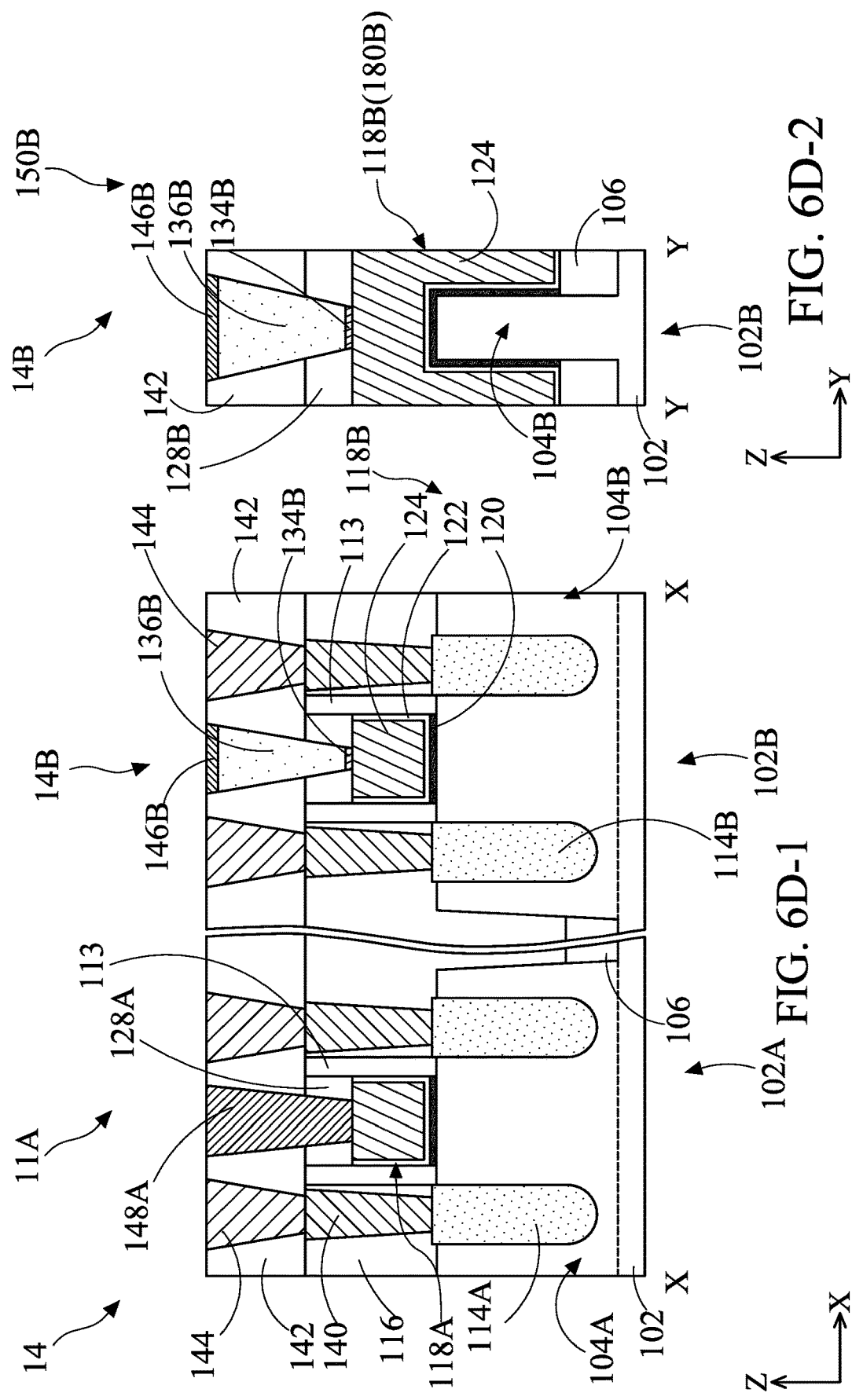

FIGS. 6A-1 through 6D-2 are cross-sectional views illustrating the formation of a semiconductor device structure 14 with FinFET design at various intermediate stages, in accordance with some embodiments. FIGS. 6A-1, 6B-1, 6C-1 and 6D-1 are cross-sectional views corresponding to cross-section X-X of FIG. 1 and FIGS. 6A-2, 6B-2, 6C-2 and 6D-2 are cross-sectional views in the second region 102B corresponding to cross-section Y-Y of FIG. 1. The semiconductor device structure 14 of FIGS. 6D-1 and 6D-2 is similar to the semiconductor device structure 11 of FIGS. 2L-1 and 2L-2 except that a capacitor 150B that includes a bottom electrode layer 134B, a ferroelectric layer 136B, and a top electrode layer 146B is formed in a via hole, in accordance with some embodiments.

The steps of FIGS. 2E-1 through 2J-2 are omitted, and the second dielectric capping layer 128B remains on the second final gate stack 118B, as shown in FIGS. 6A-1 and 6A-2, in accordance with some embodiments. A patterning process is performed on the semiconductor device structure 14 to form a via hole 152B through the upper interlayer dielectric layer 142 and the second dielectric capping layer 128B to the metal gate electrode layer 124 of the second final gate stack 118B, as shown in FIGS. 6B-1 and 6B-2, in accordance with some embodiments. The patterning process may include forming a patterned mask layer over the upper interlayer dielectric layer 142 and etching the upper interlayer dielectric layer 142 and the second dielectric capping layer 128B uncovered by the patterned mask layer until the metal gate electrode 124 is exposed.

A bottom electrode layer 134B is formed at the bottom of the via hole 152B, as shown in FIGS. 6C-1 and 6C-2, in accordance with some embodiments. The bottom electrode layer 134B may be formed using a deposition process, a CMP process and an etching back process. A ferroelectric layer 136B is formed over the bottom electrode layer 134B to fill the remainder of the via hole 152B, as shown in FIGS. 6D-1 and 6D-2, in accordance with some embodiments. The ferroelectric layer 136B may be formed using a deposition process and a CMP process. Afterward, the ferroelectric layer 136B is etched back to form a recess and a top electrode layer 146B is formed to fill the recess over the ferroelectric layer 136B, thereby forming a FeFET device 14B, as shown in FIGS. 6D-1 and 6D-2, in accordance with some embodiments. The top electrode layer 146B may be formed using a deposition process and a CMP process.

The top electrode layer 146B, the ferroelectric layer 136B, and the bottom electrode layer 134B combine to form a capacitor 150B, which is formed in the via hole 152B and passes through the upper interlayer dielectric layer 142 and the second dielectric capping layer 128B to the second final gate stack 118B, in accordance with some embodiments. As such, the sidewall of the top electrode layer 146B, the sidewall of the ferroelectric layer 136B, and the sidewall of the bottom electrode layer 134B share a continuous surface (i.e., the sidewall of the via hole 152B), in accordance with some embodiments. In some embodiments, the upper surface of the top electrode layer 146B, the upper surface of the vias 144 and 148A are substantially coplanar. In some embodiments, the height of the capacitor 150B is substantially equal to the height of the gate via 148A.

FIGS. 7A-1 through 7B-2 are cross-sectional views illustrating the formation of a semiconductor device structure 15 with FinFET design at various intermediate stages, in accordance with some embodiments of the disclosure. FIGS. 7A-1 and 7B-1 are cross-sectional views corresponding to cross-section X-X of FIG. 1 and FIGS. 7A-2 and 7B-2 are cross-sectional views in the second region 102B corresponding to cross-section Y-Y of FIG. 1. The semiconductor device structure 15 of FIGS. 7B-1 and 7B-2 is similar to the semiconductor device structure 14 of FIGS. 6D-1 and 6D-2 except that a capacitor via 149B and a capacitor 150B are formed in the same via hole, in accordance with some embodiments.

The ferroelectric layer 136B is etched back to a greater depth than the depth shown in FIGS. 6D-1 and 6D-2 and the top electrode layer 146B is formed over the ferroelectric layer 136B to partially fill the recess (i.e., the via hole 152B), in accordance with some embodiments. A capacitor via 149B is formed to fill a remainder of the via holes 152B, thereby forming a FeFET device 15B, in accordance with some embodiments. In some embodiments, the sidewall of the capacitor via 149B and the sidewall of the capacitor 150B including the top electrode layer 146B, the ferroelectric layer 136B and the bottom electrode layer 134B share a continuous surface (i.e., the sidewall of the via hole 152B). In some embodiments, the capacitor via 149B is shorter than the gate via 148A.

Figure 8:
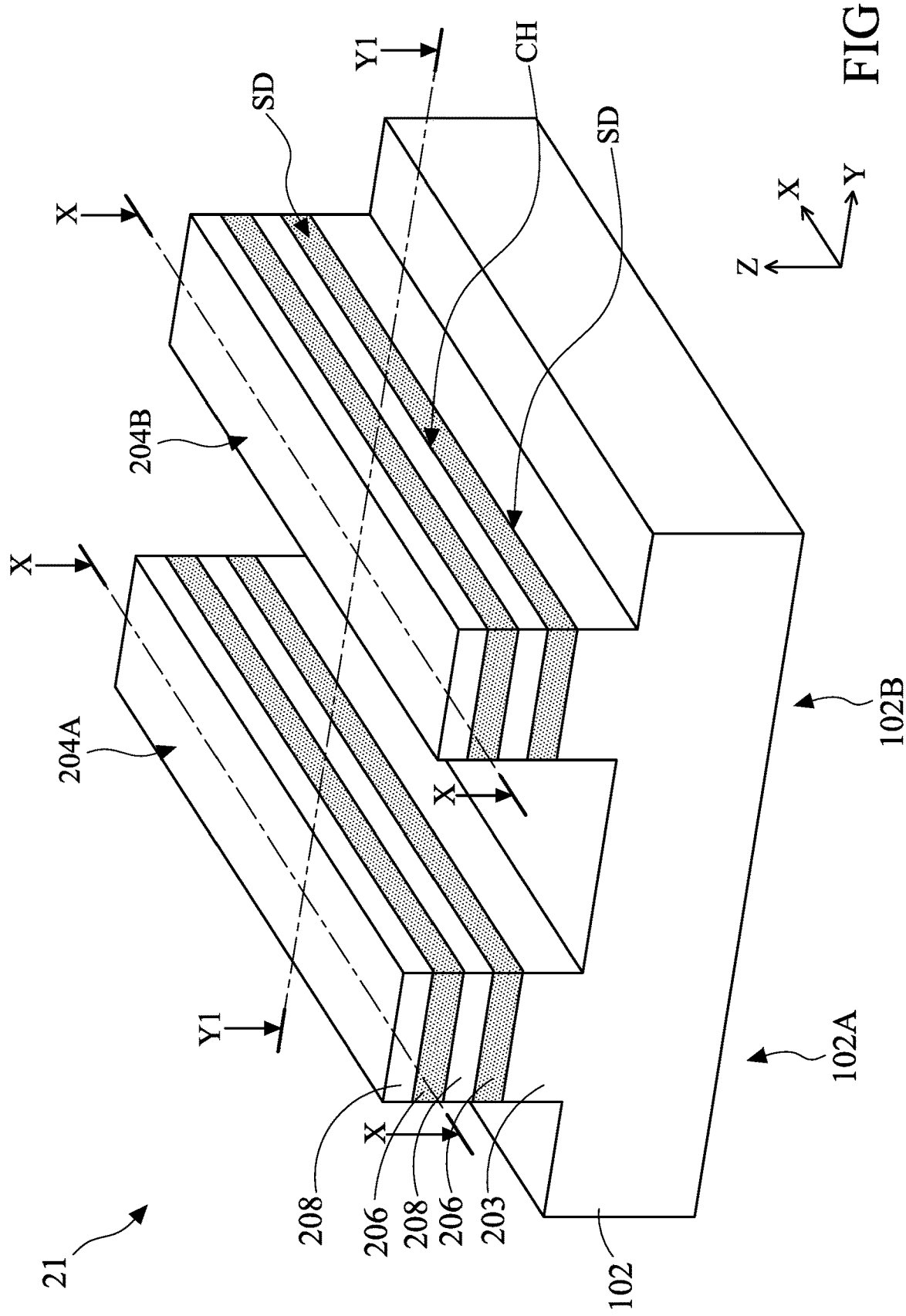
FIG. 8 is a perspective view of a semiconductor device structure with gate-all-around (GAA) design, in accordance with some embodiments of the disclosure.

Although the embodiments described above are used in the semiconductor device structure with FinFET design, the concept of the embodiments may be also used in a semiconductor device structure with GAA design. FIG. 8 is a perspective view of a semiconductor device structure 21 with GAA design, in accordance with some embodiments of the disclosure. FIGS. 9A-1 through 9D-2 are cross-sectional views illustrating the formation of the semiconductor device structure 21 with GAA design at various intermediate stages, in accordance with some embodiments of the disclosure. FIGS. 9A-1, 9B-1, 9C-1 and 9D-1 are cross-sectional views corresponding to cross-section X-X of FIG. 8 and FIGS. 9A-2, 9B-2, 9C-2 and 9D-2 are cross-sectional views corresponding to cross-section Y-Y of FIG. 8. The method 1000 of FIG. 3 may also be used to form the semiconductor device structure 21, in accordance with some embodiments. Note that the same or similar elements or layers of the semiconductor device structure 21 corresponding to those of the semiconductor device structure 11 shown in FIGS. 1 through 2L-2 are denoted by like reference numerals. The same or similar elements or layers denoted by like reference numerals have the same meaning and will not be repeated for the sake of brevity.

A semiconductor device structure 21 is provided, as shown in FIG. 8, in accordance with some embodiments. The semiconductor device structure 21 includes a substrate 102 and a first fin structure 204A over a first region 102A of the substrate 102 and a second fin structure 204B formed over a second region 102B of the substrate 102, in accordance with some embodiments.

The fin structures 204A and 204B extend in the X direction, in accordance with some embodiments. That is, the fin structures 204A and 204B each have a longitudinal axis parallel to X direction, in accordance with some embodiments. Each of the fin structures 204A and 204B includes a channel region CH and source/drain regions SD, where the channel region CH is defined between the source/drain regions SD, in accordance with some embodiments. Final gate stacks (not shown) will be formed with a longitudinal axis parallel to Y direction and extending across the channel regions CH of the fin structures 204A and 204B.

The fin structures 204A and 204B each include a lower fin element 203 formed from a portion of the substrate 102 and an upper fin element formed from a semiconductor stack, which includes first semiconductor layers 206 and second semiconductor layers 208 alternately stacked over the lower fin element 203, in accordance with some embodiments. It is noted that two layers of each of the first semiconductor layers 206 and the second semiconductor layers 208 are illustrated in FIG. 8, and this is for illustrative purpose and not intended to be limiting beyond what is specifically recited in the claims. It can be appreciated that any number of semiconductor layers can be formed in the stack; the number of layers depending on the desired number of channels regions for the GAA transistor.

As explained in detail below, the first semiconductor layers 206 of the fin structures 204A and 204B will be removed and the second semiconductor layers 208 of the fin structures 204A and 204B form nanostructures (e.g., nanowire or nanosheet structures) that laterally extend between source/drain regions and serve as the channel layers for the resulting transistors such as gate-all-around transistors, in accordance with some embodiments. As the term is used herein, "nanostructures" refers to semiconductor layers that have cylindrical shape, bar shaped and/or sheet shape. Final gate stacks (not shown) will be formed across and wrap around the nanostructures, in accordance with some embodiments.

In some embodiments, the formation of the fin structures 204A and 204B includes forming a semiconductor stack including a first semiconductor material for the first semiconductor layers 206 and a second semiconductor material for the second semiconductor layers 208 over the substrate 102.

The first semiconductor material for the first semiconductor layers 206 has a different lattice constant than the second semiconductor material for the second semiconductor layers 208, in accordance with some embodiments. In some embodiments, the first semiconductor layers 206 are made of SiGe, where the percentage of germanium (Ge) in the SiGe is in a range from about 20 atomic % to about 50 atomic %, and the second semiconductor layers 208 are made of silicon. In some embodiments, the first semiconductor layers 206 are $Si_{1-x}Ge_x$, where x is more than about 0.3, or Ge (x=1.0) and the second semiconductor layers 108 are Si or $Si_{1-y}Ge_y$, where y is less than about 0.4, and x>y. In some embodiments, the first semiconductor material and the second semiconductor material are alternatingly formed using an epitaxial growth process such as MBE, MOCVD, or VPE, or another suitable technique. In some embodiments, the first semiconductor layers 206 and the second semiconductor layers 208 have different oxidation rates and/or etch selectivity.

In some embodiments, the thickness of each of the first semiconductor layers 206 is in a range from about 1.5 nanometers (nm) to about 20 nm. In some embodiments, the first semiconductor layers 206 are substantially uniform in thickness. In some embodiments, the thickness of each of the second semiconductor layers 208 is in a range from about 1.5 nm to about 20 nm. In some embodiments, the second semiconductor layers 208 are substantially uniform in thickness.

Afterward, the semiconductor stack including the first semiconductor material and the second semiconductor material and the underlying substrate 102 are patterned into the fin structures 204A and 204B. In some embodiments, the patterning process includes forming a patterned hard mask layer (not shown) over the semiconductor stack, and etching the semiconductor stack and the substrate 102 uncovered by the patterned hard mask layer to form trenches and the fin structures 204A and 204B protruding between from the trenches. In some embodiments, after the etching process, the substrate 102 has portions which protrude from between the trenches to form the lower fin elements 203 of the fin structures 204A and 204B. In some embodiments, the remainders of the semiconductor stack directly above the lower fin elements 203 form the upper fin elements of the fin structures 204A and 204B. The fin structures 204A and 204B are active regions of the semiconductor device structure 21, which are to be formed into channel regions and source/drain regions of transistors, e.g., gate-all-around FETs (GAA FETs), in accordance with some embodiments.

Figures 1, 9A:
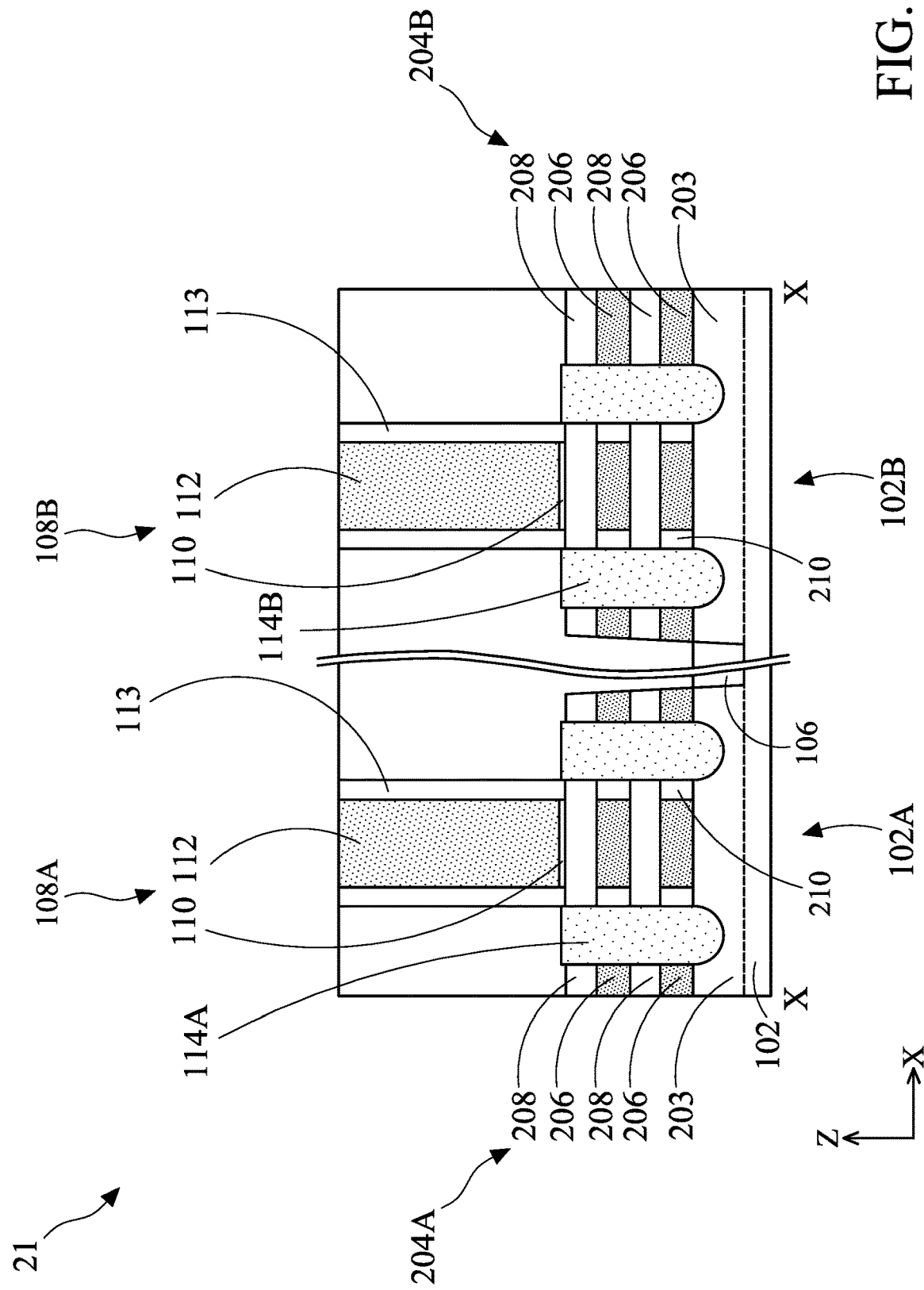
Figures 2, 9A:
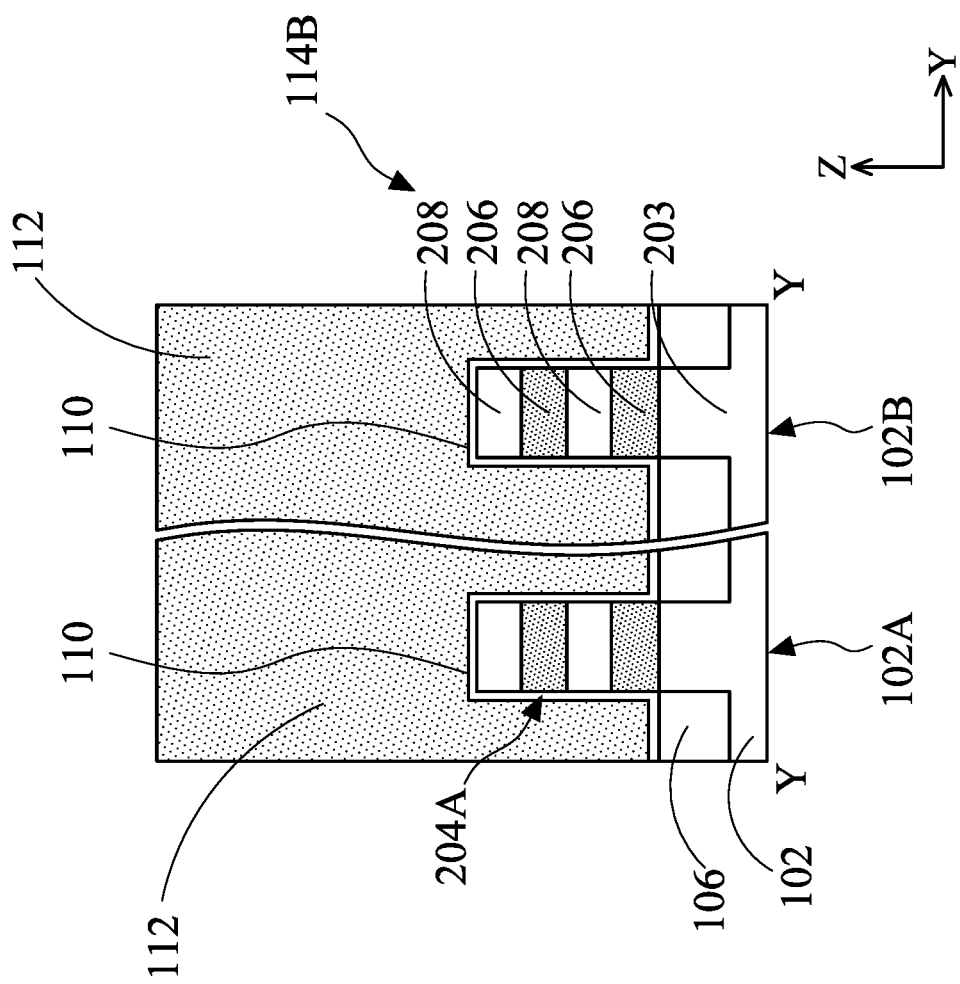

FIGS. 9A-1 and 9A-2 are cross-sectional views of a semiconductor device structure 21 after the formation of an isolation feature 106, dummy gate structures 108A and 108B, gate spacer layers 113, source/drain features 114A and 114B, inner spacer layers 210 and a lower interlayer dielectric layer 116, in accordance with some embodiments. An isolation feature 106 is formed over the substrate 102 and surrounds lower fin elements 203 of the fin structures 204A and 204B, as shown in FIGS. 9A-1 and 9A-2, in accordance with some embodiments. A first dummy gate structure 108A is formed across the channel region of the first fin structure 204A and a second dummy gate structure 108B is formed across the channel region of the second fin structure 204B, in accordance with some embodiments. Gate spacer layers 113 are formed along and cover opposite sidewalls of the dummy gate structures 108A and 108B, in accordance with some embodiments.

After the source/drain recesses (not shown) for the source/drain features 114A and 114B are formed, the first semiconductor layers 206 are laterally recessed toward the channel region, thereby forming notches (not shown) between adjacent second semiconductor layers 208 and between the lowermost second semiconductor layer 208 and the lower fin element 203, in accordance with some embodiments. Inner spacer layers 210 are formed in the notches and the source/drain features 114A and 114B are then formed from the source/drain recesses, in accordance with some embodiments.

The notches may be formed using a selective etching process caused by the different etching rates between the first semiconductor layers 206 and the second semiconductor layers 208. In some embodiments, the inner spacer layers 210 are made of a dielectric material, such as silicon oxycarbide (SiOC), silicon oxide carbonitride (SiOCN), silicon carbon nitride (SiCN), and/or a combination thereof, in accordance with some embodiments. In some embodiments, the inner spacer layers 210 are formed using a deposition process followed by an etching process. In some embodiments, the deposition process includes ALD, CVD (such as PECVD or LPCVD), another suitable technique, and/or a combination thereof. In some embodiments, the etching process includes a plasma dry etching, a dry chemical etching, and/or a wet etching. The Inner spacer layers 210 are aligned below the gate spacer layers 113, in accordance with some embodiments. The inner spacer layers 210 are configured to reduce the parasitic capacitance between the subsequently formed final gate stack and the source/drain features (i.e. Cgs and Cgd), in accordance with some embodiments.

Figures 1, 9B:
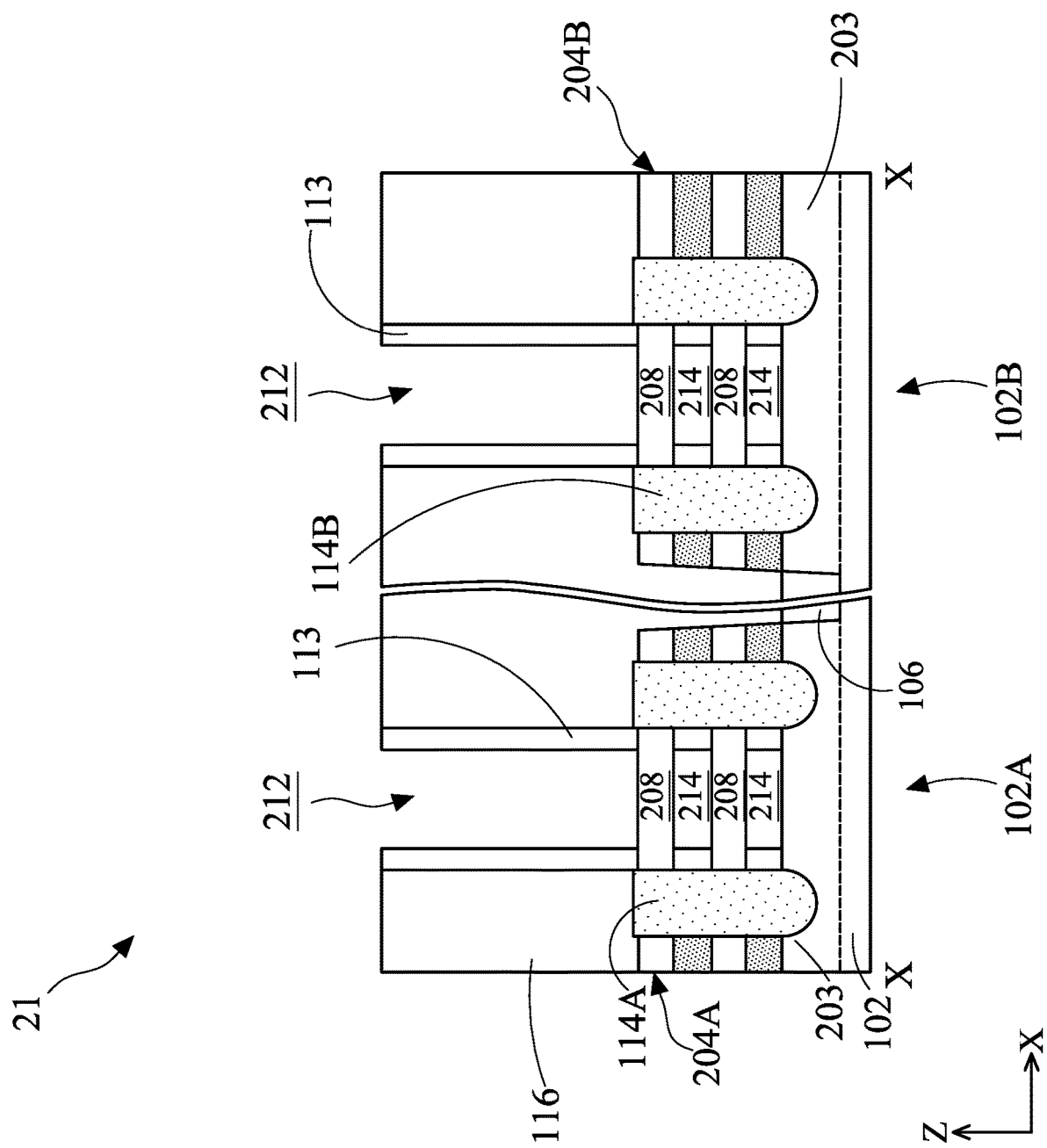
Figures 2, 9B:
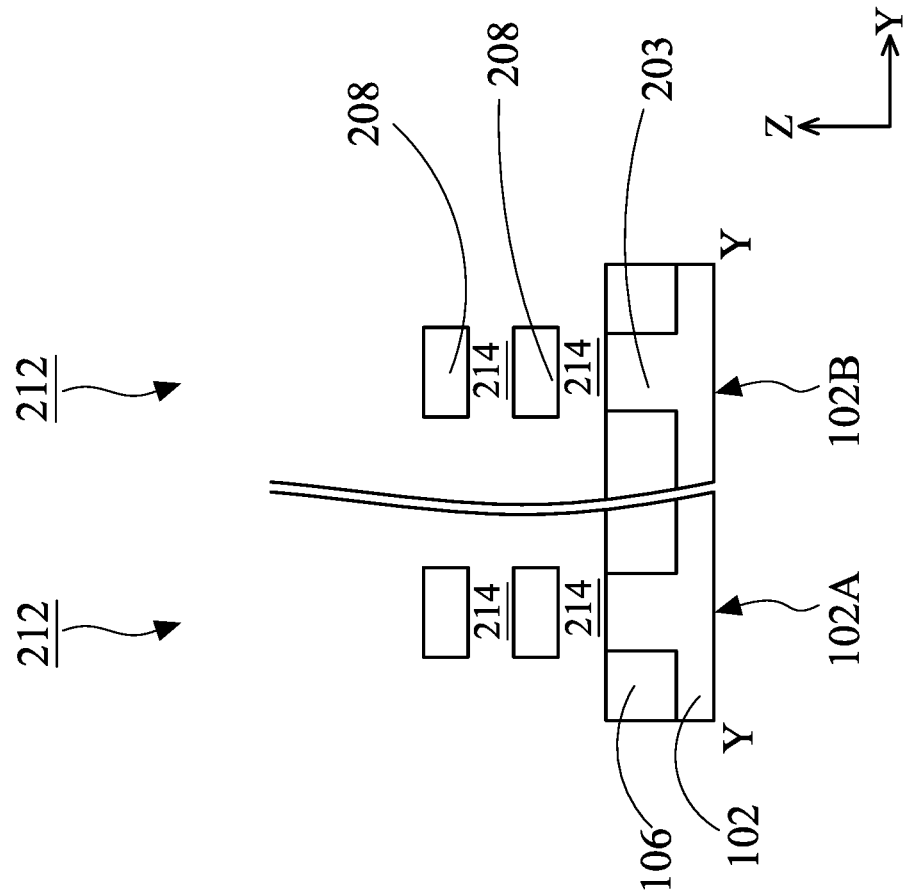

FIGS. 9B-1 and 9B-2 are cross-sectional views of a semiconductor device structure 21 after the formation of gate trenches 212 and gaps 214, in accordance with some embodiments. The dummy gate structures 108A and 108B are removed using an etching process to form gate trenches 212, as shown in FIGS. 9B-1 and 9B-2, in accordance with some embodiments.

The first semiconductor layers 206 are then removed using an etching process to form gaps 214, as shown in FIGS. 9B-1 and 9B-2, in accordance with some embodiments. The gaps 214 are formed between the adjacent second semiconductor layers 208 and between the lowermost second semiconductor layer 208 and the lower fin element 203, in accordance with some embodiments. After the etching process, the four main surfaces of the second semiconductor layers 208 are exposed, in accordance with some embodiments. The exposed second semiconductor layers 208 form nanostructures that function as channel layers of the resulting transistor device (e.g., GAA transistor), in accordance with some embodiments. In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

Figures 1, 9C:
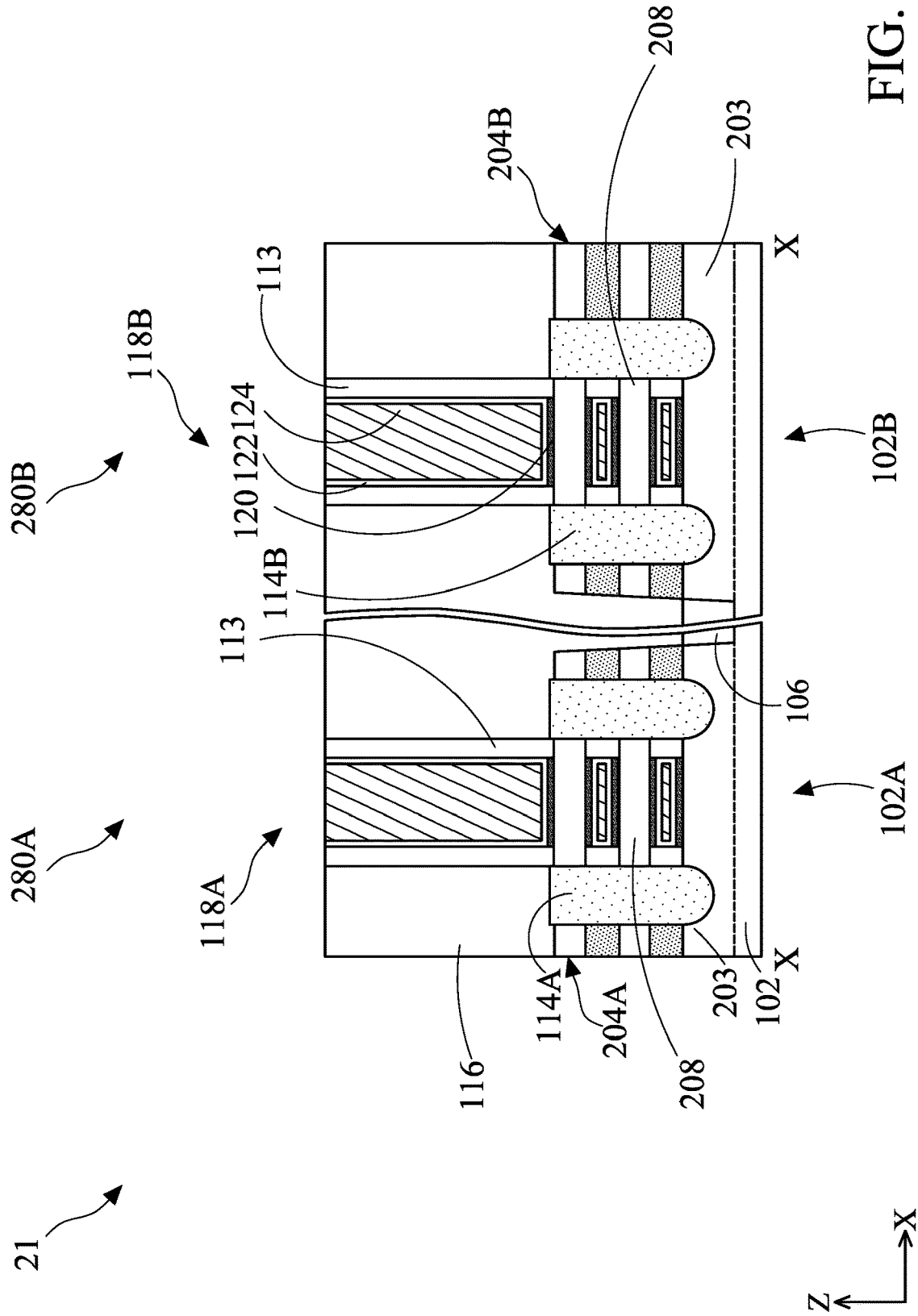
Figures 2, 9C:
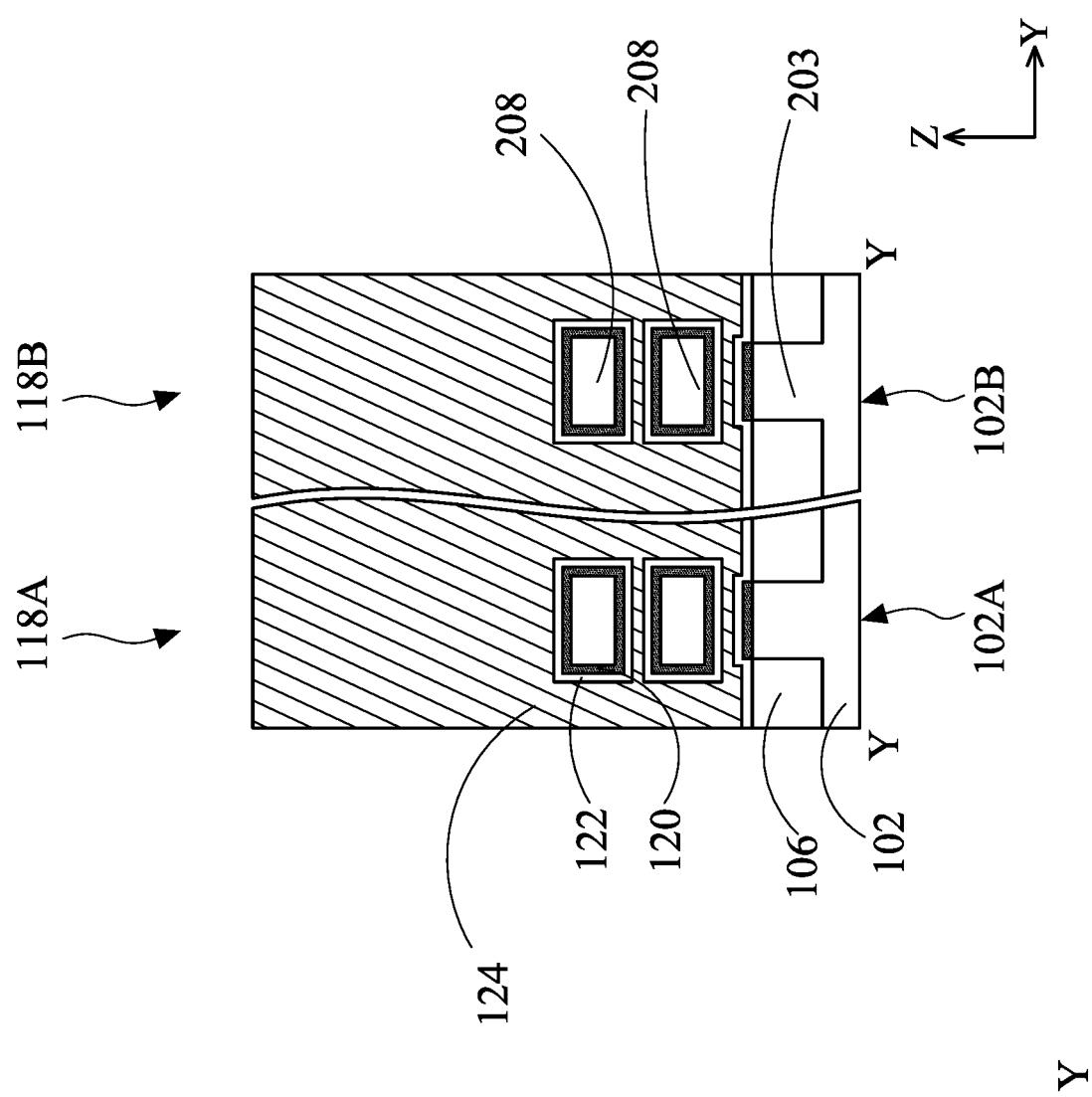

FIGS. 9C-1 and 9C-2 are cross-sectional views of a semiconductor device structure 21 after the formation of final gate stacks 118A and 118B, in accordance with some embodiments. A first final gate stacks 118A is formed to fill the gate trench 212 and the gaps 214 and wrap around the second semiconductor layers 208 of the first fin structure 204A and a second final gate stacks 118B is formed to fill gate trench 212 and the gaps 214 and wrap around the second semiconductor layers 208 of the second fin structure 204B, as shown in FIGS. 9C-1 and 9C-2, in accordance with some embodiments. The first final gate stacks 118A combines with the first source/drain features 114A to form a first transistor 280A (such as a GAA FET) and the second final gate stack 118B combines with the second source/drain features 114B to form a second transistor 280B (such as a GAA FET), as shown in FIG. 9C-1, in accordance with some embodiments.

The final gate stacks 118A and 118B each include interfacial layers 120, high-k gate dielectric layers 122 and a metal gate electrode layer 124, in accordance with some embodiments. The interfacial layers 120 are formed on exposed main surfaces of the second semiconductor layers 208 to wrap around respective second semiconductor layers 208, in accordance with some embodiments. The interfacial layers 120 are further formed on the exposed upper surface of the lower fin element 203, in accordance with some embodiments.

The high-k gate dielectric layers 122 are formed conformally along the interfacial layers 120 to around respective second semiconductor layers 208, in accordance with some embodiments. The high-k gate dielectric layers 122 are further conformally formed along the inner sidewalls of the inner spacer layers 210 facing the channel region, the inner sidewalls of the gate spacer layer 120 facing the channel region, and the upper surface of the isolation feature 106, in accordance with some embodiments. The metal gate electrode layers 124 are formed on the high-k gate dielectric layers 122 to wraps around the second semiconductor layers 208 and fill the remainders of the gaps 214 and the gate trenches 212, in accordance with some embodiments.

Figures 1, 9D:
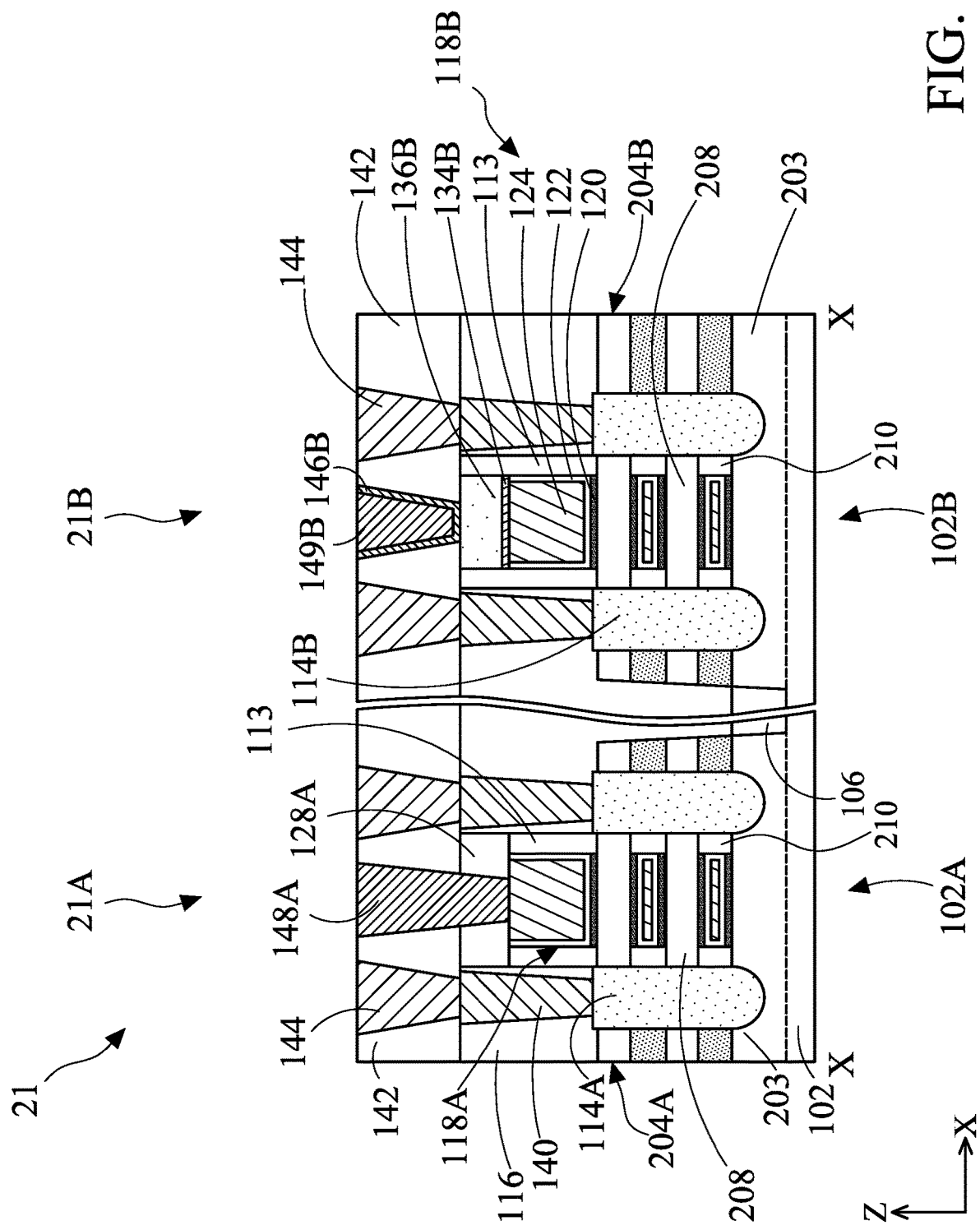
Figures 2, 9D:
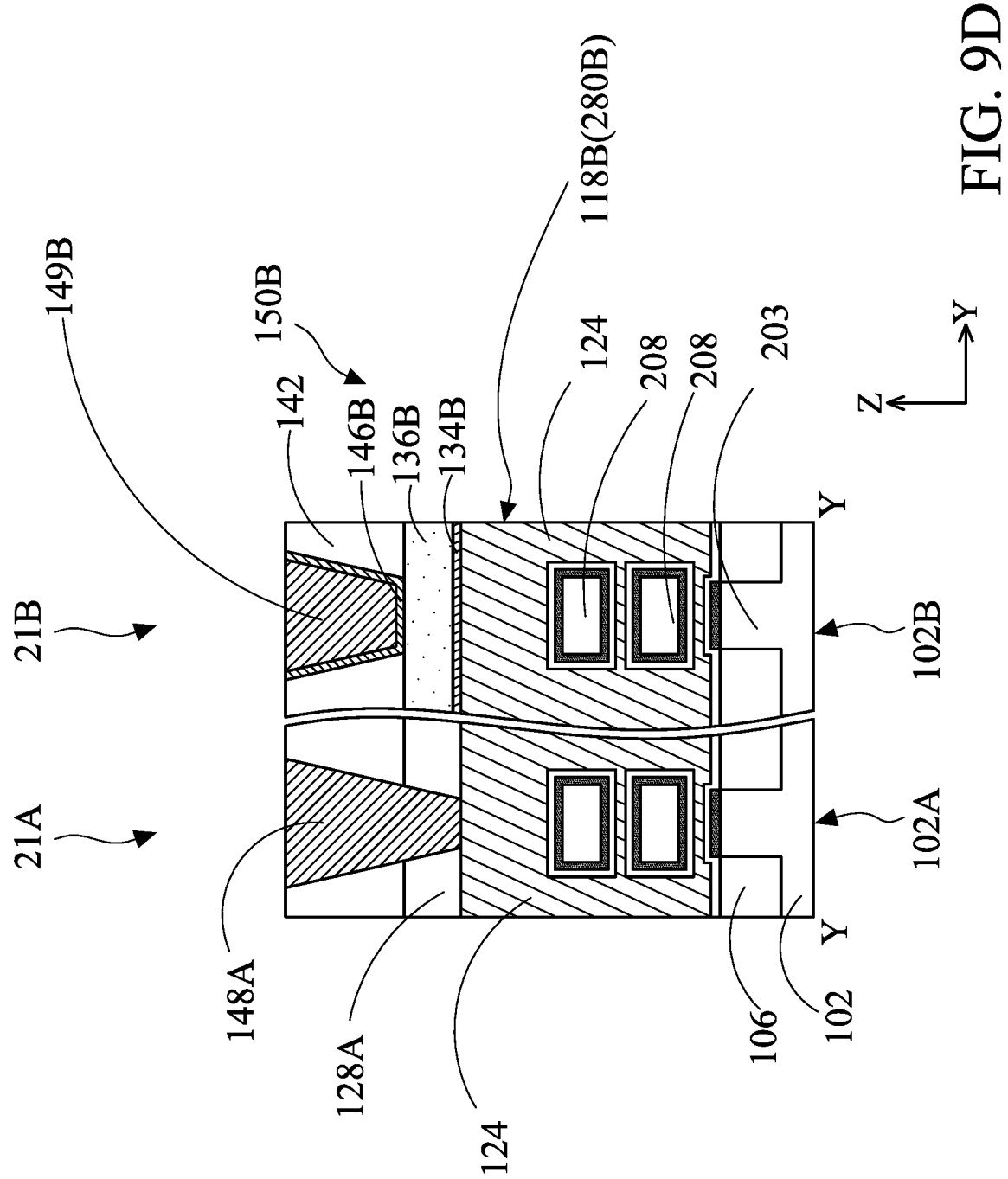

FIGS. 9D-1 and 9D-2 are cross-sectional views of a semiconductor device structure 21 after the formation of a first dielectric capping layer 128A, contact plugs 140, an upper interlayer dielectric layer 142, source/drain vias 144, a gate via 148A, a capacitor 150B, and a capacitor via 149B, in accordance with some embodiments. The first final gate stack 118A and the second final gate stack 118B are recessed to form a first recess (not shown) over the first final gate stack 118A and a second recess (not shown) over the second final gate stack 118B, in accordance with some embodiments. A first dielectric capping layer 128A is formed in the first recess over the first final gate stack 118A, as shown in FIGS. 9D-1 and 9D-2, in accordance with some embodiments. A bottom electrode layer 134B is formed at the bottom of the second recess and a ferroelectric layer 136B is formed over the bottom electrode layer 134B in the second recess, in accordance with some embodiments.

Contact plugs 140 are formed through the lower interlayer dielectric layer 116 and land on the source/drain features 114A and 114B, in accordance with some embodiments. An upper interlayer dielectric layer 142 is formed over the lower interlayer dielectric layer 116, the contact plugs 140, the first dielectric capping layer 128A, and the ferroelectric layer 136B, in accordance with some embodiments. Source/drain vias 144 are formed through the upper interlayer dielectric layer 142 and land on the contact plugs 140, in accordance with some embodiments. A gate via 148A is formed through the upper interlayer dielectric layer 142 and the first dielectric capping layer 128A and land on the metal gate electrode layer 124 of the first final gate stack 118A, thereby forming a GAA FET device 21A in the first region 102A of the substrate 102, as shown in FIGS. 9D-1 and 9D-2, in accordance with some embodiments.

An upper electrode layer 146B and a capacitor via 149B nested within the upper electrode layer 146B are collectively formed through the upper interlayer dielectric layer 142 and land on the ferroelectric layer 136B, thereby forming a FeFET device 21B with GAA design in the second region 102B of the substrate 102, as shown in FIGS. 9D-1 and 9D-2, in accordance with some embodiments. The upper electrode layer 146B, the ferroelectric layer 136B and the bottom electrode layer 134B combine to form a capacitor 150B over the transistor 280B, in accordance with some embodiments. The capacitor via 149B is electrically coupled to the capacitor 150B, in accordance with some embodiments.

The GAA FET device 21A may be operable as a logic device, a periphery circuit device, and/or an SRAM device. The FeFET device 21B comprising the ferroelectric layer 136B may be operable as a FRAM device due to the dielectric polarization characteristics of the ferroelectric layer 136B. Other conductive features of the multilayer interconnect structure (such as vias and metal lines within an intermetal dielectric layer over the upper interlayer dielectric layer 142) may be formed over the semiconductor device structure 21 and electrically coupled to the conductive features of the GAA FET device 21A and the FeFET device 21B. In some embodiments, the GAA FET device 21A is operable to access and/or control the FeFET device 21B (e.g., to perform read/write/erase operations) through the multilayer interconnect structure.

Figures 1, 2, 10:
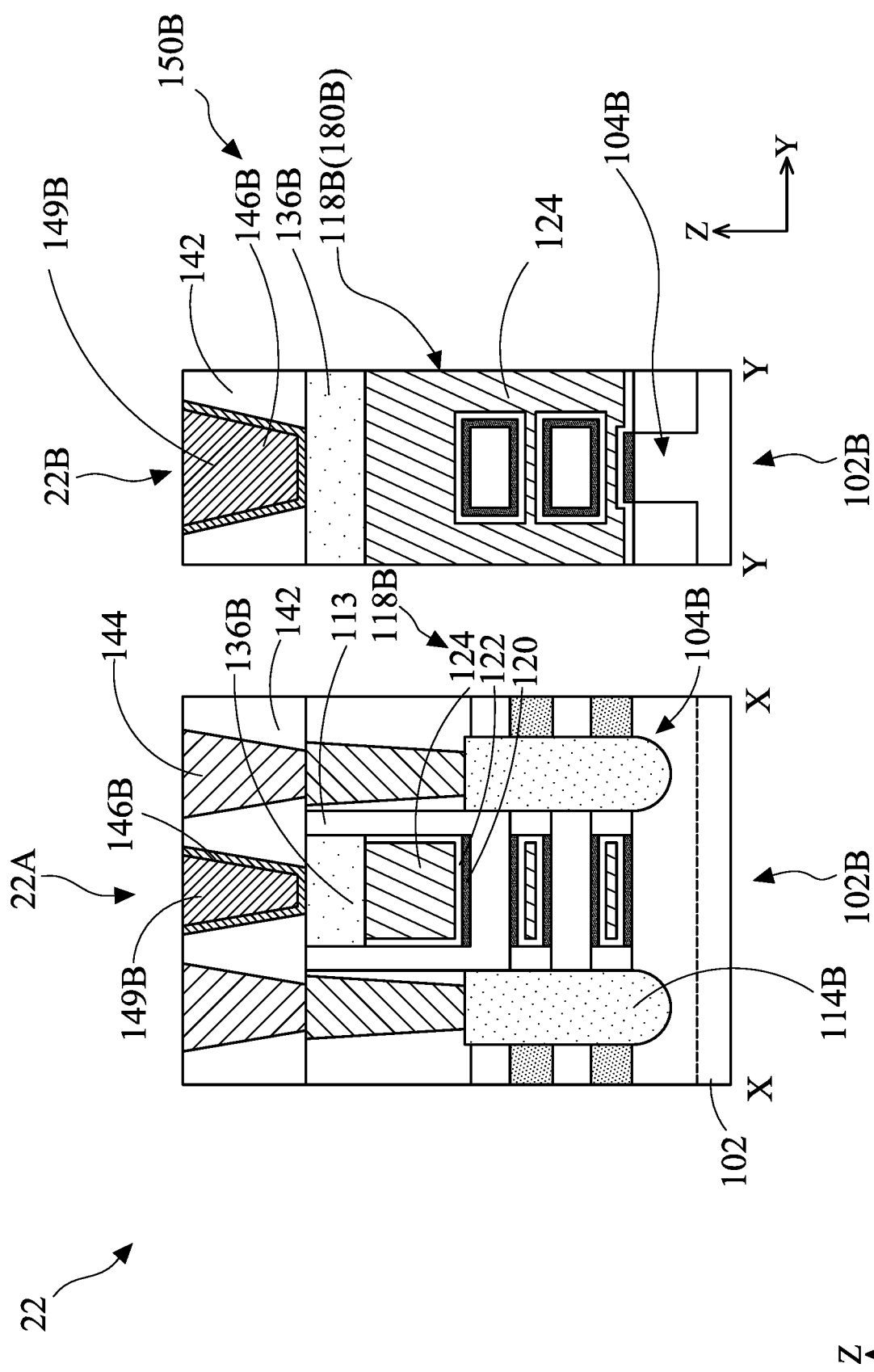

The modification described above with respect to FIGS. 4-1 and 4-2 may be applied to the semiconductor device structure with GAA design. FIGS. 10-1 and 10-2 are cross-sectional views of a semiconductor device structure 22 with GAA design, in accordance with some embodiments of the disclosure. FIG. 10-1 is a cross-sectional view in the second region 102B corresponding to cross-section X-X of FIG. 8 and FIG. 10-2 is a cross-sectional view in the second region 102B corresponding to cross-section Y-Y of FIG. 8. The semiconductor device structure 22 of FIGS. 10-1 and 10-2 is similar to the semiconductor device structure 21 of FIGS. 9D-1 and 9D-2 except for the bottom electrode layer not formed between the ferroelectric layer 136B and the second final gate stack 118B, in accordance with some embodiments. The ferroelectric layer 136B is formed in direct contact with the second final gate stack 118B, thereby forming a FeFET device 22B in the second region 102B of the substrate, in accordance with some embodiments. The metal gate electrode layer 124 of the second final gate stack 118B is used as the bottom electrode layer of the capacitor 150B, in accordance with some embodiments.

Figure 11:
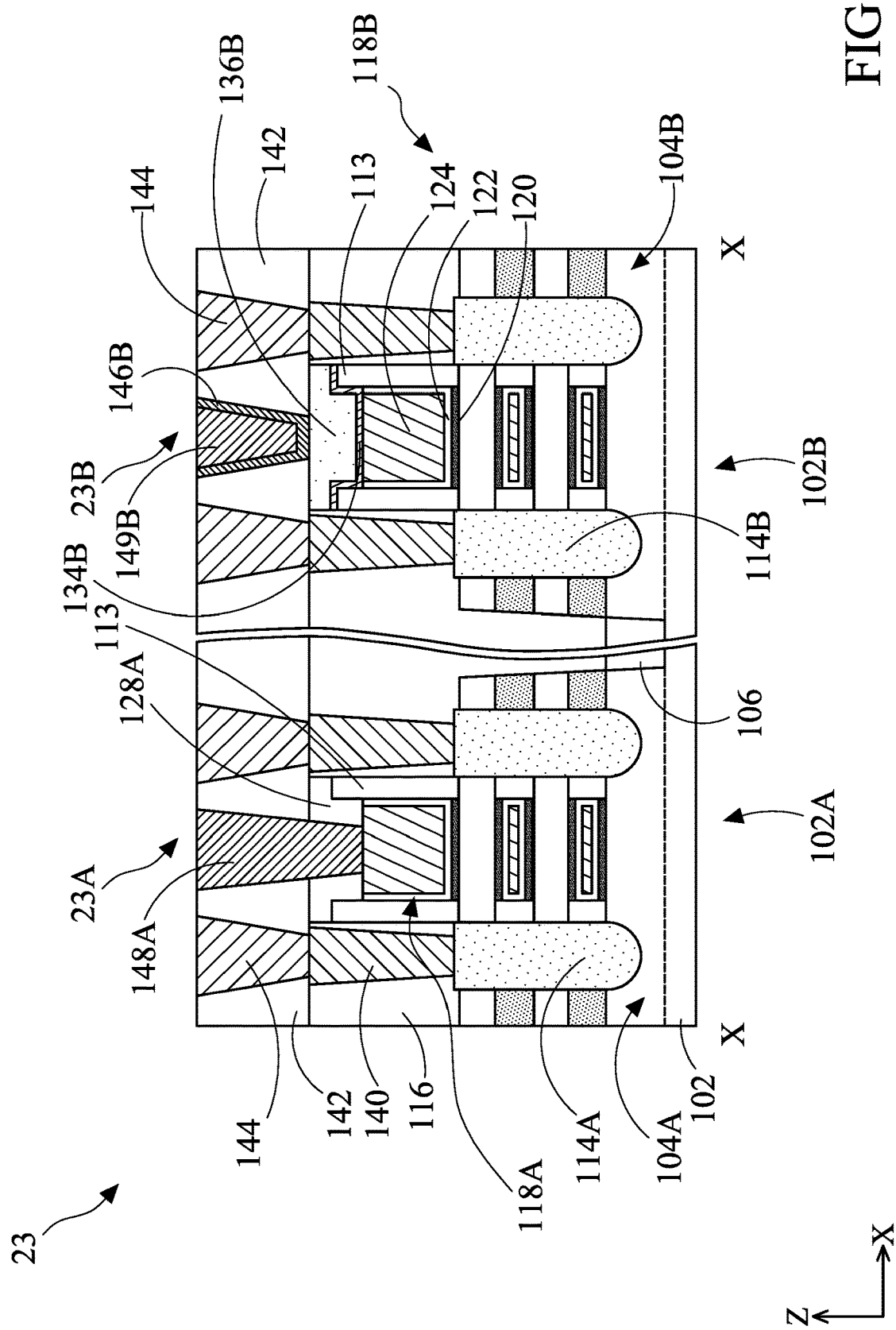
FIG. 11 is a cross-sectional view of a semiconductor device structure with GAA design, in accordance with some embodiments of the disclosure.

The modification described above with respect to FIGS. 5A and 5B may be applied to the semiconductor device structure with GAA design. FIG. 11 is a cross-sectional view of a semiconductor device structure 23 with GAA design, in accordance with some embodiments of the disclosure. FIG. 11 is a cross-sectional view corresponding to cross-section X-X of FIG. 8. The semiconductor device structure 23 of FIG. 11 is similar to the semiconductor device structure 21 of FIG. 9D-1 except that the first dielectric capping layer 128A covers the upper surface of the gate spacer layers 113 and the ferroelectric layer 136B covers the upper surface of the gate spacer layers 113. The first dielectric capping layer 128A of a GAA device 23A includes a lower portion between the gate spacer layers 113 and an upper portion over the upper surfaces of the gate spacer layers 113, and the upper portion of the first dielectric capping layer 128A is wider than the lower portion of the first dielectric capping layer 128A, in accordance with some embodiments. Similarly, the ferroelectric layer 136B of a FeFET device 23B includes a lower portion between the gate spacer layers 113 and an upper portion over the upper surfaces of the gate spacer layers 113, and the upper portion of the ferroelectric layer 136B is wider than the lower portion of the ferroelectric layer 136B, in accordance with some embodiments.

Figures 1, 2, 12:
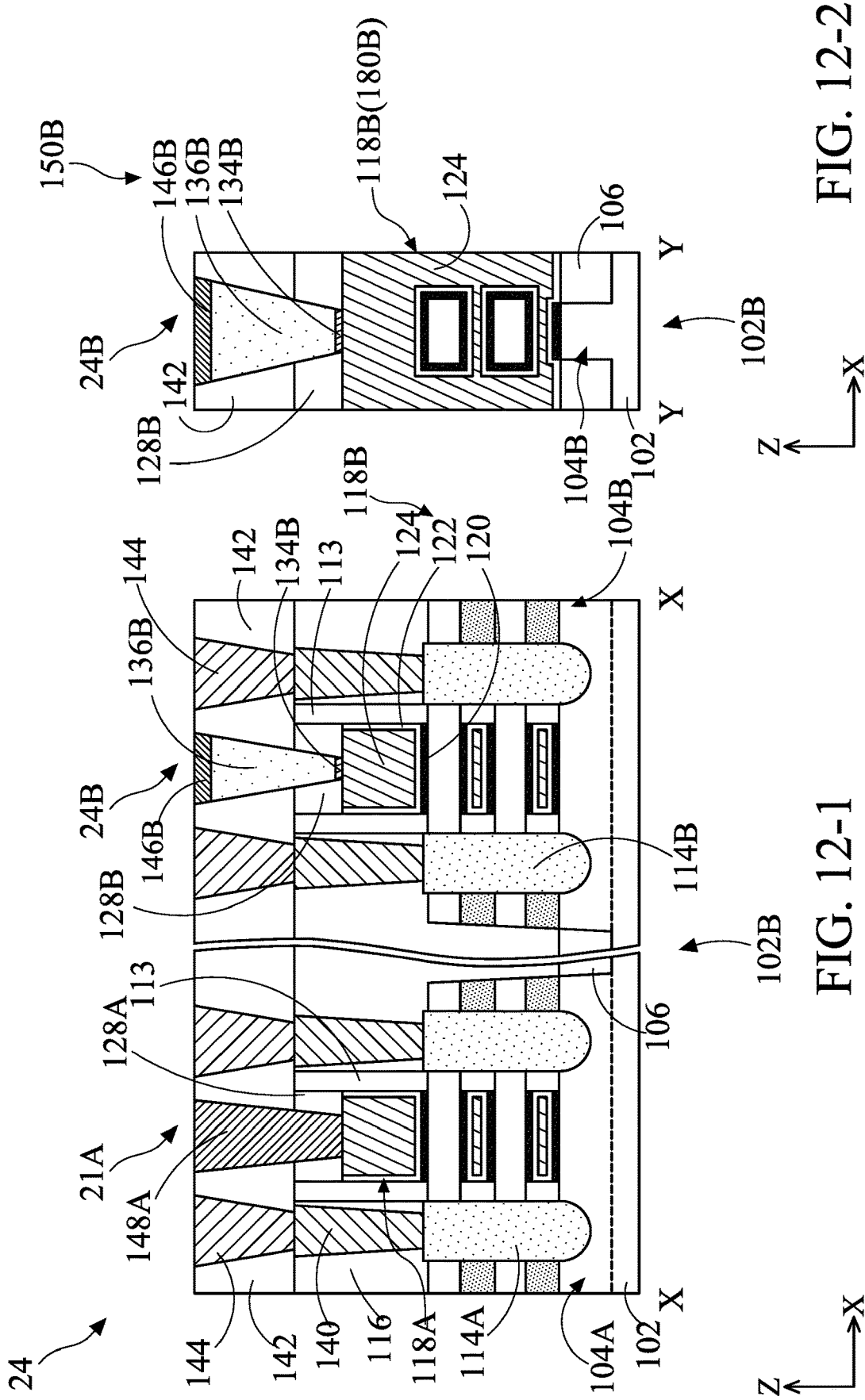

The modification described above with respect to FIGS. 6A-1 through 6D-2 may be applied to the semiconductor device structure with GAA design. FIGS. 12-1 and 12-2 are cross-sectional views of a semiconductor device structure 24 with GAA design, in accordance with some embodiments of the disclosure. FIG. 12-1 is a cross-sectional view corresponding to cross-section X-X of FIG. 8 and FIG. 12-2 is a cross-sectional view in the second region 102B corresponding to cross-section Y-Y of FIG. 8. The semiconductor device structure 24 of FIGS. 12-1 and 12-2 is similar to the semiconductor device structure 21 of FIGS. 9D-1 and 9D-2 except that a capacitor 150B that includes a bottom electrode layer 134B, a ferroelectric layer 136B, and a top electrode layer 146B is formed in a via hole, in accordance with some embodiments. A FeFET device 24B includes a capacitor 150B, which is formed in the via hole and passes through the upper interlayer dielectric layer 142 and the second dielectric capping layer 128B to the second final gate stack 118B, in accordance with some embodiments. The sidewall of the top electrode layer 146B, the sidewall of the ferroelectric layer 136B, and the sidewall of the bottom electrode layer 134B share a continuous surface (i.e., the sidewall of the via hole 152B), in accordance with some embodiments. In some embodiments, the upper surface of the top electrode layer 146B, the upper surface of the vias 144 and 148A are substantially coplanar. In some embodiments, the height of the capacitor 150B is substantially equal to the height of the gate via 148A.

Figures 1, 2, 13:
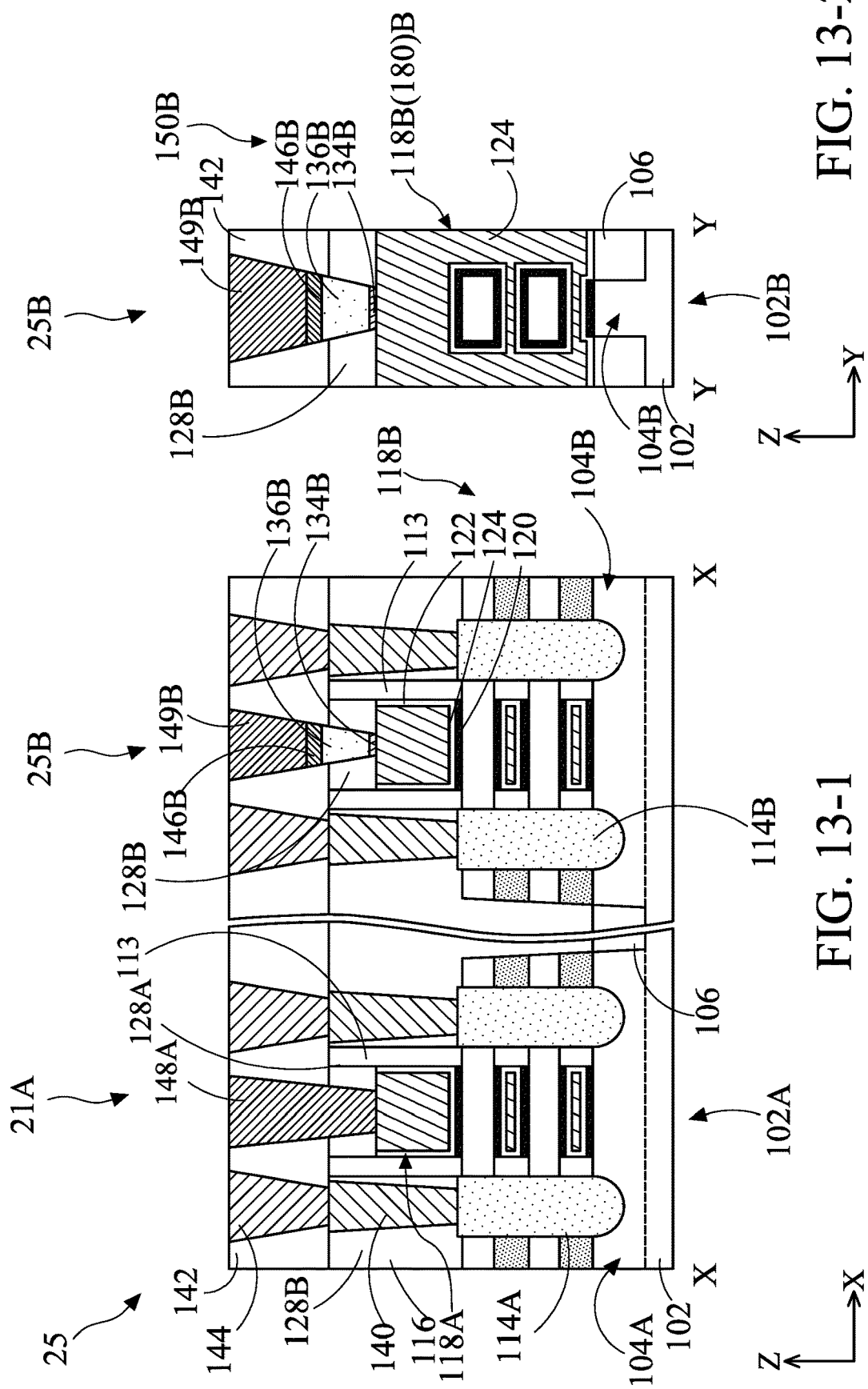

The modification described above with respect to FIGS. 7A-1 through 7B-2 may be applied to the semiconductor device structure with GAA design. FIGS. 13-1 and 13-2 are cross-sectional views of a semiconductor device structure 25 with GAA design, in accordance with some embodiments of the disclosure. FIG. 13-1 is a cross-sectional view corresponding to cross-section X-X of FIG. 8 and FIG. 13-2 is a cross-sectionals view in the second region 102B corresponding to cross-section Y-Y of FIG. 8. The semiconductor device structure 25 of FIGS. 13-1 and 13-2 is similar to the semiconductor device structure 24 of FIGS. 12-1 and 12-2 except that a capacitor via 149B and a capacitor 150B of a FeFET 25B are formed in the same via hole, in accordance with some embodiments. The sidewall of the capacitor via 149B and the sidewall of the capacitor 150B including the top electrode layer 146B, the ferroelectric layer 136B and the bottom electrode layer 134B share a continuous surface (i.e., the sidewall of the via hole 152

Figures 1, 14A:
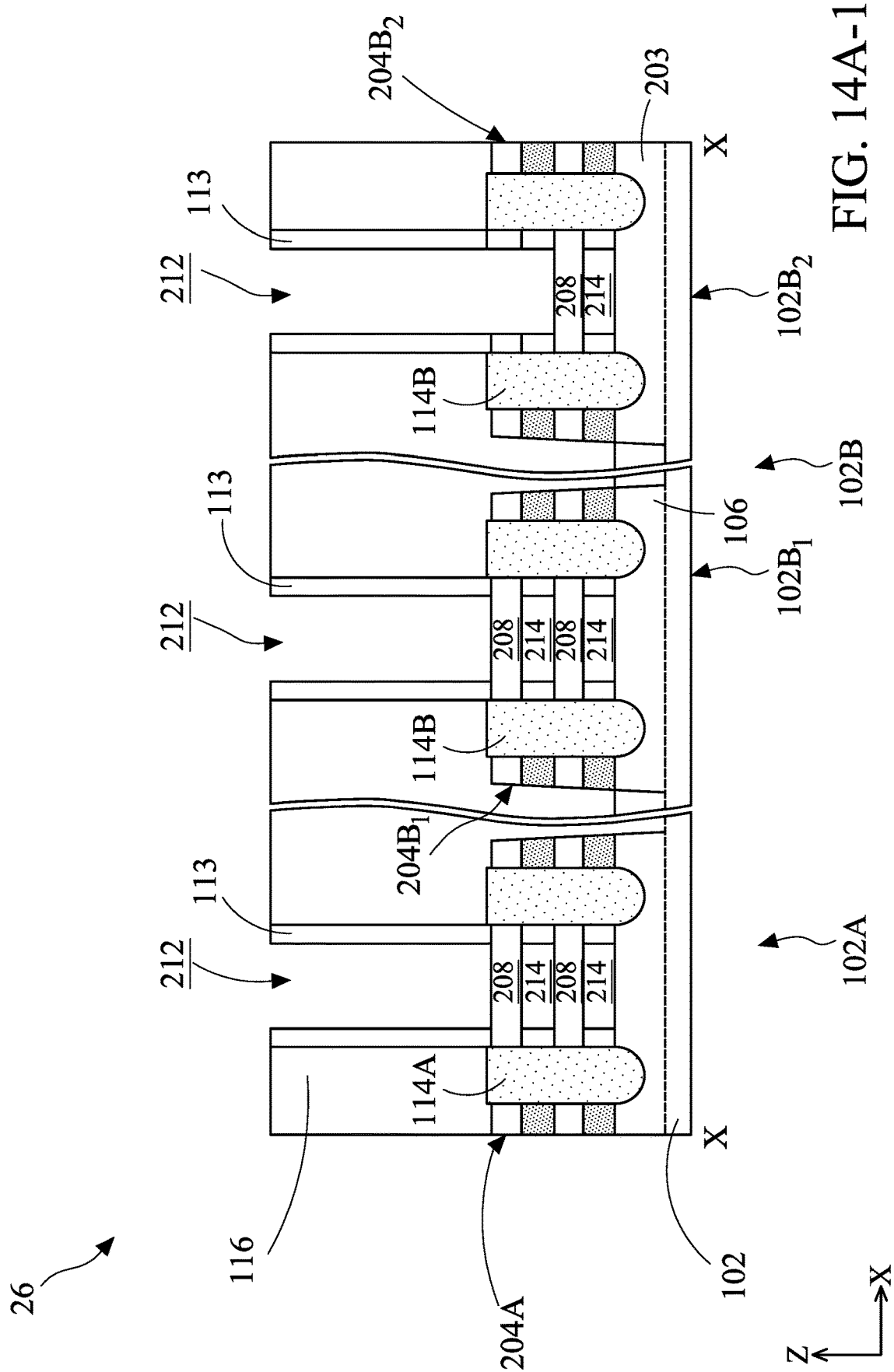
Figures 2, 14A:
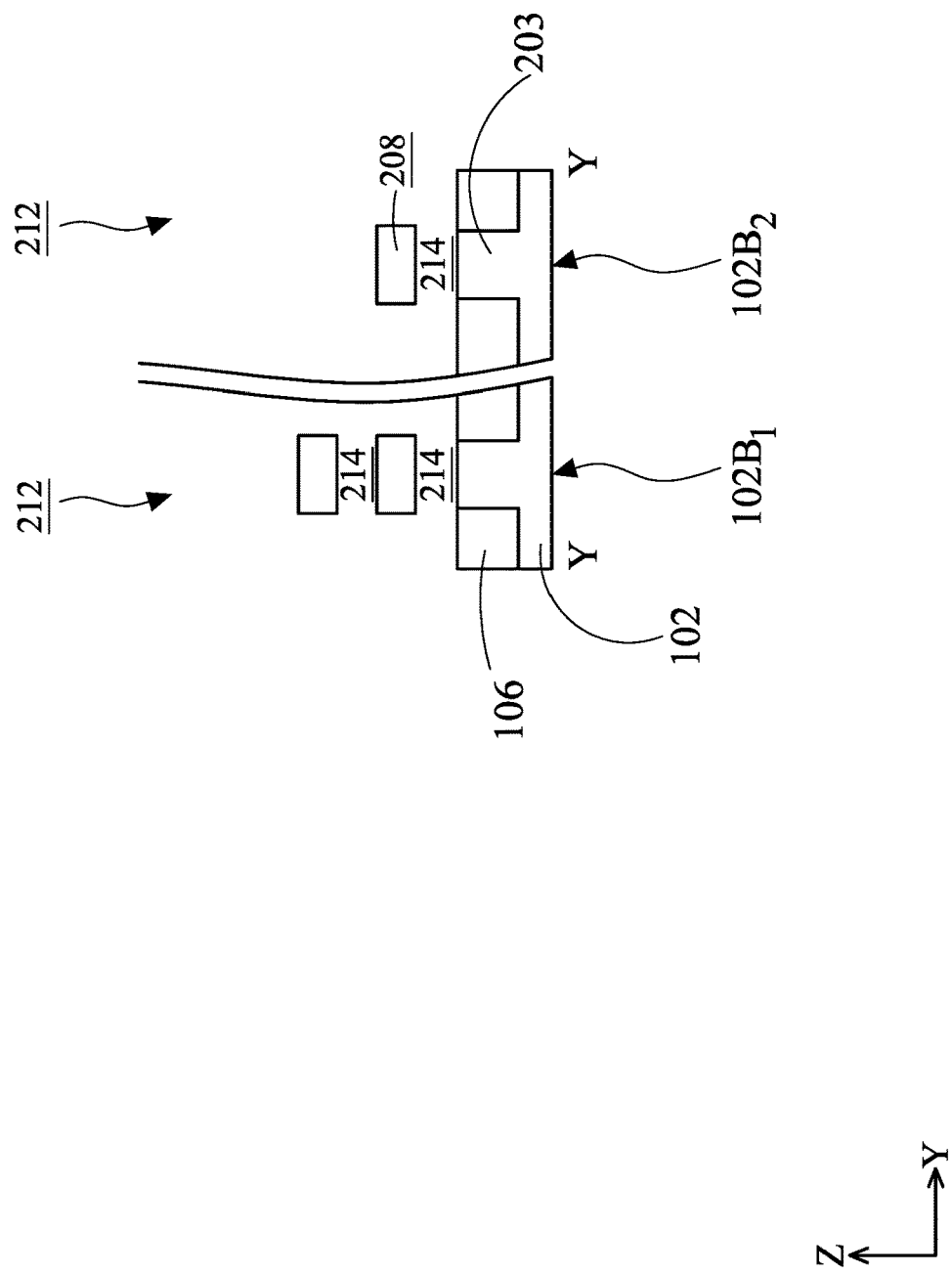
Figures 1, 14B:
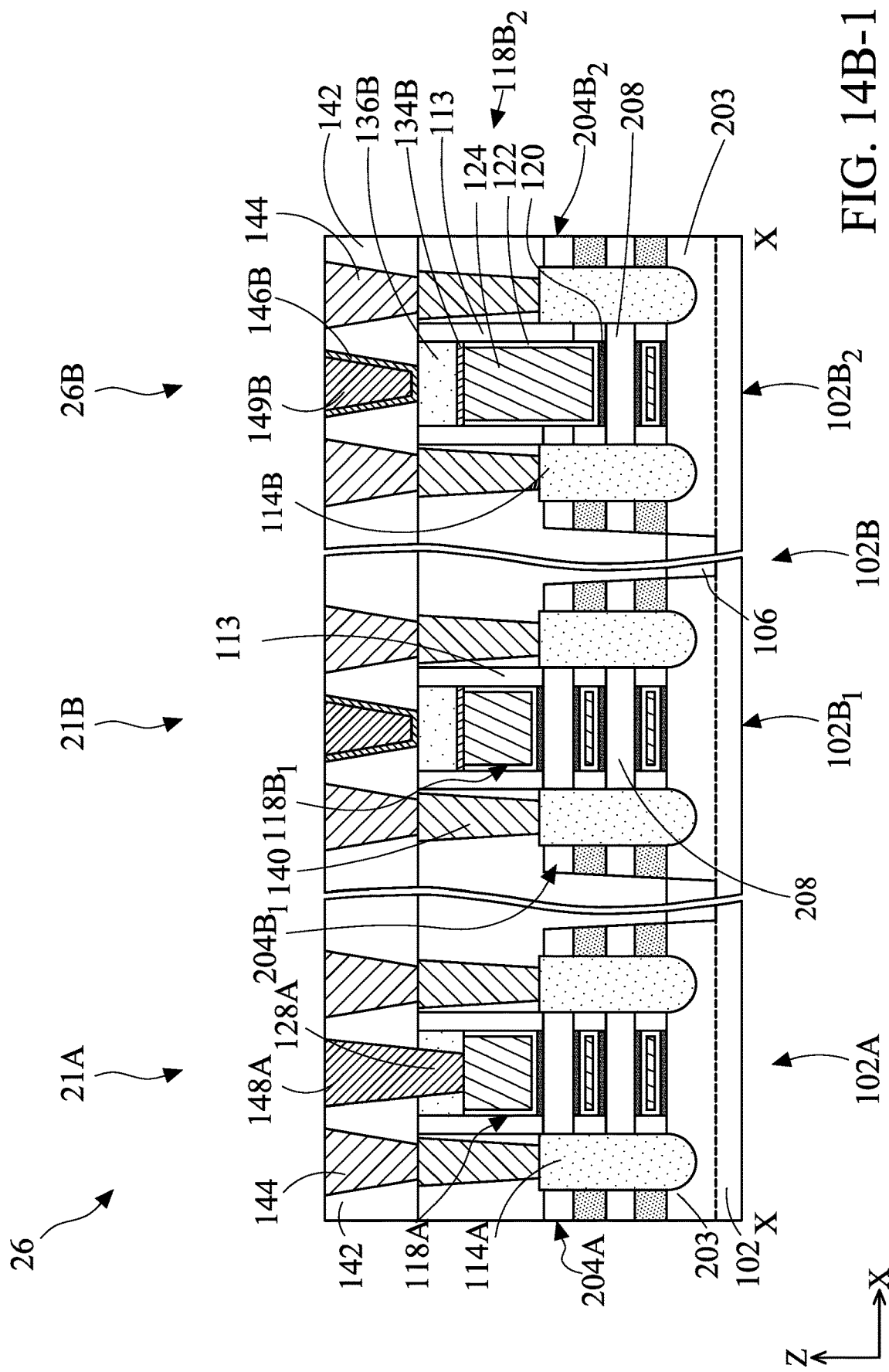
Figures 2, 14B:
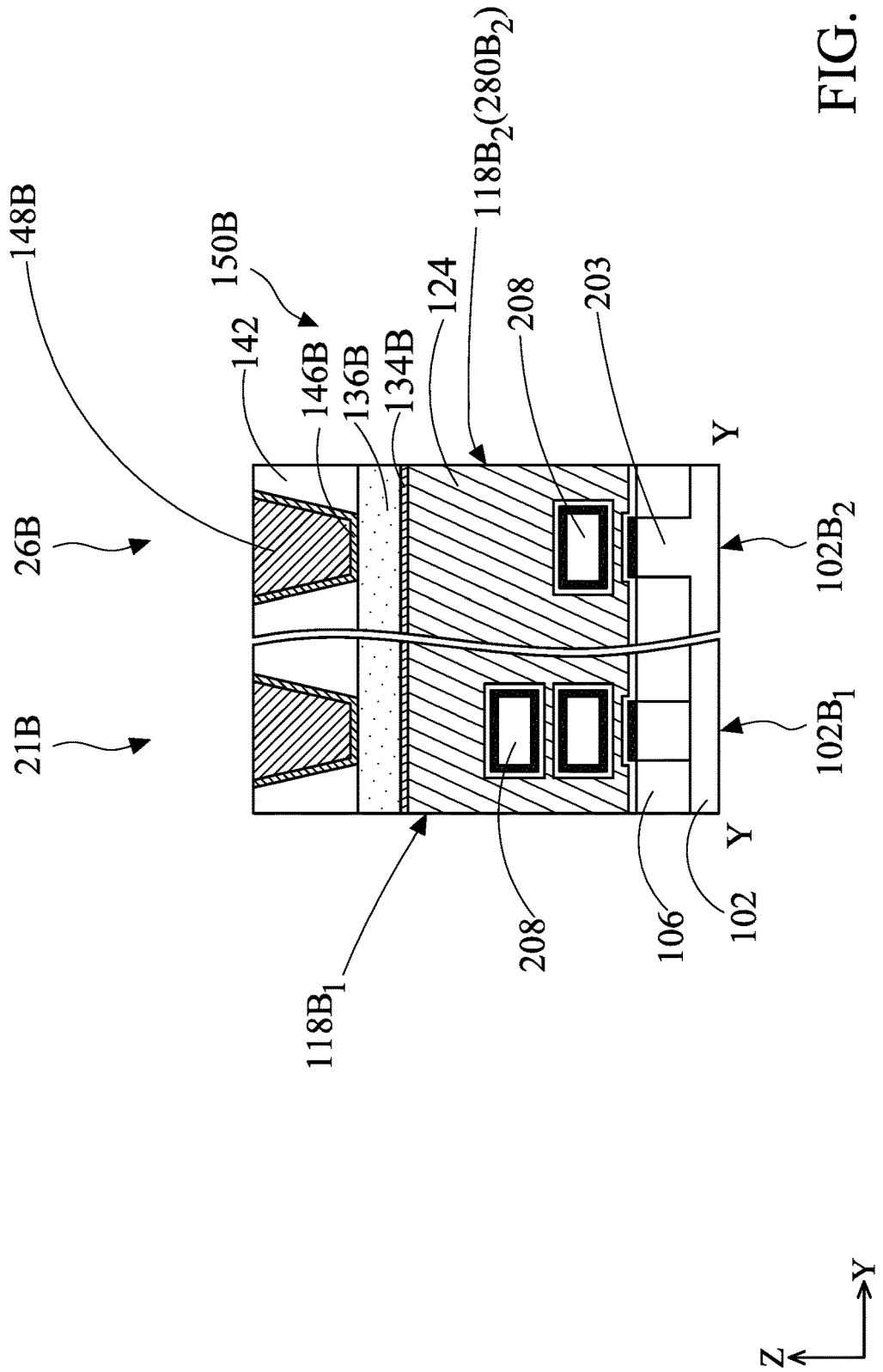

FIGS. 14A-1 through 14B-2 are cross-sectional views illustrating the formation of a semiconductor device structure 26 at various intermediate stages with GAA design, in accordance with some embodiments of the disclosure. FIGS. 14A-1 and 14B-1 are cross-sectional views corresponding to cross-section X-X of FIG. 8 and FIGS. 14A-2 and 14B-2 are cross-sectional views in the second region 102B corresponding to cross-section Y-Y of FIG. 8. The second region 102B includes a first sub-region $102B_1$ where a second fin structure $204B_1$ is formed and a second sub-region $102B_2$ where a third fin structure $204B_2$ is formed, as shown in FIGS. 14A-1 and 14A-2, in accordance with some embodiments.

After the first semiconductor layers 206 are removed to form the gaps 214, a channel-cutting process is performed on the semiconductor device structure 26, in accordance with some embodiments. The channel-cutting process removes at least one the nanostructure (i.e., the second semiconductor layers 208) of the third fin structure $204B_2$, in accordance with some embodiments. The channel-cutting process may include forming a patterned mask layer (such as patterned photoresist layer) to cover the first region 102A and the first sub-region $102B_1$ and performing an etching process to remove at least one of the semiconductor layers 208 of the third fin structure $204B_2$. Afterward, the patterned mask layer may be removed.

The steps described above with respect to FIGS. 9C-1 through 9D-2 are performed on the semiconductor device structure 26, thereby forming a GAA device 21A in the first region 102A, a first FeFET device 21B in the first sub-region 102B1 and a second FeFET device 26B in the second sub-region 102B2, in accordance with some embodiments. The second FeFET device 26B includes a transistor 280B2 which includes a final gate stack 118B2 wraps around the second semiconductor layer 208 of the third fin structure 204B2, in accordance with some embodiments. As a result, each of the FeFET devices 21B and 26B may be formed with the desired number of the nanostructures by utilizing the channel-cutting process, thereby adjusting the performance, e.g., memory window, of the FeFET devices for performance demand.

As described above, the embodiments of the present disclosure provide a semiconductor device structure including a FeFET device and a method for forming it. A FeFET device 11B has a CAT design in which a capacitor 150B of the FeFET device 11B is integrated into CMOS MEOL processes and formed directly above a gate stack 118B of a transistor 180B. The method for forming the FeFET device includes recessing the gate stack 118B to form a recess 126B and forming a ferroelectric layer 136B in the recess 126B. Therefore, the endurance and the retention of the FeFET device may be enhanced, the power consumption the FeFET device may be lowered, and a fabrication process for forming the FeFET device may be achieved.

Embodiments of a semiconductor device structure may be provided. The semiconductor device structure may include a ferroelectric layer over a gate stack. The ferroelectric layer may be located between upper portions of the gate spacer layers and is connected to the first gate stack. Therefore, the endurance and the retention of the FeFET device may be enhanced, the power consumption the FeFET device may be lowered, and a fabrication process for forming the FeFET device may be achieved.

In some embodiments, a semiconductor device structure is provided. The semiconductor device structure includes a substrate, a first fin structure over the substrate, and a FeFET device over a first region of the substrate. The FeFET includes a first gate stack across the first fin structure. The semiconductor device structure also includes first gate spacer layers alongside the first gate stack, and a ferroelectric layer over the first gate stack. At least a portion of the ferroelectric layer is located between upper portions of the first gate spacer layers and is adjacent to the first gate stack.

In some embodiments, a semiconductor device structure is provided. The semiconductor device structure includes a first set of nanostructures over a substrate, a first gate stack wrapping around the first set of nanostructures, a first ferroelectric layer directly above the first gate stack, an interlayer dielectric layer surrounding the first gate stack and the first ferroelectric layer, and a via through the interlayer dielectric layer and coupling to the first ferroelectric layer.

In some embodiments, a method for forming a semiconductor device structure is provided. The method includes forming a first gate stack across a first active region and a second gate stack across a second active region, recessing the first gate stack and the second gate stack to form a first recess over the first gate stack and a second recess over the second gate stack, forming a dielectric capping layer in the first recess, forming a ferroelectric layer in the second recess, forming an interlayer dielectric layer over the dielectric capping layer and the ferroelectric layer, disposing a first via through the interlayer dielectric layer and the dielectric capping layer and on the first gate stack, and forming a second via through the interlayer dielectric layer and on the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a first gate stack across a first active region and a second gate stack across a second active region;
   recessing the first gate stack and the second gate stack to form a first recess over the first gate stack and a second recess over the second gate stack;
   forming a dielectric capping layer in the first recess;
   forming a ferroelectric layer in the second recess;
   forming an interlayer dielectric layer over the dielectric capping layer and the ferroelectric layer;
   disposing a first via through the interlayer dielectric layer and the dielectric capping layer and on the first gate stack; and
   disposing a second via through the interlayer dielectric layer and on the ferroelectric layer.

2. The method for forming the semiconductor device structure as claimed in claim 1, further comprising:
   forming a dielectric material in the first recess and the second recess;
   removing a portion of the dielectric material in the second recess to form the dielectric capping layer in the first recess;
   forming a ferroelectric material over the dielectric capping layer and in the second recess: and
   removing a portion of the ferroelectric material over the dielectric capping layer to form the ferroelectric layer in the second recess.

3. The method for forming the semiconductor device structure as claimed in claim 1, further comprising:
   forming a bottom electrode at a bottom of the second recess, wherein the ferroelectric layer is formed over the bottom electrode;
   forming a via hole through the interlayer dielectric layer and exposing an upper surface of the ferroelectric layer; and
   forming a top electrode layer along sidewalls and a bottom surface of the via hole, wherein the second via is formed over the top electrode layer in the via hole.

4. The method for forming the semiconductor device structure as claimed in claim 1, wherein the first active region includes a fin structure.

5. The method for forming the semiconductor device structure as claimed in claim 1, further comprising:
   forming a stack over a substrate, the stack including alternating first semiconductor layers and second semiconductor layers;
   patterning the stack into a first fin structure and a second fin structure; and
   removing the first semiconductor layers of the first fin structure and the first semiconductor layers of the second fin structure, thereby forming the first active region from the second semiconductor layers of the first fin structure and the second active region from the second semiconductor layers of the second fin structure.

6. The method for forming the semiconductor device structure as claimed in claim 5, further comprising:
   removing at least one of the second semiconductor layers from the second active region after removing the first semiconductor layers of the second fin structure.

7. The method for forming the semiconductor device structure as claimed in claim 1, further comprising:
   annealing the ferroelectric layer before forming the first via and the second via.

8. A method for forming a semiconductor device structure, comprising:
   forming a first gate spacer layer and a second gate spacer layer over a fin structure;
   forming a source/drain feature in the fin structure;
   forming a first dielectric layer over the source/drain feature;
   forming a gate electrode layer over the fin structure between the first gate spacer layer and the second gate spacer layer;
   forming a ferroelectric material over the gate electrode layer, the first gate spacer layer, the second gate spacer layer and the first dielectric layer;
   removing a portion of the ferroelectric material over the first dielectric layer until an upper surface of the first dielectric layer is exposed, wherein a portion of the ferroelectric material over the gate electrode layer forms a ferroelectric layer; and forming a top electrode layer on the ferroelectric layer.

9. The method for forming the semiconductor device structure as claimed in claim 8, further comprising:

etching the gate electrode layer, wherein after etching the gate electrode layer, upper surfaces of the first gate spacer layer and the second gate spacer layer are higher than an upper surface of the gate electrode layer.

10. The method for forming the semiconductor device structure as claimed in claim 9, further comprising:

etching the first spacer layer and the second gate spacer layer, wherein after etching the first spacer layer and the second gate spacer layer, the upper surface of the first dielectric layer is higher than the upper surfaces of the first gate spacer layer and the second gate spacer layer, and the ferroelectric layer covers the upper surfaces of the first gate spacer layer and the second gate spacer layer.

11. The method for forming the semiconductor device structure as claimed in claim 8, wherein the ferroelectric layer is in contact with the gate electrode layer, the first gate spacer layer and the second gate spacer layer.

12. The method for forming the semiconductor device structure as claimed in claim 8, further comprising:

forming a bottom electrode material along a first sidewall of the first gate spacer layer, a second sidewall of the second gate spacer layer, and an upper surface of the gate electrode layer; and removing portions of the bottom electrode material along the first sidewall of the first gate spacer layer and the second sidewall of the second gate spacer layer, wherein a portion of the bottom electrode material along the upper surface of the gate electrode layer forms a bottom electrode layer, and the ferroelectric material is formed over the bottom electrode layer.

13. The method for forming the semiconductor device structure as claimed in claim 8, further comprising:

forming a second dielectric layer over the ferroelectric layer; and etching the second dielectric layer to form a via hole exposing the ferroelectric layer, wherein the top electrode layer is formed in the via hole.

14. The method for forming the semiconductor device structure as claimed in claim 13, further comprising:

forming a via over the top electrode layer in the via hole, wherein the via is nested within the top electrode layer.

15. The method for forming the semiconductor device structure as claimed in claim 8, wherein the ferroelectric material is HfZrO, HfLaO, HfSiO, or HfAlO.

16. A method for forming a semiconductor device structure, comprising:

forming a first gate stack surrounding a first active region and a second gate stack surrounding a second active region;

forming a first dielectric capping layer over the first gate stack and a second dielectric capping layer over the second gate stack;

replacing the second dielectric capping layer with a ferroelectric layer;

forming a first via in the first dielectric capping layer and on the first gate stack; and forming a top electrode layer on the ferroelectric layer.

17. The method for forming the semiconductor device structure as claimed in claim 16, further comprising:

forming a lower interlayer dielectric layer over the first active region and the second active region;

etching the first gate stack to form a first recess over the first gate stack in the lower interlayer dielectric layer;

etching the second gate stack to form a second recess over the second gate stack in the lower interlayer dielectric layer;

forming a dielectric material over the lower interlayer dielectric layer and filling the first recess and the second recess; and removing a portion of the dielectric material over the lower interlayer dielectric layer, wherein a portion of the dielectric material in the first recess forms the first dielectric capping layer, and a portion of the dielectric material in the second recess forms the second dielectric capping layer.

18. The method for forming the semiconductor device structure as claimed in claim 16, wherein replacing the second dielectric capping layer with the ferroelectric layer comprises:

etching the second dielectric capping layer until the second gate stack is exposed;

forming a ferroelectric material over the first dielectric capping layer and second gate stack; and removing a portion of the ferroelectric material over the first dielectric capping layer, wherein a portion of the ferroelectric material over the second gate stack forms the ferroelectric layer.

19. The method for forming the semiconductor device structure as claimed in claim 16, further comprising:

forming an upper interlayer dielectric layer over the lower interlayer dielectric layer; and etching the upper interlayer dielectric to form a via hole extending through the upper interlayer dielectric layer and exposing the ferroelectric layer, wherein the top electrode layer is formed in the via hole and has a U-shape profile.

20. The method for forming the semiconductor device structure as claimed in claim 16, wherein the first active region comprises a first set of nanostructures spaced apart from one another and the second active region comprises a second set of nanostructures spaced apart from one another, and the number of the nanostructures in the first set and the number of the nanostructures in the second set are different.

* * * * *